US 7,709,378 B2

(12) United States Patent
Im

(10) Patent No.: US 7,709,378 B2
(45) Date of Patent: May 4, 2010

(54) METHOD AND APPARATUS FOR PROCESSING THIN METAL LAYERS

(75) Inventor: James S. Im, New York, NY (US)

(73) Assignee: The Trustees of Columbia University in the City of New York, New York, NY (US)

( * ) Notice: Subject to any disclaimer, the term of this patent is extended or adjusted under 35 U.S.C. 154(b) by 204 days.

(21) Appl. No.: 11/502,056

(22) Filed: Aug. 10, 2006

(65) Prior Publication Data

US 2009/0140173 A1    Jun. 4, 2009

Related U.S. Application Data

(63) Continuation of application No. 10/129,159, filed as application No. PCT/US01/31391 on Oct. 9, 2001, now Pat. No. 7,115,503.

(60) Provisional application No. 60/239,194, filed on Oct. 10, 2000.

(51) Int. Cl.
H01L 21/44    (2006.01)
(52) U.S. Cl. ............ 438/660; 438/661; 438/662
(58) Field of Classification Search ........... 438/660, 438/661, 662, 686, 687, 688, 795, 798, 799, 438/940, 955; 257/45, 75; 250/492.1, 492.2
See application file for complete search history.

(56) References Cited

U.S. PATENT DOCUMENTS

| | | | |
|---|---|---|---|
| 3,632,205 A | 1/1972 | Marcy | |
| 4,234,358 A | 11/1980 | Celler et al. | |
| 4,309,225 A | 1/1982 | Fan et al. | |
| 4,382,658 A | 5/1983 | Shields et al. | |
| 4,456,371 A | 6/1984 | Lin | |
| 4,514,895 A | 5/1985 | Nishimura | |
| 4,639,277 A | 1/1987 | Hawkins | |
| 4,691,983 A | 9/1987 | Kobayashi et al. | |
| 4,727,047 A | 2/1988 | Bozler et al. | |

(Continued)

FOREIGN PATENT DOCUMENTS

DE    19839718    3/2000

(Continued)

OTHER PUBLICATIONS

U.S. Appl. No. 60/253256, filed Aug. 2003, Im.

(Continued)

*Primary Examiner*—Kiet T Nguyen
(74) *Attorney, Agent, or Firm*—Baker Botts LLP

(57) ABSTRACT

A method and apparatus for processing a thin metal layer on a substrate to control the grain size, grain shape, and grain boundary location and orientation in the metal layer by irradiating the metal layer with a first excimer laser pulse having an intensity pattern defined by a mask to have shadow regions and beamlets. Each region of the metal layer overlapped by a beamlet is melted throughout its entire thickness, and each region of the metal layer overlapped by a shadow region remains at least partially unmelted. After completion of resolidification of the melted regions following irradiation by the first excimer laser pulse, the metal layer is irradiated by a second excimer laser pulse having a shifted intensity pattern so that the shadow regions overlap regions of the metal layer having fewer and larger grains.

27 Claims, 53 Drawing Sheets

U.S. PATENT DOCUMENTS

| | | | |
|---|---|---|---|
| 4,758,533 A | 7/1988 | Magee et al. | |
| 4,793,694 A | 12/1988 | Liu | |
| 4,800,179 A | 1/1989 | Mukai | |
| 4,855,014 A | 8/1989 | Kakimoto et al. | |
| 4,870,031 A | 9/1989 | Suguhara et al. | |
| 4,940,505 A | 7/1990 | Schachameyer et al. | |
| 4,970,546 A | 11/1990 | Suzuki et al. | |
| 4,976,809 A | 12/1990 | Broadbent | |
| 4,977,104 A | 12/1990 | Sawada et al. | |
| 5,032,233 A | 7/1991 | Yu et al. | |
| 5,061,655 A | 10/1991 | Ipposhi et al. | |
| RE33,836 E | 3/1992 | Resor, III et al. | |
| 5,145,808 A | 9/1992 | Sameshima et al. | |
| 5,173,441 A * | 12/1992 | Yu et al. | 438/676 |
| 5,204,659 A | 4/1993 | Sarma | |
| 5,233,207 A | 8/1993 | Anzai | |
| 5,285,236 A | 2/1994 | Jain | |
| 5,291,240 A | 3/1994 | Jain | |
| 5,304,357 A | 4/1994 | Sato et al. | |
| 5,373,803 A | 12/1994 | Noguchi et al. | |
| 5,395,481 A | 3/1995 | McCarthy | |
| 5,409,867 A | 4/1995 | Asano | |
| 5,413,958 A | 5/1995 | Imahashi et al. | |
| 5,417,897 A | 5/1995 | Asakawa et al. | |
| 5,436,095 A | 7/1995 | Mizuno et al. | |
| 5,453,594 A | 9/1995 | Konecny | |
| 5,456,763 A | 10/1995 | Kaschmitter et al. | |
| 5,466,908 A * | 11/1995 | Hosoya et al. | 219/121.68 |
| 5,496,768 A | 3/1996 | Kudo | |
| 5,512,494 A | 4/1996 | Tanabe | |
| 5,523,193 A | 6/1996 | Nelson | |
| 5,529,951 A | 6/1996 | Noguchi et al. | |
| 5,591,668 A | 1/1997 | Maegawa et al. | |
| 5,614,421 A | 3/1997 | Yang | |
| 5,614,426 A | 3/1997 | Funada et al. | |
| 5,616,506 A | 4/1997 | Takemura | |
| 5,620,910 A | 4/1997 | Teramoto | |
| 5,710,050 A | 1/1998 | Makita et al. | |
| 5,721,606 A | 2/1998 | Jain | |
| 5,736,709 A | 4/1998 | Neiheisel | |
| 5,742,426 A | 4/1998 | York | |
| 5,756,364 A | 5/1998 | Tanaka et al. | |
| 5,766,989 A | 6/1998 | Maegawa et al. | |
| 5,844,588 A | 12/1998 | Anderson | |
| 5,861,991 A | 1/1999 | Fork | |
| 5,893,990 A | 4/1999 | Tanaka | |
| 5,960,323 A | 9/1999 | Wakita | |
| 5,986,807 A | 11/1999 | Fork | |
| 6,014,944 A | 1/2000 | Russell et al. | |
| 6,020,224 A | 2/2000 | Shimogaichi et al. | |
| 6,045,980 A * | 4/2000 | Edelkind et al. | 430/320 |
| 6,072,631 A | 6/2000 | Guenther et al. | |
| 6,081,381 A | 6/2000 | Shalapenok et al. | |
| 6,093,934 A | 7/2000 | Yamazaki et al. | |
| 6,117,301 A | 9/2000 | Freudenberger et al. | |
| 6,117,752 A | 9/2000 | Suzuki | |
| 6,120,976 A | 9/2000 | Treadwell et al. | |
| 6,130,009 A | 10/2000 | Smith et al. | |
| 6,130,455 A | 10/2000 | Yoshinouchi | |
| 6,136,632 A | 10/2000 | Higashi | |
| 6,156,997 A | 12/2000 | Yamazaki et al. | |
| 6,162,711 A | 12/2000 | Ma et al. | |
| 6,169,014 B1 | 1/2001 | McCulloch | |
| 6,172,820 B1 | 1/2001 | Kuwahara | |
| 6,177,301 B1 | 1/2001 | Jung | |
| 6,187,088 B1 | 2/2001 | Okumura | |
| 6,190,985 B1 | 2/2001 | Buynoski | |
| 6,193,796 B1 | 2/2001 | Yang | |
| 6,198,141 B1 | 3/2001 | Yamazaki et al. | |
| 6,203,952 B1 | 3/2001 | O'Brien et al. | |
| 6,222,195 B1 * | 4/2001 | Yamada et al. | 250/492.2 |
| 6,235,614 B1 | 5/2001 | Yang | |
| 6,242,291 B1 | 6/2001 | Kusumoto et al. | |
| 6,255,146 B1 | 7/2001 | Shimizu et al. | |
| 6,274,488 B1 | 8/2001 | Talwar et al. | |
| 6,285,001 B1 | 9/2001 | Fleming et al. | |
| 6,300,175 B1 | 10/2001 | Moon | |
| 6,313,435 B1 | 11/2001 | Shoemaker et al. | |
| 6,316,338 B1 | 11/2001 | Jung | |
| 6,320,227 B1 | 11/2001 | Lee et al. | |
| 6,322,625 B2 | 11/2001 | Im | |
| 6,326,186 B1 | 12/2001 | Park et al. | |
| 6,326,286 B1 | 12/2001 | Park et al. | |
| 6,333,232 B1 | 12/2001 | Kunikiyo | |
| 6,341,042 B1 | 1/2002 | Matsunaka et al. | |
| 6,348,990 B1 | 2/2002 | Igasaki et al. | |
| 6,353,218 B1 | 3/2002 | Yamazaki et al. | |
| 6,358,784 B1 | 3/2002 | Zhang et al. | |
| 6,368,945 B1 | 4/2002 | Im | |
| 6,388,146 B1 | 5/2002 | Onishi et al. | |
| 6,388,386 B1 | 5/2002 | Kunii et al. | |
| 6,392,810 B1 | 5/2002 | Tanaka | |
| 6,393,042 B1 | 5/2002 | Tanaka | |
| 6,407,012 B1 | 6/2002 | Miyasaka et al. | |
| 6,410,373 B1 | 6/2002 | Chang et al. | |
| 6,429,100 B2 | 8/2002 | Yoneda | |
| 6,432,758 B1 | 8/2002 | Cheng et al. | |
| 6,444,506 B1 | 9/2002 | Kusumoto et al. | |
| 6,445,359 B1 | 9/2002 | Ho | |
| 6,448,612 B1 | 9/2002 | Miyazaki et al. | |
| 6,451,631 B1 | 9/2002 | Grigoropoulos et al. | |
| 6,455,359 B1 | 9/2002 | Yamazaki et al. | |
| 6,468,845 B1 | 10/2002 | Nakajima et al. | |
| 6,471,772 B1 | 10/2002 | Tanaka | |
| 6,472,684 B1 | 10/2002 | Yamazaki et al. | |
| 6,476,447 B1 | 11/2002 | Yamazaki et al. | |
| 6,482,722 B2 | 11/2002 | Kunii et al. | |
| 6,493,042 B1 | 12/2002 | Bozdagi et al. | |
| 6,495,067 B1 | 12/2002 | Ono | |
| 6,495,405 B2 | 12/2002 | Voutsas et al. | |
| 6,501,095 B2 | 12/2002 | Yamaguchi et al. | |
| 6,504,175 B1 | 1/2003 | Mei et al. | |
| 6,506,636 B2 | 1/2003 | Yamazaki et al. | |
| 6,511,718 B1 | 1/2003 | Paz de Araujo et al. | |
| 6,512,634 B2 | 1/2003 | Tanaka | |
| 6,516,009 B1 | 2/2003 | Tanaka | |
| 6,521,473 B1 | 2/2003 | Jung | |
| 6,521,492 B2 | 2/2003 | Miyasaka et al. | |
| 6,526,585 B1 | 3/2003 | Hill | |
| 6,528,359 B2 | 3/2003 | Kusumoto et al. | |
| 6,535,535 B1 | 3/2003 | Yamazaki et al. | |
| 6,555,449 B1 | 4/2003 | Im et al. | |
| 6,562,701 B2 | 5/2003 | Ishida et al. | |
| 6,563,077 B2 | 5/2003 | Im | |
| 6,573,163 B2 | 6/2003 | Voutsas et al. | |
| 6,573,531 B1 | 6/2003 | Im et al. | |
| 6,577,380 B1 | 6/2003 | Sposili et al. | |
| 6,582,827 B1 | 6/2003 | Im | |
| 6,590,228 B2 | 7/2003 | Voutsas et al. | |
| 6,608,326 B1 | 8/2003 | Shinagawa et al. | |
| 6,621,044 B2 | 9/2003 | Jain et al. | |
| 6,635,554 B1 | 10/2003 | Im et al. | |
| 6,635,932 B2 | 10/2003 | Grigoropoulos et al. | |
| 6,660,575 B1 * | 12/2003 | Zhang | 438/166 |
| 6,667,198 B2 | 12/2003 | Shimoto et al. | |
| 6,693,258 B2 | 2/2004 | Sugano et al. | |
| 6,734,635 B2 | 5/2004 | Kunii et al. | |
| 6,750,424 B2 | 6/2004 | Tanaka | |
| 6,767,804 B2 | 7/2004 | Crowder | |
| 6,770,545 B2 | 8/2004 | Yang | |
| 6,784,455 B2 | 8/2004 | Maekawa et al. | |
| 6,830,993 B1 | 12/2004 | Im et al. | |
| 6,858,477 B2 | 2/2005 | Deane et al. | |
| 6,908,835 B2 | 6/2005 | Sposili et al. | |

| | | |
|---|---|---|
| 6,916,690 B2 | 7/2005 | Chang |
| 6,961,117 B2 | 11/2005 | Im |
| 6,962,860 B2 | 11/2005 | Yamazaki et al. |
| 7,049,184 B2 | 5/2006 | Tanabe |
| 7,078,281 B2 | 7/2006 | Tanaka et al. |
| 7,091,411 B2 | 8/2006 | Falk et al. |
| 7,144,793 B2 | 12/2006 | Gosain et al. |
| 7,164,152 B2 | 1/2007 | Im |
| 7,187,016 B2 | 3/2007 | Arima |
| 7,217,605 B2 | 5/2007 | Kawasaki et al. |
| 7,259,081 B2 | 8/2007 | Im |
| 7,297,982 B2 | 11/2007 | Suzuki et al. |
| 7,300,858 B2 | 11/2007 | Im |
| 7,311,778 B2 | 12/2007 | Im et al. |
| 7,318,866 B2 | 1/2008 | Im |
| 7,319,056 B2 | 1/2008 | Im et al. |
| 7,326,876 B2 | 2/2008 | Jung |
| 7,341,928 B2 | 3/2008 | Im |
| 2001/0001745 A1 | 5/2001 | Im et al. |
| 2001/0041426 A1 | 11/2001 | Im |
| 2002/0083557 A1 | 7/2002 | Jung |
| 2002/0096680 A1 | 7/2002 | Sugano et al. |
| 2002/0104750 A1 | 8/2002 | Ito |
| 2002/0119609 A1 | 8/2002 | Hatano et al. |
| 2002/0151115 A1 | 10/2002 | Nakajima et al. |
| 2003/0000455 A1 | 1/2003 | Voutsas |
| 2003/0003242 A1 | 1/2003 | Voutsas |
| 2003/0006221 A1 | 1/2003 | Hong et al. |
| 2003/0013278 A1 | 1/2003 | Jang et al. |
| 2003/0014337 A1 | 1/2003 | Mathews et al. |
| 2003/0029212 A1 | 2/2003 | Im |
| 2003/0068836 A1 | 4/2003 | Hongo et al. |
| 2003/0089907 A1 | 5/2003 | Yamaguchi et al. |
| 2003/0096489 A1 | 5/2003 | Im et al. |
| 2003/0119286 A1 | 6/2003 | Im et al. |
| 2003/0148565 A1 | 8/2003 | Yamanaka |
| 2003/0194613 A1 | 10/2003 | Voutsas et al. |
| 2004/0053450 A1 | 3/2004 | Sposili et al. |
| 2004/0061843 A1 | 4/2004 | Im |
| 2004/0127066 A1 | 7/2004 | Jung |
| 2004/0140470 A1 | 7/2004 | Kawasaki et al. |
| 2004/0169176 A1 | 9/2004 | Peterson et al. |
| 2004/0182838 A1 | 9/2004 | Das et al. |
| 2004/0222187 A1 | 11/2004 | Lin |
| 2004/0224487 A1 | 11/2004 | Yang |
| 2005/0032249 A1 | 2/2005 | Im et al. |
| 2005/0034653 A1 | 2/2005 | Im et al. |
| 2005/0059265 A1 | 3/2005 | Im |
| 2005/0112906 A1 | 5/2005 | Maekawa et al. |
| 2005/0141580 A1 | 6/2005 | Partlo et al. |
| 2005/0142450 A1 | 6/2005 | Jung |
| 2005/0142451 A1 | 6/2005 | You |
| 2005/0202654 A1 | 9/2005 | Im |
| 2006/0030164 A1 | 2/2006 | Im |
| 2006/0035478 A1 | 2/2006 | You |
| 2006/0102901 A1 | 5/2006 | Im et al. |
| 2006/0125741 A1 | 6/2006 | Tanaka et al. |
| 2006/0211183 A1 | 9/2006 | Duan et al. |
| 2006/0254500 A1 | 11/2006 | Im et al. |
| 2007/0007242 A1 | 1/2007 | Im |
| 2007/0020942 A1 | 1/2007 | Im |
| 2007/0032096 A1 | 2/2007 | Im |
| 2007/0108472 A1 | 5/2007 | Jeong et al. |
| 2007/0111349 A1 | 5/2007 | Im |
| 2007/0215942 A1 | 9/2007 | Chen et al. |
| 2008/0035863 A1 | 2/2008 | Im et al. |
| 2008/0176414 A1 | 7/2008 | Im |
| 2009/0001523 A1 | 1/2009 | Im |
| 2009/0045181 A1 | 2/2009 | Im |
| 2009/0137105 A1 | 5/2009 | Im |
| 2009/0218577 A1 | 9/2009 | Im |
| 2009/0242805 A1 | 10/2009 | Im |

FOREIGN PATENT DOCUMENTS

| | | |
|---|---|---|
| DE | 10103670 | 8/2002 |
| EP | 681316 | 8/1995 |
| EP | 655774 | 7/1996 |
| EP | 1067593 | 10/2001 |
| GB | 2338342 | 12/1999 |
| GB | 2338343 | 12/1999 |
| GB | 2338597 | 12/1999 |
| JP | 62181419 | 8/1987 |
| JP | 2283036 | 11/1990 |
| JP | 4033327 | 2/1992 |
| JP | 4279064 | 10/1992 |
| JP | 6252048 | 9/1994 |
| JP | 6283422 | 10/1994 |
| JP | 7176757 | 7/1995 |
| JP | 11064883 | 3/1999 |
| JP | 11281997 | 10/1999 |
| JP | 2001023920 | 1/2001 |
| WO | 9745827 | 12/1997 |
| WO | 9824118 | 6/1998 |
| WO | 9931719 | 6/1999 |
| WO | 0014784 | 3/2000 |
| WO | 0118854 | 3/2001 |
| WO | 0118855 | 3/2001 |
| WO | 0171786 | 9/2001 |
| WO | WO0171791 | 9/2001 |
| WO | 0231869 | 4/2002 |
| WO | 0242847 | 5/2002 |
| WO | 0286954 | 5/2002 |
| WO | 02086955 | 10/2002 |
| WO | 03018882 | 3/2003 |
| WO | 03046965 | 6/2003 |
| WO | 03084688 | 10/2003 |
| WO | 2004017379 | 2/2004 |
| WO | 2004017380 | 2/2004 |
| WO | 2004017381 | 2/2004 |
| WO | 2004017382 | 2/2004 |
| WO | 2004075263 | 9/2004 |
| WO | WO05029551 | 3/2005 |
| WO | WO2005029546 | 3/2005 |
| WO | WO2005029548 | 3/2005 |
| WO | WO2005029550 | 3/2005 |

OTHER PUBLICATIONS

Im et al., "Controlled Super-Lateral Growth of Si Films for Microstructural Manipulation and Optimization", Phys. Stat. Sol. (a), vol. 166, p. 603 (1998).

S.D. Brotherton et al., "Influence of Melt Depth in Laser Crystallized Poly-Si Thin Film Transistors," 82 J. Appl. Phys. 4086 (1997).

J.S. Im et al., "Crystalline Si Films for Integrated Active-Matrix Liquid-Crystals Displays," 21 MRS Bulletin 39 (1996).

Im et al., "Single-Crystal Si Films for Thin-Film Transistor Devices," Appl. Phys. Lett., vol. 70 (25), p. 3434 (1997).

Sposili et al., "Sequential Lateral Solidification of Thin Silicon Films on SiO2", Appl. Phys. Lett., vol. 69 (19), p. 2864 (1996).

Crowder et al., "Low-Temperature single-Crystal Si TFT's Fabricated on Si Films processed via Sequential Lateral Solidification", IEEE Electron Device Letter, vol. 19 (8), p. 306 (1998).

Sposili et al., "Single-Crystal Si Films via a Low-Substrate-Temperature Excimer-Laser Crystallization Method", Mat. Res. Soc. Symp. Proc. vol. 452, pp. 953-958, 1997 Materials Research Society.

C. E. Nebel, "Laser Interference Structing of A-SI:h" Amorphous Silicon Technology—1996, San Francisco, CA Apr. 8-12, 1996, Materials Research Society Symposium Proceedings, vol. 420, Pittsburgh, PA.

J. H. Jeon et al., "Two-step laser recrystallization of poly-Si for effective control of grain boundaries", Journal of Non Crystalline Solids, North-Holland Publishing Company, NL, vol. 266-269, May 2000, pp. 645-649.

H. Endert et al., "Excimer Laser: A New Tool for Precision Micromaching," 27 Optical and Quantum Electronics, 1319 (1995).
"Overview of Beam Delivery Systems for Excimer Lasers," Micro/Las Lasersystem GMBH. 1999.
K.H. Weiner et al., "Ultrashallow Junction Formation Using Projection Gas Immersion Laser Doping (PGILD)," A Verdant Technologies Technical Brief, Aug. 20, 1997.
Hau-Riege C.S. et al., "The Effects of Microstructural Transitions at Width Transitions on interconnect reliability," Journal of Applied Physics, Jun. 15, 2000, vol. 87, No. 12, pp. 8467-8472.
McWilliams et al., "Wafer-Scale Laser Pantography: Fabrication of N-Metal-Oxide-Semiconductor Transistors and Small-Scale Integrated Circuits By Direct-Write Laser-Induced Pyrolytic Reactions," Applied Physics Letters, American Institute of Physics, New York, US, vol. 43, No. 10, Nov. 1983, pp. 946-948.
Mariucci et al., "Grain boundary location control by patterned metal film in excimer laser crystallized polysilicon," Proceedings of the Figth International COnference on Polycrystalline Semiconductors, Schwabisch Gmund, Germany, Sep. 13-18, 1998, vol. 67-68, pp. 175-180.
Broadbent et al., "Excimer Laser Processing of Al-1%Cu/TiW Interconnect Layers," 1989 Proceedings, Sixth International IEEE VLSI Multilevel Interconnection COnference, Santa Clara, CA, Jun. 12-13, 1989, pp. 336-345.
H.J. Kim and James S. Im, "Grain Boundary Location-Controlled Poly-Si Films for TFT Devices Obtained Via Novel Excimer Laser Process," Abstracts for Symposium of Materials Research Society, Nov. 27 to Dec. 2, 1994, p. 230.
S.D. Brotherton, "Polycrystalline Silicon Thin Film Transistors," 10 Semicond. Sci. Tech., pp. 721-738 (1995).
H. Watanabe et al., "Crystallization Process of Polycrystalline Silicon by KrF Excimer Laser Annealing," 33 Japanese J. of Applied Physics Part 1—Regular Papers Short Notes & Review Papers, pp. 4491-4498 (1994).
E. Fogarassy et al., "Pulsed Laser Crystallization of Hydrogen-Free a-Si Thin Films for High-Mobility Poly-Si TFT Fabrication," 56 Applied Physics A—Solids and Surfaces, pp. 365-373 (1993).
Y. Miyata et al, "Low-Temperature Polycrystalline Silicon Thin-Film Transistors for Large-Area Liquid Crystal Display," 31 Japanese J. of Applied Physics Part 1—Regular Papers Short Notes & Review Papers, pp. 4559-4562 (1992).
Im et al., "Phase Transformation Mechanisms Involved in Excimer Laser Crystallization of Amorphous Silicon Films," Appl. Phys. Lett., vol. 63 (14), p. 1969 (1993).
Im et al., "on the Super Lateral Growth Phenomenon Observed in Excimer Laser-Induced Crystallization of Thin Si Films," Appl. Phys. Lett., vol. 64 (17), p. 2303 (1994).
Brochure from MicroLas Lasersystem, GmbH, "UV Optics Systems for Excimer Laser Based Micromaching and Marking". 1999.
Ishida et al., "Ultra-shallow boxlike profiles fabricated by pulsed ultraviolet-laser doping process", J. Vac. Sci. Technol. B 12(1), p. 399-403, 1994.
Yoshimoto, et al., "Excimer-Laser-Produced and Two-Dimensionally Position-Controlled Giant Si Grains on Organic SOG Underlayer", p. 285-286, AM-LCD 2000.
Ozawa et al., "Two-Dimensionally Position-Controlled Exicer-Laser-Crystallization of Silicon Thin Films on Glassy Substrate", Jpn. J. Appl. Phys. vol. 38, Part 1, No. 10, p. 5700-5705, (1999).
I.W. Boyd, Laser Processing of Thin Films and Microstructures, Oxidation, Deposition, and Etching of Insulators (Springer—Verlag Berlin Heidelber 1987).
N. Yamamuchi and R. Rief, Journal of Applied Physics, "Polycrystalline silicon thin films processed with silicon ion implantation and subsequent solid-phase crystallization: Theory, experiments, and thin-film transistor applications" —Apr. 1, 1994—vol. 75, Issue 7, pp. 3235-3257.
T. Noguchi, "Appearance of Single-Crystalline Properties in Fine-Patterned Si Thin Film Transistors (TFTs) by Solid Phase Crystallization (SPC)," Jpn. J. Appl. Phys. vol. 32 (1993) L1584-L1587.
Ishihara et al., "A Novel Double-Pulse Exicem-Laser Crystallization Method of Silicon Thin-Films," Japanese Journal of Applied Physics, Publication Office Japanese Journal of Applied Physics, Tokyo, Japan, vol. 34, No. 8A, Aug. 1995, pp. 3976-3981.

Kim, H.J., "Excimer-Laser-Induced Crystallization of Amorphous Silicon Thin Films" Ph. D. Dissertation Abstract, Columbia University, 1996.
The effects of microstructural transistions at width transistions on interconnect reliability; Hau-Riege, C.S. and Thompson, C.V.; Jun. 15, 2000; Journal of Applied Physics; vol. 87, No. 12; pp. 8467-8472.
Bergmann, R. et al., Nucleation and Growth of Crystalline Silicon Films on Glass for Solar Cells, Phys. Stat. Sol., 1998, pp. 587-602, vol. 166, Germany.
Biegelsen, D.K., L.E. Fennell and J.C. Zesch, Origin of oriented crystal growth of radiantly melted silicon on SiO/sub 2, Appl. Phys. Lett. 45, 546 (1984).
Crowder et al., "Parametric investigation of SLS-processed polysilicon thin films for TFT application," Preparations and Characterization, Elsevier, Sequoia, NL, vol. 427, No. 1-2, Mar. 3, 2003, pp. 101-107, XP004417451.
Crowder et al., "Sequential Lateral Solidification of PECVD and Sputter Deposited a-Si Films", Mat. Res. Soc. Symp. Proc. 621:Q.9.7.1-9.7.6, 2000.
Dassow, R. et al., Laser-Crystallized Polycrystalline Silicon on Glass for Photovoltaic Applications, Solid State Phenomena, pp. 193-198, vol. 67-68, Scitec Publications, Switzerland, 1999.
Dassow, R. et al. Nd:YVO4 Laser Crystallization for Thin Film Transistors with a High Mobility, Mat. Res. Soc. Symp. Proc., 2000, Q9.3.1-Q9.3.6, vol. 621, Materials Research Society.
Dassow, R. et al., Laser crystallization of silicon for high-performance thin-film transistors, Semicond. Sci. Technol., 2000, pp. L31-L34, vol. 15, UK.
Dimitriadis, C.A., J. Stoemenos, P.A. Coxon, S. Friligkos, J. Antonopoulos and N. A. Economou, Effect of pressure on the growth of crystallites of low-pressure chemical-vapor-deposited polycrystalline silicon films and the effective electron mobility under high normal field in thin-film transistors, J. Appl. Phys. 73, 8402 (1993).
Geis et al., "Crystallographic orientation of silicon on an amorphous substrate using an artificial surface-relief grating and laser crystallization," Appl. Phys. Lett. 35(1) Jul. 1, 1979, 71-74.
Geis et al., "Silicon graphoepitaxy using a strip-heater oven," Appl. Phys. Lett. 37(5), Sep. 1, 1980, 454-456.
Geis et al., "Zone-Melting recrystallization of SI Films with a moveable-strip heater oven" J. Electro-Chem. Soc., 129: 2812 (1982).
Gupta et al., "Numerical Analysis of Excimer-laser induced melting and solidification of Si Thin Films", Applied Phys. Lett., 71:99, 1997.
Hau-Reige et al., "Microstructural Evolution Induced by Scanned Laser Annealing in Al Interconnects," Appl. Phys. Lett., vol. 75, No. 10, p. 1464-1466, 1999.
Hawkins, W.G. et al., "Origin of lamellae in radiatively melted silicon films," appl. Phys. Lett. 42(4), Feb. 15, 1983.
Hayzelden, C. And J.L. Batstone, Silicide formation and silicide-mediated crystallization of nickel-implanted amorphous silicon thin films, J. Appl. Phys. 73, 8279 (1993).
Jung, Y.H., et al., Low Temperature Polycrystalline Si TFTs Fabricated with Directionally Crystallized Si Film, Mat. Res. Soc. Symp. Proc. vol. 621, Z8.3.1-6, 2000.
Jung, Y.H., et al., the Dependence of Poly-Si TFT Characteristics on the Relative Misorientation Between Grain Boundaries and the Active Channel, Mat. Res. Soc. Symp. Proc. vol. 621, Q9.14.1-6, 2000.
Kahlert, H., "Creating Crystals", OE Magazine, Nov. 2001, 33-35.
Kim, C. et al., Development of SLS-Based SOG Display, IDMC 2005, Thu-15-02, 252-255.
Kim, H. J. et al., "Excimer Laser Induced Crystallization of Thin Amorphous Si Films on SiO2: Implications of Crystallized Microstructures for Phase Transformation Mechanisms," Mat. Res. Soc. Symp. Proc., vol. 283, 1993.
Kim, H.J. et al., "New Excimer-laser-crystallization method for producing large-grained and grain boundary-location-controlled Si Films for Thin Film Transistors", Applied Phys. Lett., 68: 1513, Mar., 1996.
Kim, H.J. et al., "Multiple Pulse Irradiation Effects in Excimer Laser-Induced Crystallization of Amorphous Si Films," Mat. Res. Soc. Sym. Proc., 321:665-670 (1994).

Kim, H.-J., et al., "The effects of dopants on surface-energy-driven secondary grain growth in silicon films," J. Appl. Phys. 67 (2), Jan. 15, 1990.

Kimura, M. and K. Egami, Influence of as-deposited film structure on (100) texture in laser-recrystallized silicon on fused quartz, Appl. Phys. Lett. 44, 420 (1984).

Kohler, J.R. et al., Large-grained polycrystalline silicon on glass by copper vapor laser annealing. Thin Solid Films, 1999, pp. 129-132, vol. 337, Elsevier.

Kung, K.T.Y. and R. Reif, Implant-dose dependence of grain size and (110) texture enhancements in polycrystalline Si films by seed selection through ion channeling, J. Appl. Phys. 59, 2422 (1986).

Kung, K.T.Y., R.B. Iverson and R. Reif, Seed selection through ion channeling to modify crystallographic orientations of polycrystalline Si films on SiO/sub 2/:Implant angle dependence, Appl. Phys. Lett. 46, 683 (1985).

Kuriyama, H., T. Nohda, S. Ishida, T. Kuwahara, S. Noguchi, S. Kiyama, S. Tsuda and S. Nakano, Lateral grain growth of poly-Si films with a specific orientation by an excimer laser annealing method, Jpn. J. Appl. Phys. 32, 6190 (1993).

Kuriyama, H., T. Nohda, Y. Aya, T. Kuwahara, K. Wakisaka, S. Kiyama and S. Tsuda, Comprehensive study of lateral grain growth in poly-Si films by excimer laser annealing and its application to thin film transistors, Jpn. J. Appl. Phys. 33, 5657 (1994).

Lee, S.-W. And S.-K. Joo, Low temperature poly-Si thin-film transistor fabrication by metal-induced lateral crystallization, IEEE Electron Device Letters 17, 160 (1996).

Lee, S.-W., Y.-C. Jeon and S.-K. Joo, Pd induced lateral crystallization of amorphous Si thin films, Appl. Phys. Lett. 66, 1671 (1995).

Leonard, J.P. et al, "Stochastic modeling of solid nucleation, in supercooled liquids", Appl. Phys. Lett. 78:22, May 28, 2001, 3454-3456.

Limanov, A. et al., Single-Axis Projection Scheme for Conducting Sequential Lateral Solidification of Si Films for Large-Area Electronics, Mat. Res. Soc. Symp. Proc., 2001, D10.1.1-D10.1.7, vol. 685E, Materials Research Society.

Limanov, A. et al., the Study of Silicon Films Obtained by Sequential Lateral Solidification by Means of a 3-k-Hz Excimer Laser with a Sheetlike Beam, Russian Microelectronics, 1999, pp. 30-39, vol. 28, No. 1, Russia.

Mariucci et al., "Advanced excimer laser crystallization techniques," Thin Solid Films, vol. 338, pp. 39-44, 2001.

Miyasaka, M., K. Makihira, T. Asano, E. Polychroniadis and J. Stoemenos, in situ observation of nickel metal-induced lateral crystallization of amorphous silicon thin films, Appl. Phys. Lett. 80, 944 (2002).

Nerding, M., S. Christiansen, R. Dassow, K. Taretto, J.R. Kohler and H.P. Strunk, Tailoring texture in laser crystallization of silicon thin-films on glass, Solid State Phenom. 93, 173 (2003).

Sato et al., "Mobility anisotropy of electrons in inversion layers on oxidized silicon surfaces" Physical Review B (State State) 4, 1950 (1971).

Song et al., "Single Crystal Si Islands on SiO2 Obtained Via Excimer Laser Irradiation of a Patterned Si Film", Applied Phys. Lett., 68:3165, 1996.

Sposili et al., "Line-scan sequential lateral solidification of Si thin films", Appl. Phys. A67, 273-6, 1998.

Thompson, C.V. and H.I. Smith, Surface-energy-driven secondary grain growth in ultrathin (<100 nm) films of silicon, Appl. Phys. Lett. 44, 603 (1984).

Voustsas, A.T., "Assessment of the Performance of Laser-Based Lateral-Crystallization Technology via Analysis and Modeling of Polysilicon Thin-Film-Transistor Mobility," IEEE Transations on Electronics Devices, vol. 50, No. 6, Jun. 2003.

Voutsas, A.T., A new era of crystallization: advances in polysilicon crystallization and crystal engineering, Applied Surface Science 250-262, 2003.

Voutsas, A.T., et al., Effect of process parameters on the structural characteristics of laterally grown, laser-annealed polycrystalline silicon films, Journal of Applied Physics, vol. 94, No. 12, p. 7445-7452, Dec. 15, 2003.

Weiner, K.H. et al. "Laser-assisted, Self-aligned Silicide Formation," A Verdant Technologies technical brief, Aug. 7, 1997, 1-9.

Werner, J.H., et al. From polycrystalline to single crystalline silicon on glass, Thin Solid Films 383, 95-100, 2001.

White et al., "Characterization of thin-oxide MNOS memory transistors" IEEE Trans. Electron Devices ED-19, 1280 (1972).

van der Wilt, "The Commercialization of the SLS Technology," Taiwan FPD, Jun. 11, 2004, pp. 1-12.

* cited by examiner

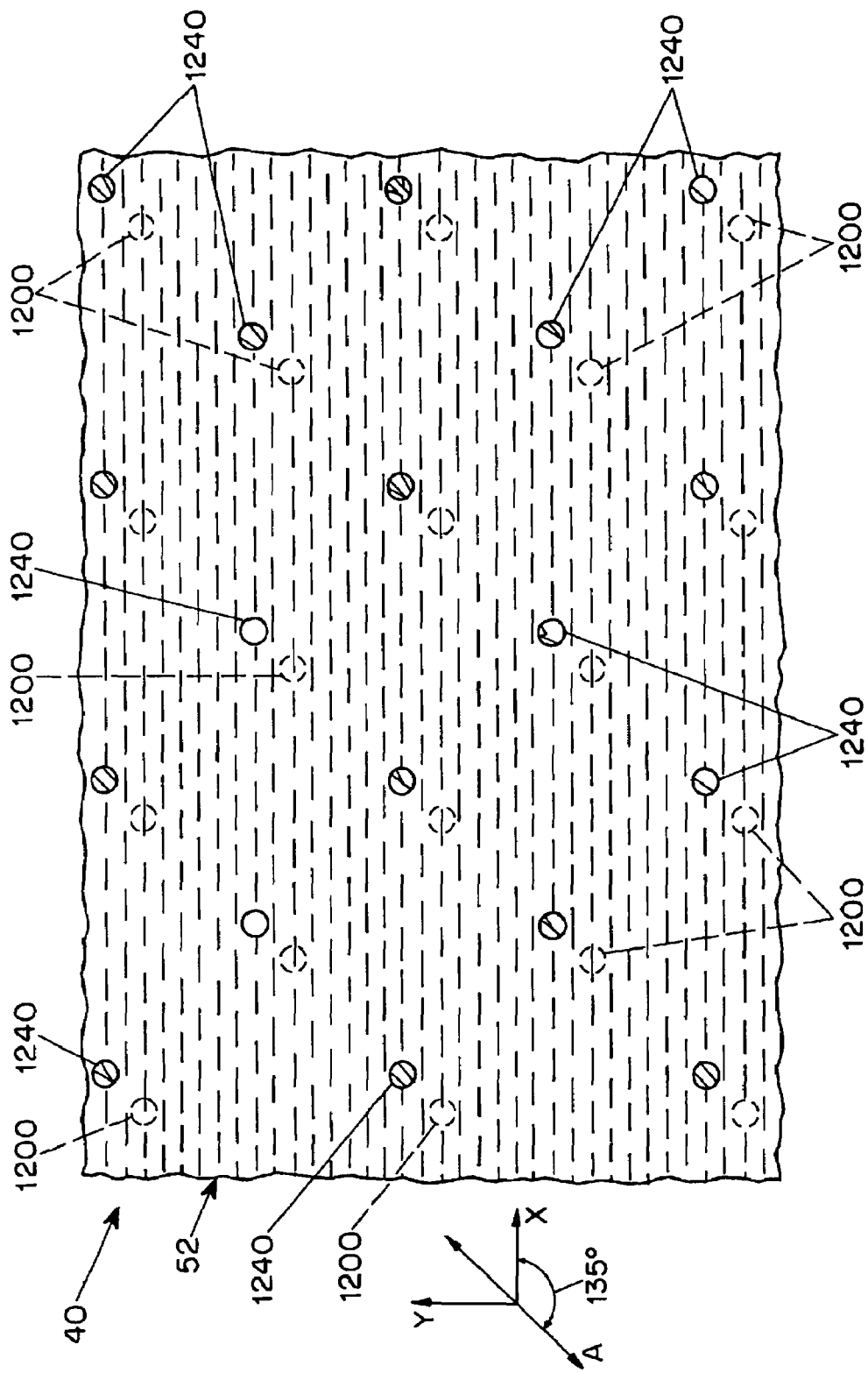

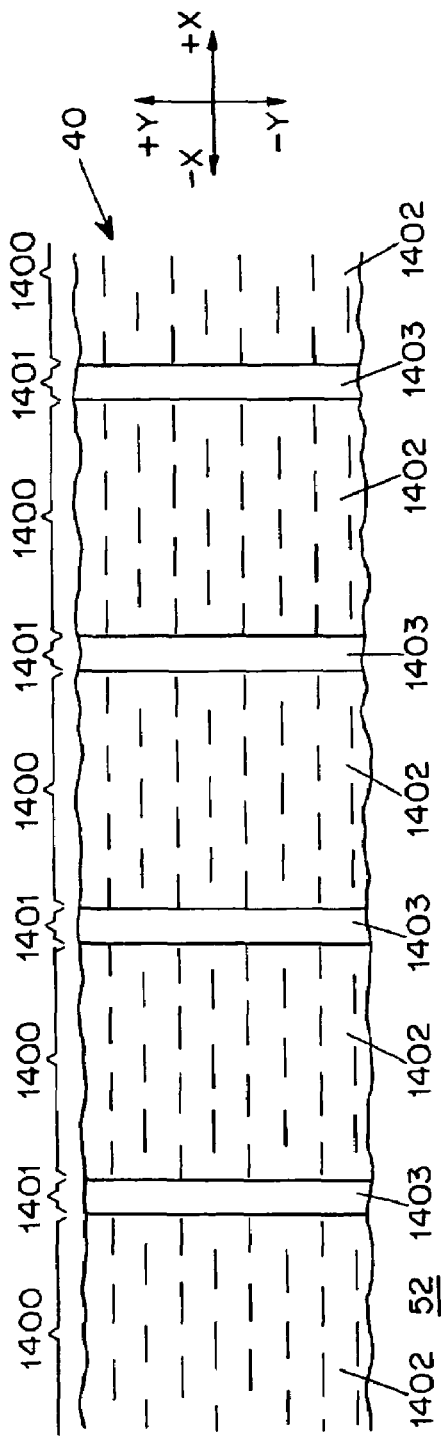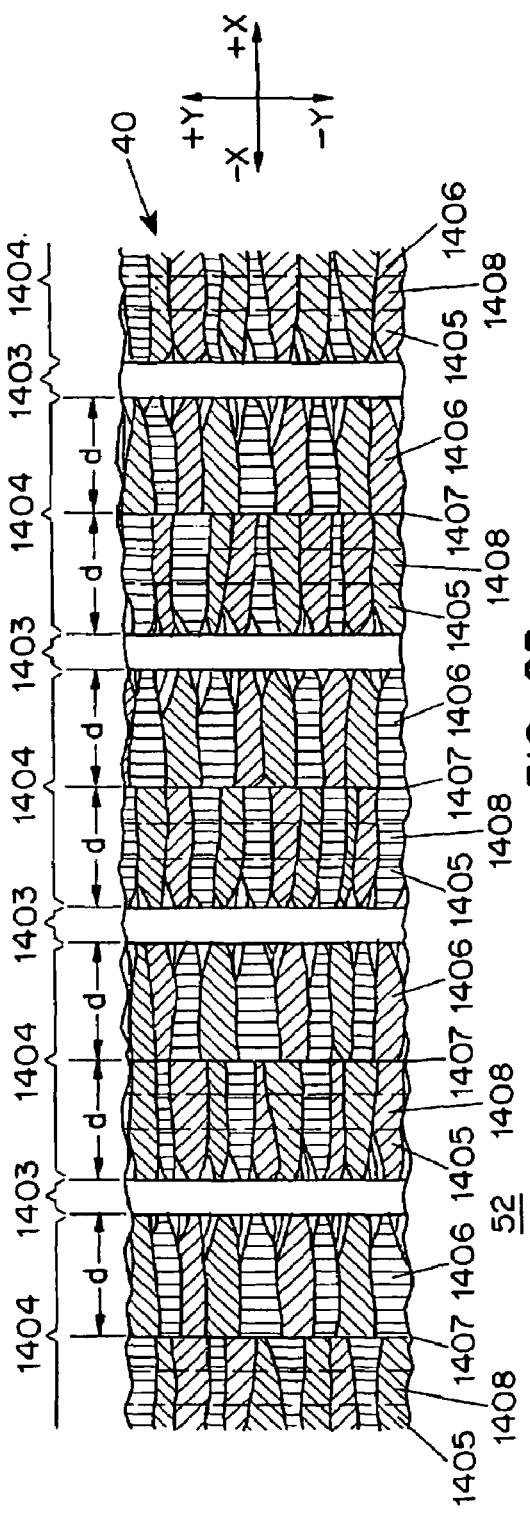

METHOD AND APPARATUS FOR PROCESSING THIN METAL LAYERS

CROSS-REFERENCE TO RELATED APPLICATIONS

This application is a continuation of U.S. patent application Ser. No. 10/129,159, filed Aug. 27, 2002 now U.S. Pat. No. 7,115,503, which is a national phase of International Application Serial No. PCT/US01/031391, filed Oct. 9, 2001, published Apr. 18, 2002, which claims priority from U.S. Provisional Application Ser. No. 60/239,194, filed Oct. 10, 2000, each of which are incorporated by reference in their entireties herein, and from which priority is claimed.

NOTICE OF GOVERNMENTAL RIGHTS

The invention claimed in the present application was made with funding from the United States Defense Research Project Agency under Contract N66001-98-01-8913. Therefore, the United States Government has certain rights in the invention.

FIELD OF THE INVENTION

The present invention relates to a method and apparatus for processing a thin metal layer on a substrate and, more particularly, to a method and apparatus for melting by pulsed irradiation having a predefined intensity pattern and resolidifying one or more regions of the metal layer so as to control the shape and size of grains, and the locations and orientation of grain boundaries in the resolidified regions of the metal layer.

BACKGROUND INFORMATION

In the field of semiconductor device processing, there has been a trend to reduce the size of features in integrated circuit devices, including metal interconnect lines therein. Due to such decreases in feature size, metal interconnect lines in integrated circuit devices have smaller cross-sectional areas and must therefore carry higher current densities. Carrying higher current densities increases the occurrence of electromigration in such interconnect lines. Consequently, electromigration is becoming an increasingly common failure mechanism in integrated circuit devices as the feature sizes in such devices become smaller.

Electromigration is observed as a transport of the metal material of a metal interconnect line caused by the transfer of momentum from the electrons flowing in the interconnect line to the metal ions therein. Electromigration can cause a metal layer interconnect line to fail when the transport of metal material creates a void or break in the interconnect line. Electromigration can also cause dislodged metal material in the metal layer interconnect line to accumulate so as to form bulges sufficiently large to make undesired electrical contact with an adjacent interconnect line. These failures occur most often when electron transport takes place parallel to grain boundaries in the metal layer of an interconnect line since grain boundaries can provide channels for the transport of dislodged metal ions.

The problem of failures in metal layer interconnect lines caused by electromigration may be alleviated by increasing the size of the grains in the metal layer interconnect lines so as to reduce the total grain boundary density along the direction of electron transport in the metal layer interconnect lines and to control the orientations of grain boundaries so as to form large angles (ideally 90°) with respect to the direction of electron transport.

In addition to alleviating the problem of electromigration in metal layer interconnect lines in integrated circuit devices, there is a general need in other applications for thin metal layers having higher conductance and greater mechanical strength, which may be obtained by increasing the grain size, and controlling the locations and orientations of grain boundaries in the metal layer. Accordingly, a need clearly exists for a method and apparatus for controlling grain size, grain shape, and the locations and orientations of grain boundaries in a metal layer, including metal layer interconnect lines in integrated circuit devices.

SUMMARY OF THE INVENTION

In accordance with the present invention, there is provided a method for processing a metal layer disposed on the substrate comprising the steps of irradiating the metal layer with a first radiation beam pulse (e.g., an excimer laser beam pulse) having an intensity pattern that includes at least one "shadow region" having no radiation intensity, and at least one "beamlet" having full radiation intensity of the beam. The intensity of the beamlet is such that each region of the metal layer that is overlapped by a beamlet is melted throughout its entire thickness, and each region of the metal layer that is overlapped by a shadow region remains at least partially unmelted. Each melted region adjoins at least one adjacent at least partially unmelted region.

After irradiation by the first radiation beam pulse, each melted region of the metal layer is permitted to cool and resolidify. During resolidification of each melted region, grains grow therein from each adjoining at least partially unmelted region until such growing grains abut (i.e., impinge on) other grains growing in the same melted region after the abutting grains have grown by a characteristic growth distance. Thereafter, the first radiation beam pulse becomes a previous radiation beam pulsed for further processing, and the metal layer is irradiated by a further radiation beam pulse having the same intensity pattern as the previous radiation beam pulse, but where the at least one beamlet and the at least one shadow region thereof have shifted with respect to the metal layer by a distance less than the characteristic growth distance of the grains growing during resolidification after irradiation by the previous radiation beam pulse. When the metal layer is irradiated by the further radiation beam pulse, each region of the metal layer overlapped by a shifted beamlet is melted throughout its entire thickness, and each region of the metal layer overlapped by a shifted shadow region remains at least partially unmelted. Each melted region adjoins at least one adjacent at least partially unmelted region.

After irradiation by the further radiation beam pulse, each melted region of the metal layer is permitted to cool and resolidify. During resolidification of each melted region, grains grow therein from each adjoining at least partially unmelted region until such growing grains abut other grains growing in the same melted region after the abutting grains have grown by an abutting grain growth distance. Thereafter, the further radiation beam pulse becomes the previous radiation pulse for further processing, and the steps of (1) irradiation of the metal layer with a further radiation beam pulse having the same intensity pattern as the previous radiation beam pulse but where the at least one beamlet and the at least one shadow region are further shifted with respect to the metal layer by less than the characteristic growth distance, and (2) resolidification of each melted region of the metal layer after irradiation by the further radiation beam pulse are repeated, if needed, until a desired grain structure is obtained in the metal layer.

The radiation beam pulse may be a laser beam pulse, an electron beam pulse, an ion beam pulse or other radiation beam pulse. The intensity patterns of the radiation beam pulses are defined by a mask through which the radiation beam pulses pass, and the shifting of the intensity pattern with respect to the metal layer may be accomplished by either shifting the substrate having the metal layer or shifting the mask.

In accordance with a first exemplary embodiment of the method of the present invention, the metal layer is prepatterned into one or more metal layer strips each having a respective predefined contour, and the intensity pattern of the first radiation beam pulse has one or more series of multiple, regularly spaced, relatively small, dot-like shadow regions, each series of shadow regions overlapping respective regions along the center line of a respective one of the one or more metal layer strips. The intensity pattern of the first radiation beam pulse also includes a beamlet that overlaps all regions of the one or more metal layer strips not overlapped by the shadow regions. After several iterations of irradiation of the one or more metal layer strips with radiation beam pulses, where the intensity pattern of each pulse is the same but shifted with respect to that of a previous pulse, and resolidification of each melted region after each irradiation, a desired grain structure is obtained in which each one of the one or more metal layer strips has single-grain regions separated by respective grain boundaries that are each approximately perpendicular to the metal strip at the location of the grain boundary.

According to a second exemplary embodiment of the method of the present invention, the metal layer is prepatterned into one or more metal layer strips each having a respective predefined contour. The intensity pattern of the first radiation beam pulse has one or more relatively narrow strip-like shadow regions each overlapping the center line of a respective one of the metal layer strips, and a beamlet that overlaps all regions of the one or more metal layer strips not overlapped by the shadow regions. After several iterations of irradiation of the one or more metal layer strips by radiation beam pulses, each having the same intensity pattern as that of the first pulse but shifted with respect to that of a previous pulse, and resolidification of each melted region after each irradiation, the grain structure of each metal layer strip comprises relatively large grains with grain boundaries that form large angles with respect to the metal layer strip at respective locations of the grain boundaries.

According to a third exemplary embodiment of the method of the present invention, a metal layer is irradiated by a first radiation beam pulse having an intensity pattern that includes an array of multiple, relatively small, dot-like shadow regions disposed at respective intersections of regularly spaced, mutually perpendicular diagonal lines, and a beamlet that overlaps all regions of the metal layer not overlapped by the shadow regions. Each region of the metal layer overlapped by the beamlet is melted throughout its entire thickness, while each region of metal layer overlapped by one of the shadow regions remains at least partially unmelted. Each melted region adjoins respective adjacent melted regions. After irradiation by the first radiation beam pulse, each melted region is permitted to cool and resolidify. During resolidification of each melted region, grains grow from each at least partially unmelted region in each adjoining melted region. The spacings of the at least partially unmelted regions, as determined by the spacings of the shadow regions, are such that grains growing from each at least partially unmelted region abut grains growing from neighboring at least partially unmelted regions after the abutting grains have grown by an abutting grain growth distance. After several iterations of irradiation by radiation beam pulses each having the same intensity pattern but shifted with respect to that of a previous pulse, and resolidification of each melted region after each radiation beam pulse, the grain structure of the metal layer comprises generally square single-grain regions with diagonal grain boundaries.

In accordance with the fourth exemplary embodiment of the method of the present invention, the intensity pattern of each radiation beam pulse includes regularly spaced beamlets in the shape of repeating chevrons where adjacent repeating chevron-shaped beamlets are staggered with respect to one another such that the peaks of each repeating chevron-shaped beamlet are aligned with respective troughs of adjacent repeating chevron-shaped beamlets, and the troughs of each repeating chevron-shaped beamlet are aligned with respective peaks of adjacent repeating chevron-shaped beamlets. The intensity pattern of each radiation beam pulse also includes shadow regions each positioned in between and adjoining respective adjacent beamlets. When a metal layer is irradiated by a radiation beam pulse having such an intensity pattern, each region overlapped by a respective one of the beamlets is melted throughout its entire thickness, and each region overlapped by a respective one of the shadow regions remains at least partially unmelted. Each one of the melted regions has the shape of a repeating chevron with opposing at least partially unmelted edges. After irradiation by the radiation beam pulse, each one of the melted regions cools and resolidifies. During resolidification of each melted region, grains grow from each of the opposing edges of the melted region in opposite directions towards one another in the melted region until the grains growing from the opposing edges abut one another along approximately the center line of the repeating chevron-shaped melted region after the abutting grains have grown by a characteristic growth distance. The beamlets and shadow regions of the intensity pattern of a further radiation beam pulse are shifted with respect to the metal layer in the direction of the peaks of the repeating-chevron-shaped beamlets by a distance less than the characteristic growth distance. The grain structure obtained after multiple iterations of irradiation and resolidification has adjoining single grain regions each having a generally hexagonal shape.

According to a fifth exemplary embodiment of the method of the present invention, the intensity pattern of the first radiation beam pulse has a plurality of regularly spaced, relatively narrow, linear, stripe-like shadow regions, and a plurality of regularly spaced, relatively wide, linear, stripe-like beamlets, each one of the beamlets being positioned in between and adjoining respective adjacent shadow regions. When a metal layer is irradiated by the first radiation beam pulse, each region of the metal layer overlapped by a respective one of the beamlets is melted throughout its entire thickness, and each region of the metal layer overlapped by a respective one of the shadow regions remains at least partially unmelted. Each at least partially unmelted region adjoins respective adjacent melted regions. After irradiation by the first radiation beam pulse, each melted region of the metal layer is permitted to resolidify. During resolidification of each melted region, respective grains grow therein from adjoining at least partially unmelted regions in opposite directions towards one another, and abut one another along a respective one of a plurality of first grain abutment boundaries after the abutting grains have grown by a first abutting grain growth distance. After completion of resolidification following irradiation by the first radiation beam pulse, the metal layer is irradiated by a second radiation beam pulse having the same intensity pattern as the first radiation beam pulse, but where the shadow regions and beamlets thereof are shifted in a direction perpendicular to the first grain abutment boundaries by a distance at least equal to the width of the shadow regions but less than the first abutting grain growth distance. When the metal layer is irradiated by the second radiation beam pulse, each region of the metal layer overlapped by a respective one of the shifted beamlets is melted throughout its entire thickness, and each region of the metal layer overlapped by a respective one of the shifted shadow regions remains at least partially unmelted. Each at least partially unmelted region adjoins respective adjacent melted regions. After irradiation by the second radiation beam pulse, the melted regions of the metal layer are permitted to cool and resolidify. During resolidification of each melted region, respective single grains grow therein from adjoining at least partially unmelted regions in opposite directions towards one another, and abut one another along a respective one of a plurality of second grain abutment boundaries after the abutting single grains have grown by the first abutting grain growth distance. Upon completion of resolidification of the melted regions after irradiation by the second radiation beam pulse, the metal layer has a grain structure comprising relatively long single grains extending between respective adjacent second grain abutment boundaries and having lateral grain boundaries approximately perpendicular to the second grain abutment boundaries.

According to a sixth exemplary embodiment of the method of the present invention, after completion of resolidification of the melted regions of the metal layer following irradiation by the second radiation beam pulse in the fifth exemplary embodiment described above, the metal layer on the substrate is rotated by 90° with respect to the second grain abutment boundaries. The rotated metal layer is then irradiated with a third radiation beam pulse having an intensity pattern that includes a plurality of regularly spaced, relatively narrow, linear, stripe-like shadow regions, each one being perpendicular to the second grain abutment boundaries of the grain structure of the rotated metal layer, and a plurality of regularly spaced, relatively wide, linear stripe-like beamlets also perpendicular to the second grain abutment boundaries. Each one of the beamlets is positioned in between and adjoining respective adjacent shadow regions. When each point on the rotated metal layer is irradiated by the third radiation beam pulse, each region of the metal layer overlapped by a respective one of the beamlets is melted throughout its entire thickness, and each region of the metal layer overlapped by a respective one of the shadow regions remains at least partially unmelted. Each at least partially unmelted region adjoins respective adjacent melted regions. After irradiation by the third radiation beam pulse, each melted region of the metal layer is permitted to cool and resolidify. During resolidification of each melted region, different single grains grow from each at least partially unmelted region into each adjoining melted region, and in each melted region respective grains grow from adjoining at least partially unmelted regions in opposite directions towards one another, and abut one another along a respective one of a plurality of second grain abutment boundaries after the abutting single grains have grown by a second abutting grain growth distance. The abutting single grains each have a dimension along the third grain abutment boundaries equal to the distance between adjacent second grain abutment boundaries. After completion of resolidification of the melted regions of the metal layer after irradiation by the third radiation beam pulse, each point on the metal layer is irradiated by a fourth radiation beam pulse having the same intensity pattern as the third radiation beam pulse, but where the shadow regions and beamlets thereof are shifted in a direction perpendicular to the third grain abutment boundaries by a distance at least equal to the width of the shadow regions but less than the second abutting grain growth distance. When each point on the metal layer is irradiated by the fourth radiation beam pulse, each region of the metal layer overlapped by a respective one of the shifted beamlets is melted throughout its entire thickness, and each region of the metal layer overlapped by a respective one of the shifted shadow regions remains at least partially unmelted. Each at least partially unmelted region adjoins respective adjacent melted regions. After irradiation by the fourth radiation beam pulse, each melted region of the metal layer is permitted to cool and resolidify. During resolidification of each melted region, respective single grains grow from each at least partially unmelted region into each adjoining melted region, and in each melted region respective single grains grow from adjoining at least partially unmelted regions in opposite directions towards one another, and abut one another along a respective one of a plurality of fourth grain abutment boundaries after the abutting single grains have grown by the second abutting grain growth distance. Upon completion of resolidification of the melted regions after irradiation by the fourth radiation beam pulse, the metal layer has a grain structure comprising an array of generally rectangular-shaped single-grain regions in respective rows and columns, each rectangular-shaped single-grain region having a dimension on two opposite sides equal to the distance between adjacent second grain abutment boundaries and having a dimension on the other two opposite sides equal to the distance between adjacent fourth grain abutment boundaries.

According to a seventh exemplary embodiment of the method of the present invention, the metal layer is in the form of a relatively narrow metal layer strip having a predefined contour. The width of the relatively narrow metal layer strip is sufficiently small so as to allow only single grains to grow therein. The metal layer strip is irradiated by a first radiation beam pulse having an intensity pattern that includes a plurality of relatively narrow, linear, stripe-like shadow regions positioned at regular intervals along the metal layer strip and a beamlet overlapping all regions of the metal layer strip not overlapped by a respective one of the shadow regions. Each region of the metal layer strip overlapped by the beamlet is melted throughout its entire thickness, and each region of the metal layer strip overlapped by a respective one of the shadow regions remains at least partially unmelted. Each at least partially unmelted region adjoins respective adjacent melted regions. After irradiation by the first radiation beam pulse, each melted region of the metal layer strip is permitted to cool and resolidify. During resolidification of each melted region, different single grains grow from each at least partially unmelted region in each adjoining melted region, and in each melted region respective single grains grow from adjoining at least partially unmelted regions in opposite directions towards one another, and abut one another at a respective one of a plurality of first grain abutment boundaries after the abutting single grains have grown by an abutting grain growth distance. After completion of resolidification of each melted region following irradiation by the first radiation beam pulse, the metal layer strip is irradiated with a second radiation beam pulse having the same intensity pattern as the first radiation beam pulse, but where each one of the shadow regions is shifted along the metal layer strip by a distance greater than the width of the shadow regions but less than the abutting grain growth distance. The beamlet of the intensity pattern of the second radiation beam pulse is also shifted with respect to the metal layer but still overlaps all regions of the metal layer strip not overlapped by the shadow regions. When the metal layer strip is irradiated by the second radiation beam pulse, each region of the metal layer strip overlapped by the shifted beamlet is melted throughout its entire thickness, and each region of the metal layer strip overlapped by a respective one of the shifted shadow regions remains at least partially unmelted. Each at least partially unmelted region adjoins respective adjacent melted regions. After irradiation by the second radiation beam pulse each melted region of the metal layer strip is permitted to cool and resolidify. During resolidification of each melted region, a respective single grain grows from each at least partially unmelted region in each adjoining melted region, and in each melted region respective single grains grow from adjoining at least partially unmelted regions in opposite directions towards one another, and abut one another at a respective one of a plurality of second grain abutment boundaries after the abutting single grains have grown by the abutting grain growth distance. After completion of resolidification of each melted region following the irradiation by the second radiation beam pulse, the metal layer strip has a grain structure comprising regions of single grains extending between respective adjacent ones of the second grain abutment boundaries. Each second grain abutment boundary is substantially perpendicular to the metal layer strip at the location of each second grain abutment boundary.

According to an eighth exemplary embodiment of the method of the present invention, the metal layer comprises at least one relatively narrow metal layer strip having at least one segment and a respective predefined contour having a Manhattan geometry. The width of each one of the at least one relatively narrow metal layer strip is sufficiently small so as to permit only single grains to grow therein. Each one of the at least one metal layer strip is irradiated by a first radiation beam pulse having an intensity pattern that includes a plurality of regularly spaced, relatively narrow, linear, stripe-like shadow regions, and a plurality of regularly spaced, relatively wide, linear, stripe-like beamlets. Each one of the beamlets is positioned in between and adjoining respective adjacent shadow regions. Each segment of each one of the at least one metal layer strip is diagonally oriented with respect to the shadow regions and the beamlets. When each one of the at least one metal layer strip is irradiated by the first radiation beam pulse, each region of the metal layer strip overlapped by a respective one of the beamlets is melted throughout its entire thickness, and each region of the at least one metal layer strip overlapped by a respective one of the shadow regions remains at least partially unmelted. Each at least partially unmelted region adjoins respective adjacent melted regions. Following irradiation by the first radiation beam pulse, each melted region of each one of the at least one metal strip is permitted to cool and resolidify. During resolidification of each melted region, different single grains grow from each at least partially unmelted region in each adjoining melted region, and in each melted region respective single grains grow from adjoining at least partially unmelted regions in opposite directions towards one another, and abut one another at a respective one of a plurality of first grain abutment boundaries after the abutting single grains have grown by an abutting grain growth distance. Each one of the first grain abutment boundaries is approximately parallel to the shadow regions and the beamlets. After completion of resolidification of each melted region of each one of the at least one metal layer strip following irradiation by the first radiation beam pulse, each one of the at least one metal layer strip is irradiated by a second radiation beam pulse having the same intensity pattern as the first radiation beam pulse, but where the shadow regions and beamlets thereof are each shifted in a direction perpendicular to the first grain abutment boundaries by a distance at least equal to the width of the shadow regions but less than the distance that would cause the shifted shadow regions to overlap the first grain boundaries. When each one of the at least one metal layer strip is irradiated by the second radiation beam pulse, each region of each one of the at least one metal layer strip overlapped by a respective one of the shifted beamlets is melted throughout its entire thickness, and each region of the at least one metal layer strip overlapped by a respective one of the shifted shadow regions remains at least partially unmelted. Each at least partially unmelted region adjoins respective adjacent melted regions. After irradiation by the second radiation beam pulse, each melted region of each one of the at least one metal layer strip is permitted to cool and resolidify. During resolidification of each melted region, a respective single grain grows from each at least partially unmelted region in each adjoining melted region, and in each melted region, respective single grains grow from adjoining at least partially unmelted regions in opposite directions towards one another, and abut one another at a respective one of a plurality of second grain abutment boundaries after the abutting single grains have grown by the abutting grain growth distance. Each one of the second grain abutment boundaries is approximately parallel to the shifted shadow regions and the shifted beamlets. After completion of resolidification of each melted region following irradiation by the second radiation beam pulse, each one of the at least one metal layer strip has a grain structure comprising regions of single grains extending between respective adjacent second grain abutment boundaries. Each second grain abutment boundary is perpendicularly oriented in relation to a respective one of the at least one metal layer strip at the location of the second grain abutment boundary.

According to a ninth exemplary embodiment of the method of the present invention, the metal layer is irradiated by a first radiation beam pulse having an intensity pattern that includes at least one stripe-shaped beamlet each having a respective one of at least one predefined contour. Each region of the metal layer overlapped by a respective one of the at least one beamlet is melted throughout its entire thickness so as to form at least one stripe-shaped melted region having a respective one of the at least one predefined contour, and each region of the metal layer not overlapped by a respective one of the at least one beamlet remains at least partially unmelted. Each one of the at least one melted region adjoins at least one adjacent at least partially unmelted region along a first and a second edge of the melted region. After irradiation by the first radiation beam pulse, each one of the at least one melted region is permitted to cool and resolidify. During resolidification of each one of the at least one melted region, first and second rows of grains grow therein from the first and second edges thereof, respectively, in opposite directions towards one another until each one of the first and second rows of grains has grown by an abutting grain growth distance. After each one of the at least one melted region has completely resolidified to form at least one resolidified region each having a respective one of the at least one predefined contour, the metal layer is patterned to form at least one relatively narrow metal strip from a respective strip-shaped region in one of the first and second rows of grains in each one of the at least one resolidified region. Each one of the at least one metal layer strip has a respective one of the at least one predefined contour and regions of single grains separated by grain boundaries each forming a relatively large angle with a respective one of the at least one metal layer strip at the location of the grain boundary.

According to a tenth embodiment of the method of the present invention, the metal layer is divided for processing purposes into a plurality of columns having a predetermined width. A first column of the metal layer is irradiated in a first pass by a pulsed radiation beam having a predetermined pulse repetition rate by translating the substrate having the metal layer at a predetermined translation velocity past the position of impingement of the pulsed radiation beam on the metal layer so that the pulsed radiation beam scans the entire length of the first column. Each pulse of the pulsed radiation beam has an intensity pattern that includes at least one shadow region and at least one beamlet, the intensity pattern having a width at least equal to the predetermined width of the columns. During each pulse of the pulsed radiation beam, each region of the metal layer overlapped by a respective one of the at least one beamlet is melted throughout its entire thickness, and each region of the metal layer overlapped by a respective one of the at least one shadow region remains at least partially unmelted. Each at least partially unmelted region adjoins at least one adjacent melted region. The predetermined translation velocity of the substrate having the metal layer and the preselected pulse repetition rate of the pulsed radiation beam are chosen so that each melted region in a previous portion of the metal layer irradiated by a previous pulse of the pulsed radiation beam completely solidifies before a next portion which overlaps the previous portion is irradiated by a next pulse of the pulsed radiation beam. After the first column has been irradiated by the pulsed radiation beam in the first pass, the intensity pattern of each pulse of the pulsed radiation beam is shifted with respect to the intensity pattern of the pulses of the pulsed radiation beam in the first pass by shifting the substrate having the metal layer by a relatively small distance in a direction perpendicular to the columns. After shifting of the metal layer, the first column is irradiated in a second pass by a pulsed radiation beam having the preselected pulse repetition rate and the shifted pulse intensity pattern by translating the substrate having the metal layer at the predetermined translation velocity past the position of impingement of the pulsed radiation beam on the metal layer so that the pulsed radiation beam scans the entire length of the first column in the second pass. The shifting of the metal layer and the irradiation of the first column in a next pass is repeated, if needed, until a desired grain structure is obtained in the first column. Thereafter, the substrate having the metal layer is translated in a lateral direction perpendicular to the columns so that the pulsed radiation beam is positioned to irradiate a second column in a first pass. Following the lateral translation step, the steps of irradiating the second column in a first pass, shifting the metal layer, irradiating the second column in a second pass, and continuing, if needed, the shifting of the metal layer and the irradiating of the second column in a next pass are carried out in combination until a desired grain structure is obtained in the second column. Thereafter, the steps of laterally translating the metal layer, irradiating a next column in a first pass, shifting of the metal layer, irradiating the next column in a second pass, and continuing, if needed, the shifting of the metal layer and the irradiating of the next column in a next pass are repeated in combination until the desired grain structure is obtained in each column of the metal layer.

In accordance with the method of the present invention, the metal layer may be subdivided for processing purposes into a plurality of sections, and the method steps of the present invention may be carried out in combination in each of the sections one at a time. Alternatively, the method steps may be carried out one step at a time in each section one at a time until all of the method steps of the method have been carried out in all of the sections of the metal layer.

In accordance with another aspect of the present invention, there is provided an apparatus for processing a metal layer on the substrate comprising a pulsed radiation beam source for providing radiation beam pulses and a beam mask through which the radiation beam passes for defining a respective intensity pattern of each one of the radiation beam pulses for irradiating at least a portion of the metal layer. The respective intensity pattern of each one of the radiation beam pulses has at least one shadow region and at least one beamlet, wherein during irradiation by a radiation beam pulse, each region of the metal layer overlapped by a respective one of the at least one beamlet is melted throughout its entire thickness, and each region of the metal layer overlapped by a respective one of the at least one shadow region remains at least partially unmelted. Also included in the apparatus is a sample translation stage for holding the substrate having the metal layer while at least a portion of the metal layer is being irradiated by a radiation beam pulse, and for translating the substrate having the metal layer in a lateral direction with respect to the pulsed radiation beam. The sample translation stage may be used to microtranslate the metal layer on the substrate in a lateral direction with respect to the radiation beam pulses so as to shift the intensity pattern of the radiation beam pulses with respect to the metal layer from one pulse to another.

According to an exemplary embodiment of the apparatus of the present invention, the pulsed radiation beam source is a pulsed excimer laser, and the apparatus includes a first optical path traversed by the radiation beam pulses from the excimer laser to the beam mask, which may be a projection mask, a proximity mask or a contact mask. According to another exemplary embodiment of the present invention, the beam mask is a projection mask mounted in a mask translation stage so that the mask may be translated with respect to the laser beam pulses passing therethrough. In accordance with the further exemplary embodiment of the apparatus of the present invention, the beam mask is a projection mask, and the first optical path includes a controllable beam energy density modulator, a variable attenuator, beam expanding and collimating lenses, a beam homogenizer, a condenser lens, a field lens, and at least one beam steering mirror. According to yet another exemplary embodiment of the apparatus of the present invention, the apparatus includes a second optical path traversed by the radiation beam pulses from the beam mask to the metal layer on the substrate on the sample translation stage. The second optical path includes an eye piece, a controllable shutter, an objective lens and at least one beam steering mirror. In a still further exemplary embodiment of the apparatus in accordance with the present invention, the apparatus includes a computer for controlling at least the excimer laser, the variable attenuator and the sample translation stage.

BRIEF DESCRIPTION OF THE DRAWINGS

Exemplary embodiments of the present invention will now be described in detail with reference to the accompanying drawings in which:

FIGS. 6A-6F illustrate the radiation beam pulse intensity pattern and the grain structure of a portion of a metal layer at different stages of LS processing according to a third exemplary embodiment of the method of the present invention in which the intensity pattern of the radiation beam pulses has an array of relatively small, dot-like shadow regions;

FIGS. 8A-8D illustrate the radiation beam pulse intensity pattern and the grain structure of a portion of a metal layer at various stages of LS processing according to a fifth exemplary embodiment of the method of the present invention, in which the intensity pattern of the radiation beam pulses has regularly spaced, relatively narrow, linear, stripe-like shadow regions, and regularly spaced, relatively wide, linear, stripe-like beamlets, each one of the beamlets being positioned in between and adjoining respective adjacent ones of the shadow regions;

DETAILED DESCRIPTION

Figure 1A:
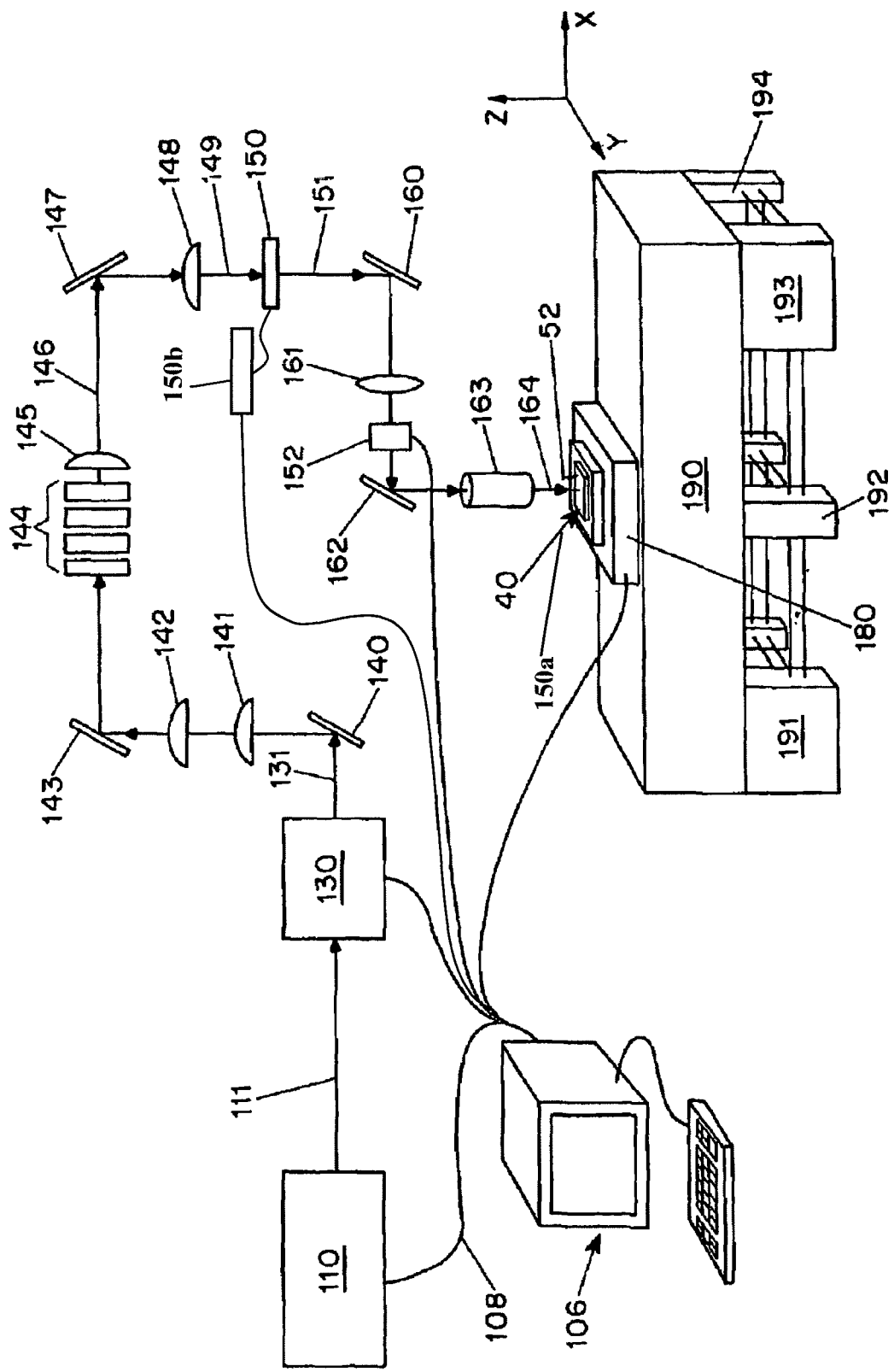
FIG. 1A is a schematic diagram of an exemplary embodiment of an apparatus for performing lateral solidification ("LS") processing of thin metal layers according to the present invention.

Referring to FIG. 1A, there is shown an exemplary embodiment of an apparatus for carrying out LS processing of thin metal layers according to the present invention. The exemplary apparatus includes a Lambda Physik model LPX-315I XeCl pulsed excimer laser 110, a MicroLas two-plate variable attenuator 130, beam steering mirrors 140, 143, 147, 160 and 162, beam expanding and collimating lenses 141 and 142, a MicroLas beam homogenizer 144, a condenser lens 145, a field lens 148, a projection mask 150 which may be mounted in a translating stage 150b, a 4×-6× eye piece 161, a Vincent Associates UniBlitz Model D122 controllable shutter 152, a multi-element objective lens 163 for focusing an incident radiation beam pulse 164 onto a sample 40 having a thin metal layer 52 to be LS processed mounted on a sample translation stage 180, a granite block optical bench 190 supported on a vibration isolation and self-leveling system 191, 192, 193 and 194, and a CyberResearch Inc. Industrial Computer System (with a Pentium processor 3 running Windows ME) computer 106 coupled to control the pulsed excimer laser 110, the beam energy density modulator 120, the variable attenuator 130, the shutter 152 and the sample translation stage 180. The sample translation stage 180 is controlled by the computer 106 to make translations and/or microtranslations of the sample 40 in the X, Y and Z directions. It will be understood by those skilled in the art that instead of a pulsed excimer laser, the pulsed radiation beam source 110 may be another known source of short energy pulses suitable for melting a thin metal layer in the manner described hereinbelow, such as a pulsed solid state laser, a chopped continuous wave laser, a pulsed electron beam or a pulsed ion beam, etc. with appropriate modifications to the radiation beam path from the source 110 to the sample 40. While the computer 106 in the exemplary apparatus embodiment of FIG. 1A controls microtranslations of the sample 40 for carrying out LS processing of a metal layer 52, the computer may also be adapted to control microtranslations of the mask 150 mounted in an appropriate mask translation stage 150b to shift the intensity pattern of the radiation beam pulses with respect to the metal layer 52. Mask 150 can also be a contact mask 150a, which can be located on the surface of sample 40. The exemplary apparatus of FIG. 1A may be used to carry out LS processing of a metal layer 52 on a sample 40 in the manner to be described.

Figure 1B:
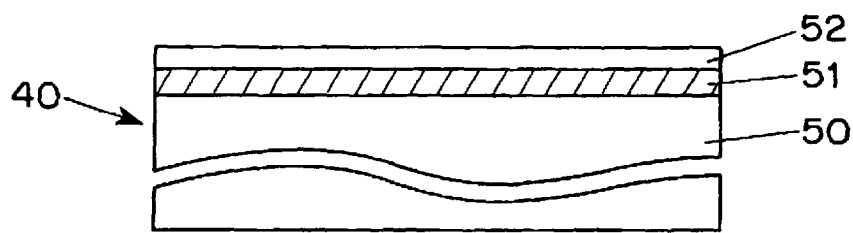
FIG. 1B is a cross sectional view of a portion of a first exemplary sample having a thin metal layer disposed on a substrate having a diffusion barrier layer.

Turning to FIG. 1B, there is shown a cross-sectional view of an exemplary sample 40. The sample 40 comprises a substrate 50 having a diffusion barrier layer 51 and a metal layer 52 overlying the diffusion barrier layer. The substrate 50 may be a semiconductor substrate having partially or wholly fabricated integrated circuit devices therein. The metal layer 52 may be a multiplicity of metal interconnect lines of one or more integrated circuit devices, or a continuous metal layer before being patterned into such interconnect lines or for use in other applications. The diffusion barrier layer 51 may be a layer of $SiO_2$, a layer of Tantalum (Ta), a layer of a composition which includes Ta or of any other suitable material which prevents diffusion of the material of metal layer 52 into the underlying substrate 50 and which permits the lateral growth of metal grains thereon. It is noted that the diffusion barrier or any substrate surface on which the metal layer 52 is disposed must not seed growth of grains in the metal layer 52.

The metal layer 52 is deposited on the diffusion barrier layer 51 of the substrate 50 using conventional techniques, for example, a CVD (Chemical Vapor Deposition) process, a PVD (Physical Vapor Deposition) process or an electrochemical deposition, all of which are known to those skilled in the art. The metal layer 52 may consist of any elemental metal, compound metal or alloy, such as aluminum, copper, tungsten, titanium, platinum or gold, suitable for forming interconnect lines in integrated circuit devices or suitable for use in other applications. In addition, the material of the diffusion barrier layer 51 is advantageously selected so that when the metal layer 52 is melted, the melted metal will "wet" the surface of the diffusion barrier layer 51 appropriately. Such "wetting" allows the metal layer 52 when melted to remain uniformly disposed on the diffusion barrier layer 51, and thereby prevents agglomeration of the molten metal layer 52. However, "wetting" of the diffusion barrier layer 51 by the metal layer 52 when melted is not a necessity since agglomeration may be avoided by using shorter radiation beam pulses (e.g., having a pulse duration of less than 30 nsec) to melt the metal layer 52.

Figure 2A:
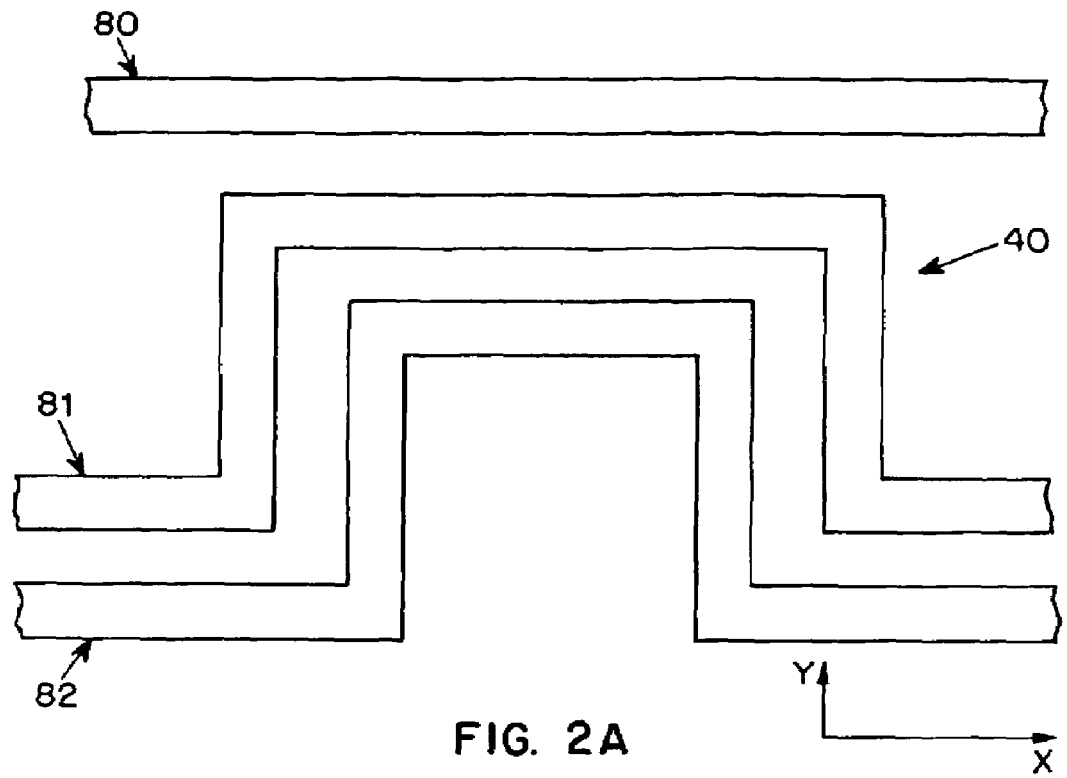
FIGS. 2A-2I illustrate the radiation beam pulse intensity pattern and the grain structure of relatively narrow metal layer strips at different stages of LS processing in accordance with a first exemplary embodiment of the method of the present invention.

A first exemplary embodiment of the method of the present invention is now described with reference to FIGS. 2A-2I. As shown in FIG. 2A, an exemplary region of a sample 40, such as a partially fabricated integrated circuit device, has three thin metal layer strips 80, 81, 82 collectively comprising the metal layer 52. These metal layer strips 80, 81, 82, which are formed of copper, for example, by conventional metal deposition, and conventional patterning by photolithography and etching, have small grains and grain boundaries randomly oriented in various directions therein. The widths of the metal layer strips 80, 81, 82 are typically in the range of 0.1 µm to 10 µm, and the thickness of the melted layer strips is typically in the range of less than 0.1 µm to 1 µm. It should be understood that the metal layer 52 being processed may include the metal interconnect lines of an entire partially fabricated integrated circuit device or of multiple partially fabricated integrated circuits on a semiconductor wafer as the sample 40. In practice, the number of metal interconnect lines in a given metal level of an entire modern VLSI integrated circuit device can be on the order of tens of thousands or greater. In addition, these interconnect lines can extend for lengths that are much longer than the lengths of the exemplary metal layer strips shown in FIGS. 2A-2I.

As discussed above, having small grains and randomly oriented grain boundaries is undesirable from the standpoint of electromigration, and may lead to an undesirably high rate of failure in one or more of these metal layer strips 80, 81, 82 when used as interconnect lines for carrying high current densities. The interconnect lines of an integrated circuit device generally have a "Manhattan geometry", i.e., each interconnect line is either straight or changes direction only at a 90° angle with respect to an adjoining segment of the interconnect line. It is noted that the LS process of the present invention is equally applicable for processing metal layer strips that change directions at angles other than 90° with respect to adjoining segments of the metal layer strips, or where the metal layer strips have curved contours.

Figure 2B:
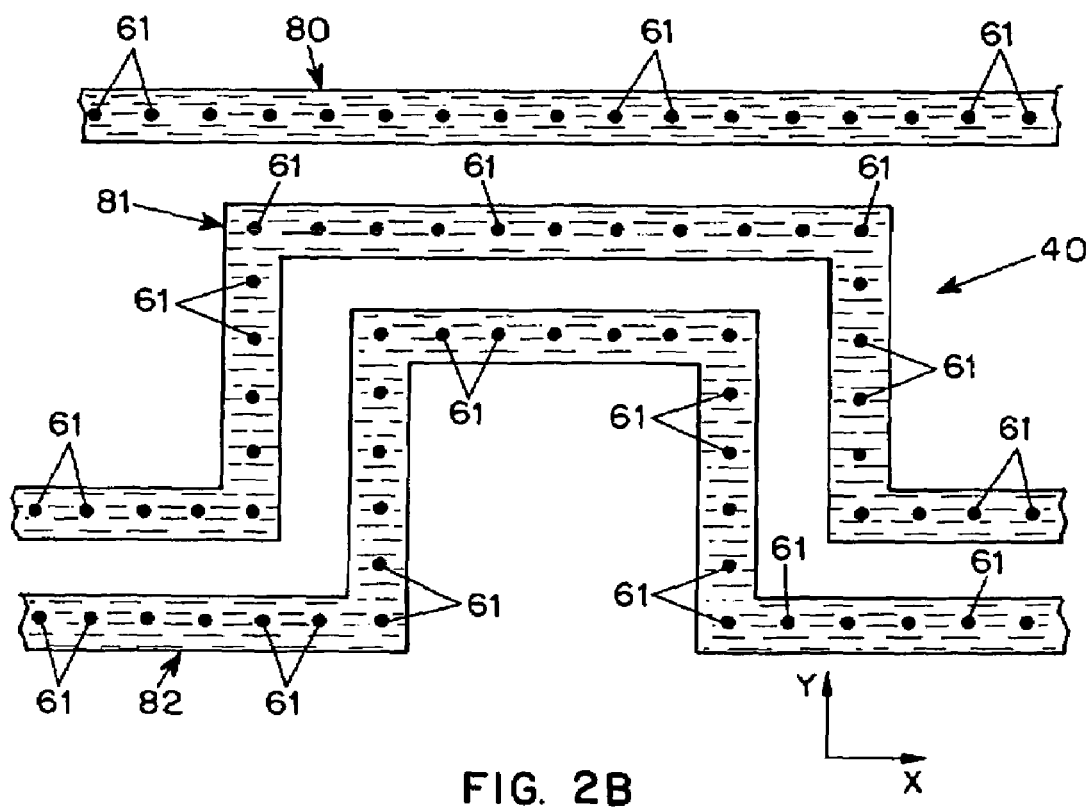

Referring to FIG. 2B there is shown the metal layer strips 80, 81, 82 after being irradiated with a first radiation beam pulse having a desired intensity pattern. In the present exemplary embodiment, the radiation beam pulse is a XeCl excimer laser beam pulse having a wavelength of 308 nm. Referring to FIG. 1A, the radiation beam pulse is generated by an excimer laser 110, and a mask 150 is used to define the desired intensity pattern of the radiation beam pulse. As shown in FIG. 2B, the intensity pattern of the first radiation beam pulse, as defined by the mask 150, includes respective series of multiple, regularly spaced, dot-like "shadow regions" 61, in which the beam intensity is totally blocked by the mask 150 so as to prevent irradiation of regions overlapped by respective ones of the shadow regions 61 in each of metal layer strips 80, 81, 82. For the first radiation beam pulse the dot-like shadow regions 61 of each series overlap a respective one of the metal layer strips 80, 81, 82 at regular intervals along the centerline thereof. The intensity pattern of the first radiation beam pulse also includes a "beamlet" having full radiation beam intensity and overlapping all regions of the metal layer strips 80, 81, 82 not overlapped by a respective one of the shadow regions 61.

When the metal layer strips 80, 81, 82 are irradiated by the first radiation beam pulse having the intensity pattern defined by the mask 150, each region of the metal layer strips 80, 81, 82 overlapped by the beamlet is melted throughout its entire thickness, while each region of the metal layer strips 80, 81, 82 overlapped by a respective one of the shadow region 61 remains at least partially unmelted and therefore has the original grain structure of the metal layer strips 80, 81, 82 as they were formed. The shadow regions 61, which may have any shape, such as a circle, a square, etc., have a small area, but are large enough so that thermal diffusion from the surrounding melted metal layer does not result in complete melting of the regions overlapped by respective ones of the shadow regions 61. In accordance with the invention, the regions overlapped by respective ones of the shadow regions must remain at least partially unmelted. Typically, the radiation beam pulses from the excimer laser 110 provide a beamlet intensity in the range of 10 to $10^4$ $mJ/cm^2$, a pulse duration (FWHM) in the range of 10 to $10^3$ nsec, and a pulse repetition rate in the range of 10 Hz to $10^4$ Hz. Subject to the energy limitations of the radiation beam pulses provided by the pulsed excimer laser 110 in the apparatus of FIG. 1A, the intensity pattern of the radiation beam pulses defined by the mask 150 may irradiate all of the metal interconnect lines of an entire partially fabricated integrated circuit device, all of the metal interconnect lines of multiple partially fabricated integrated circuit devices or all of the metal interconnect lines of all partially fabricated integrated circuit devices on an entire wafer.

Figure 2C:
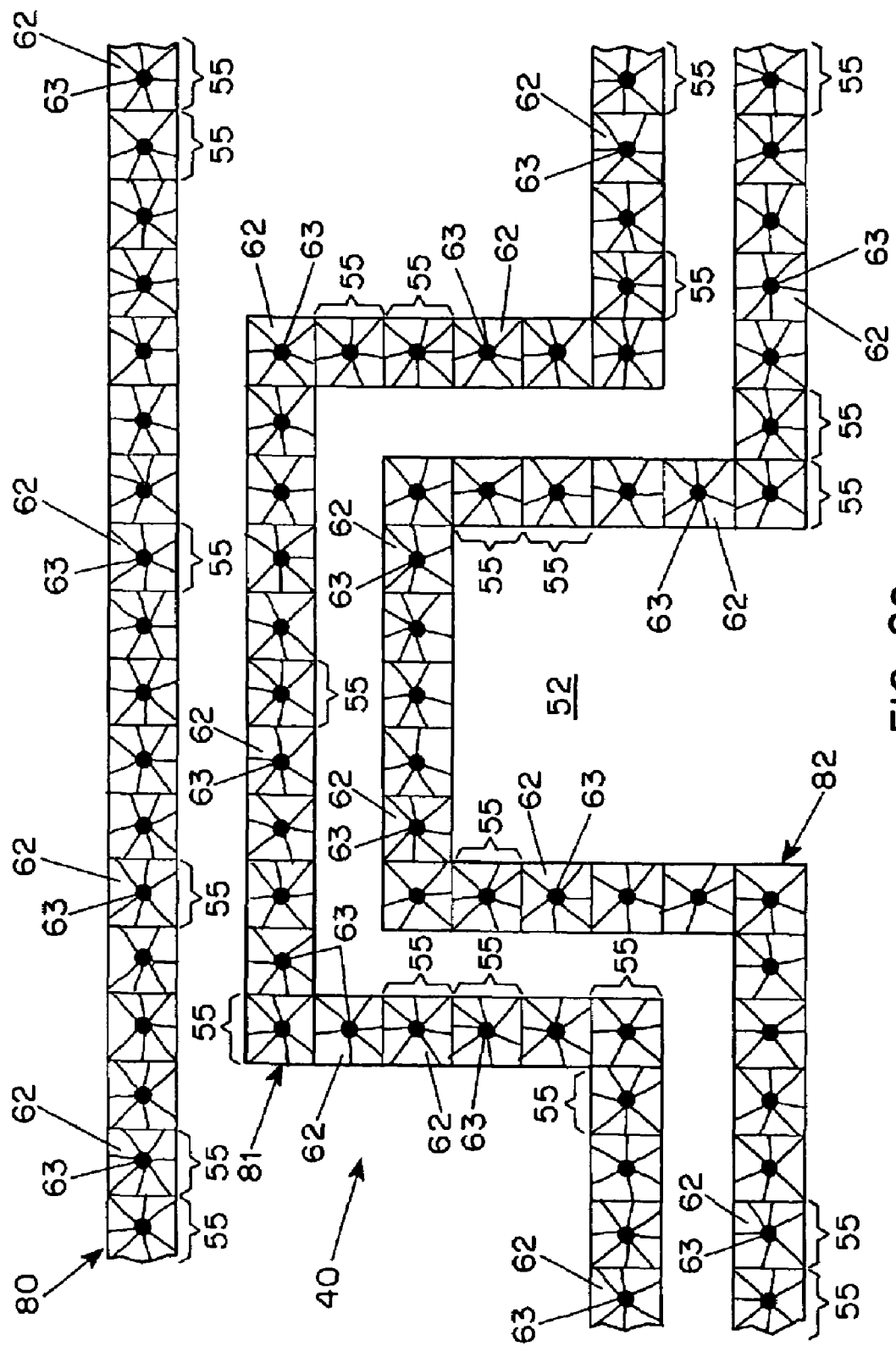

Turning to FIG. 2C, after the metal layer strips 80, 81, 82 are irradiated by the first radiation beam pulse, the melted regions of the metal layer strips 80, 81, 82 are permitted to cool and resolidify. Since the at least partially unmelted regions 63 have the original grain structure of the metal layer strips 80, 81, 82, such grain structure in each at least partially unmelted region 63 seeds lateral growth of grains into adjoining resolidifying melted regions of metal layer strips 80, 81, 82. During such resolidification of each melted region, grains grow outward from each one of the at least partially unmelted regions 63 in a respective resolidification region 55 immediately surrounding the at least partially unmelted region 63 in each one of the metal layer strips 80, 81, 82. Each resolidification region 55 is bounded by the edges of a respective one of the metal layer strips 80, 81, 82 and by the abutment of grains growing from the at least partially unmelted region 63 within the resolidification region 55 with grains growing from adjacent at least partially unmelted regions 63. The abutting grain growth distance of grains growing from each one of the at least partially unmelted regions 63 before abutting grains growing from adjacent at least partially unmelted regions is approximately half the width of the melted regions as defined by the width of the beamlets. In this manner, larger grains 62 are formed in each of the resolidification regions 55 after resolidification of the melted regions of the metal layer strips 80, 81, 82 is completed. The spacing between adjacent shadow regions 61 should be such that grains growing from each at least partially unmelted region 63 overlapped by a respective one of the shadow region 61 abuts grains growing from its two adjacent at least partially unmelted regions 63 before resolidification of the melted regions of the metal layer strips 80, 81, 82 is completed (i.e., before nucleation of new grains occurs in the intervening spaces). The characteristic growth distance of the grains is the distance that the grains grow before nucleation of new grains occurs.

Where the widths of the interconnect line segments 80, 81, 82 are so large that growth of grains from the at least partially unmelted regions 63 do not reach the edges of the metal layer strips and/or do not abut grains growing from adjacent at least partially unmelted regions before the melted regions therein completely resolidifies, the mask 150 must define an intensity pattern having an appropriate array of shadow regions spaced sufficiently close to respective edges of the metal layer strips 80, 81, 82 and sufficiently close to each other so that grains growing from each at least partially unmelted region overlapped by a respective one of the shadow regions either reaches an edge of a respective one of the metal layer strips 80, 81, 82, or abuts grains growing from adjacent at least partially unmelted regions before resolidification of the melted regions is completed.

Figure 2D:
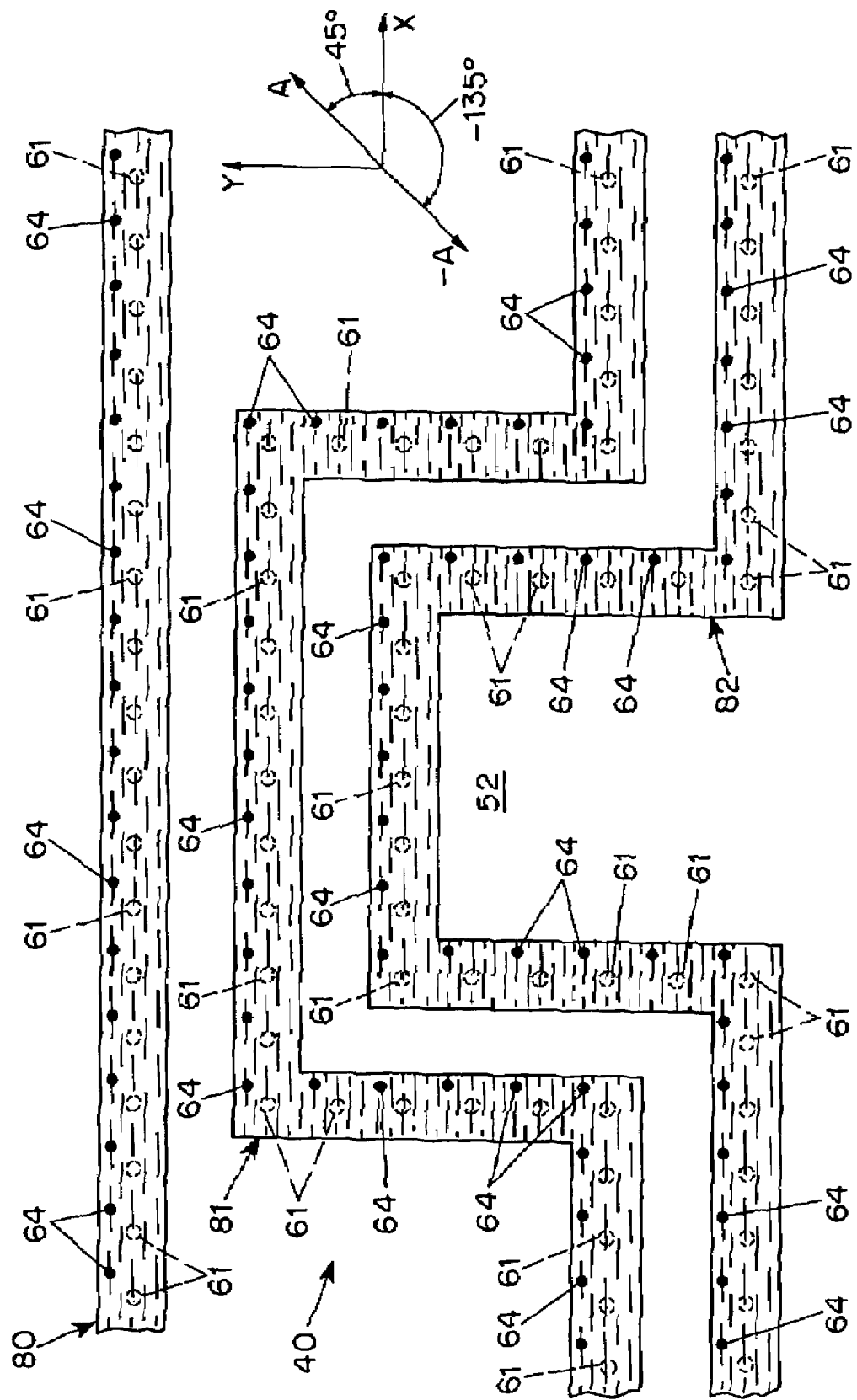

Turning now to FIG. 2D, because the position of impingement of the pulsed radiation beam 164 on the metal layer strips 80, 81, 82 is preferably fixed, the sample 40 is then repositioned by the sample translation stage 180 under the control of the computer 106 so that the shadow regions 64 of the intensity pattern of the second radiation beam pulse are each slightly shifted by a distance less than the largest abutting grain growth distance after the first radiation beam pulse with respect to the positions on the metal layer strip of the shadow regions 61 of the intensity pattern of the first radiation beam pulse. The abutting grain growth distance is the distance that a grain grows from an at least partially unmelted region in an adjoining melted region before abutting another grain growing in the same melted region and before abutting an edge of the melted layer. In this manner, each shadow region 64 overlaps a different region within the same resolidification region 55 formed after irradiation by the first radiation beam pulse. For example, the position of the new shadow regions 64 is shifted from the previous position of the shadow regions 61 by a distance in the range of 0.01 μm to 10 μm. Such minute repositioning shall be referred to hereinafter as a "microtranslation". Optionally, the mask 150 may be microtranslated instead of the sample 40 to obtain the desired shift of the shadow regions 64 of the intensity pattern of the second radiation beam pulse. Although the beamlet of the intensity pattern of the second radiation beam pulse is also shifted with respect to that of the intensity pattern of the first radiation beam pulse, the shifted beamlet still overlaps all regions of the metal layer strips 80, 81, 82 not overlapped by a respective one of the shifted shadow regions 64.

As shown in FIG. 2D, after the above-described microtranslation of the sample 40, the apparatus of FIG. 1A irradiates the metal layer strips 80, 81, 82 with a second radiation beam pulse, so that each region of the metal layer strips 80, 81, 82 overlapped by the shifted beamlet is melted throughout its entire thickness, and each region of the metal layer strips overlapped by a respective one of the shifted shadow regions 64 remains at least partially unmelted. Each one of the at least partially unmelted regions adjoins respective adjacent melted regions. The sample 40 may be microtranslated in any direction so long as each one of the shifted shadow regions 64 overlaps a region within the same resolidification region 55 as a region overlapped by a corresponding one of the shadow regions 61 of the intensity pattern of the first radiation pulse. For example, the sample 40 can be microtranslated in the −A direction which is at minus 135° with respect to the X axis, where rotation of angles in the counterclockwise direction are taken as positive, or the sample can be microtranslated in the +A direction which is at an angle of 45° with respect to the X axis.

Figure 2E:
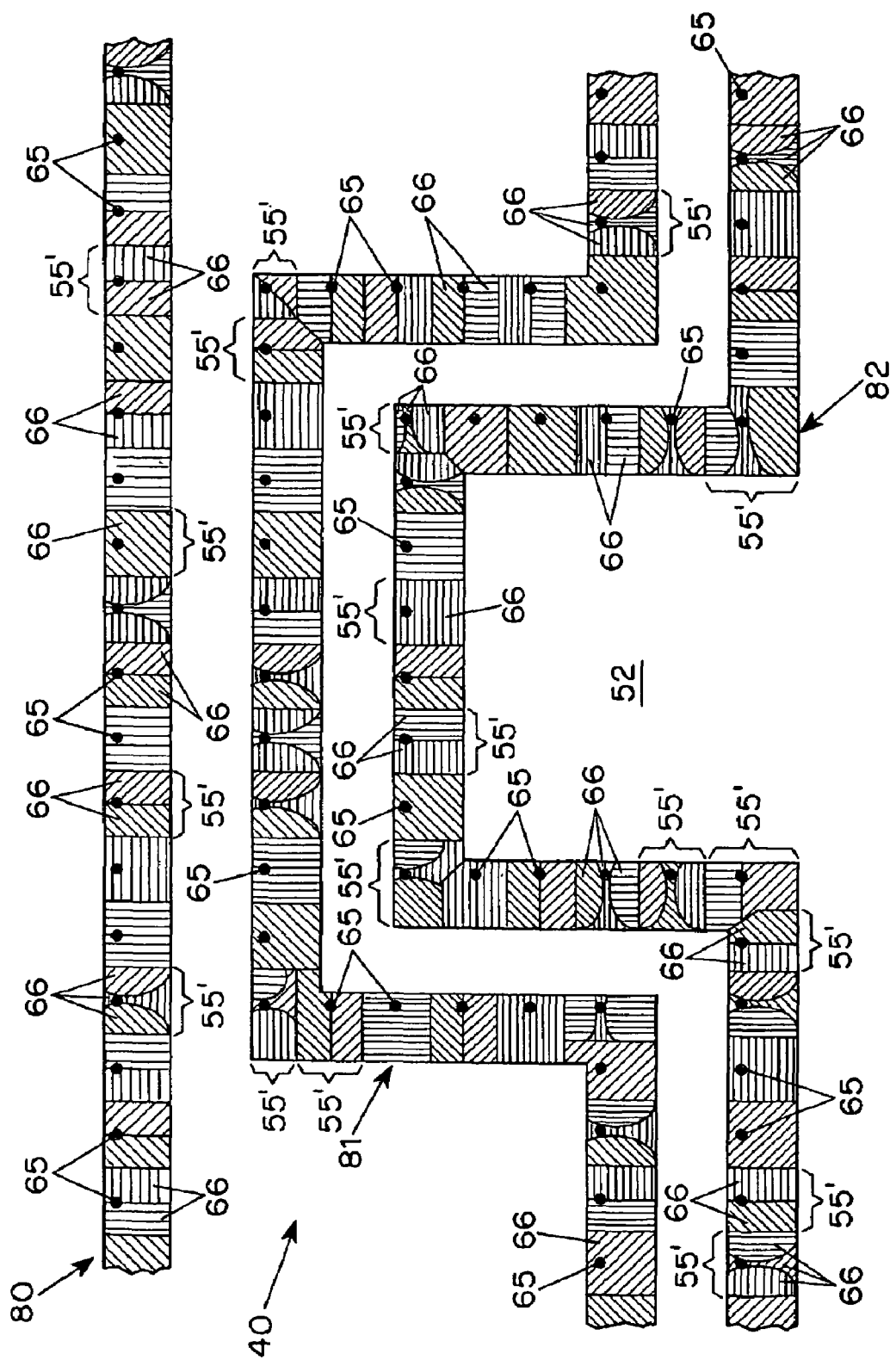

Referring to FIG. 2E, there are shown the metal layer strips 80, 81, 82 after completion of resolidification of the melted regions following irradiation by the second radiation beam pulse. Because each one of the at least partially unmelted regions 65 after the first microtranslation of the sample 40 and the irradiation by the second radiation beam pulse contains a smaller number of grains than was contained in each one of the at least partially unmelted regions 63 after irradiation by the first radiation beam pulse, there will be an equal to greater number of grains that will be grown in a corresponding one of new resolidification regions 55' upon resolidification of each melted region of the metal layer strips 80, 81, 82 after irradiation by the second radiation beam pulse. As illustrated in FIG. 2E, growth of the grains takes place laterally from each of the shifted at least partially unmelted regions 65 to either reach an edge of a respective one of the metal layer strips 80, 81, 82, or to abut grains growing from adjacent shifted at least partially unmelted regions 65 to define the new resolidification regions 55', the abutting grains having grown by respective abutting growth distances. Referring to FIG. 2E, each of the new resolidification regions 55' has fewer and larger grains 66 than the previous resolidification regions 55 illustrated in FIG. 2C.

Figure 2F:
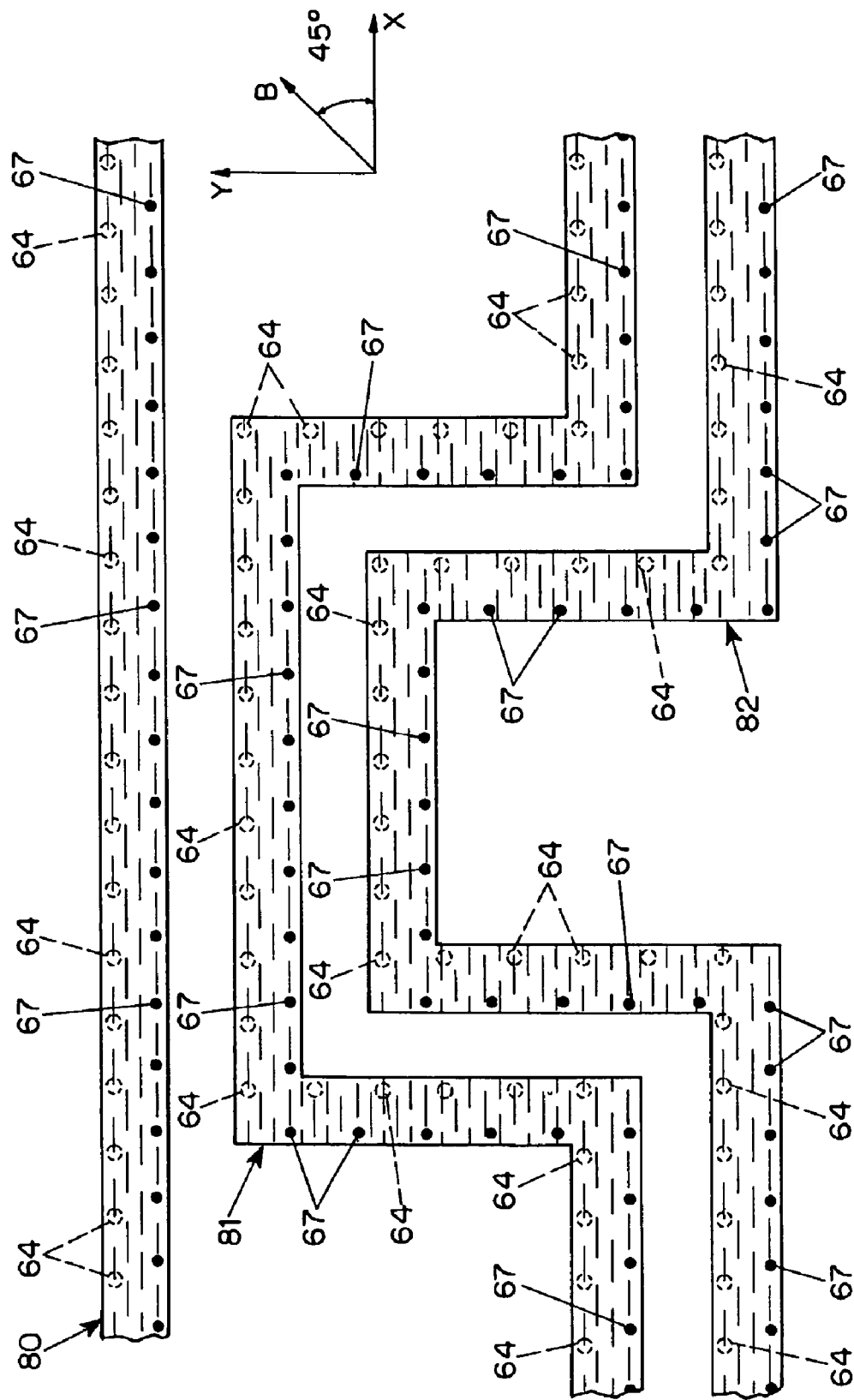

Referring to FIG. 2F, after resolidification of the melted regions following irradiation by the second radiation beam pulse is completed, the sample 40 may be further microtranslated with respect to the pulsed radiation beam 164 in any direction by a distance less than the largest abutting grain growth distance after the second radiation beam pulse so that the twice-shifted shadow regions 67 of the intensity pattern of a third radiation beam pulse each overlaps a different region within a respective one of the resolidification regions 55'. In the exemplary embodiment illustrated in FIG. 2F the direction of the further microtranslation B is at 45° with respect to the X axis. After the sample 40 is microtranslated in this direction, the metal layer strips 80, 81, 82 are irradiated by the third radiation beam pulse having the same intensity pattern defined by the mask 150, but where the shadow regions 67 have each been shifted twice. The twice-shifted shadow regions 67 are displaced from respective previous shadow regions 64 by a distance less than the largest abutting grain growth distance after the second radiation beam pulse, for example, in the range of 0.01 μm to 10 μm. Although the beamlet of the intensity pattern of the third radiation beam pulse is also shifted with respect to that of the intensity pattern of the second radiation beam pulse, the twice-shifted beamlet still overlaps all regions of the metal layer strips 80, 81, 82 not overlapped by a respective one of the twice-shifted shadow regions 67.

Figure 2G:
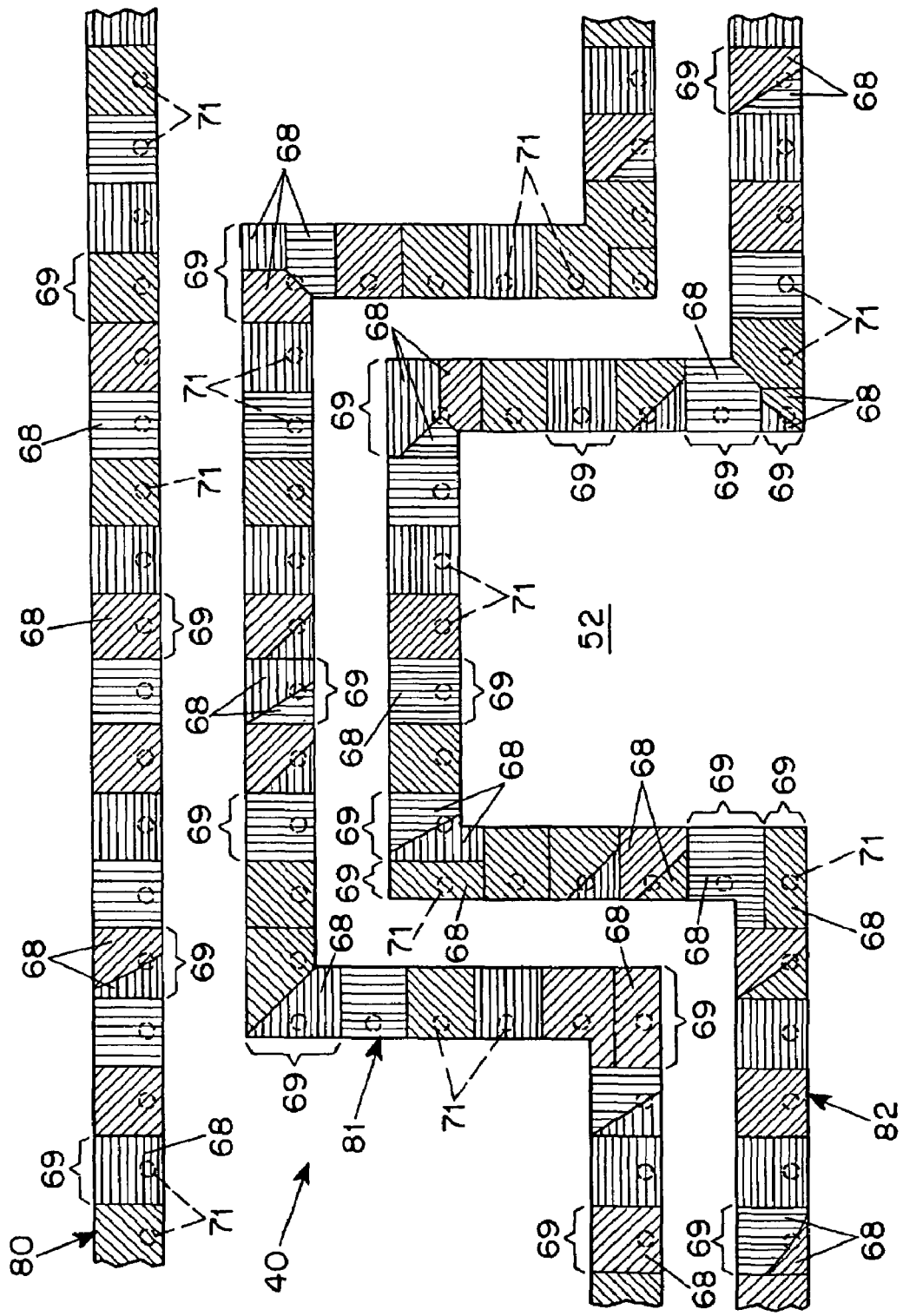

With reference to FIG. 2G, there are illustrated the resolidified metal layer strips 80, 81, 82 after irradiation by the third radiation beam pulse and completion of resolidification of the melted regions. Because the twice-shifted at least partially unmelted regions 71 each contain a smaller number of grains than was contained in the once-shifted at least partially unmelted regions 65, there will be an equal or smaller number of grains that will be grown in a corresponding one of new resolidification regions 69 upon completion of resolidification of each melted region of the metal layer strips 80, 81, 82 after irradiation by the third radiation beam pulse. As illustrated in FIG. 2G, the growth of grains takes place laterally from each of the twice shifted at least partially unmelted regions 71 to either reach an edge of a respective one of the metal layer strips 80, 81, 82 or to abut grains growing from adjacent twice shifted at least partially unmelted regions 71 to define the new resolidification regions 69, the abutting grains having grown by respective abutting grain growth distances. Referring to FIG. 2G, each one of the new resolidification regions 69 has fewer and larger grains 68 than the previous resolidification regions 55' illustrated in FIG. 2E.

Figure 2H:
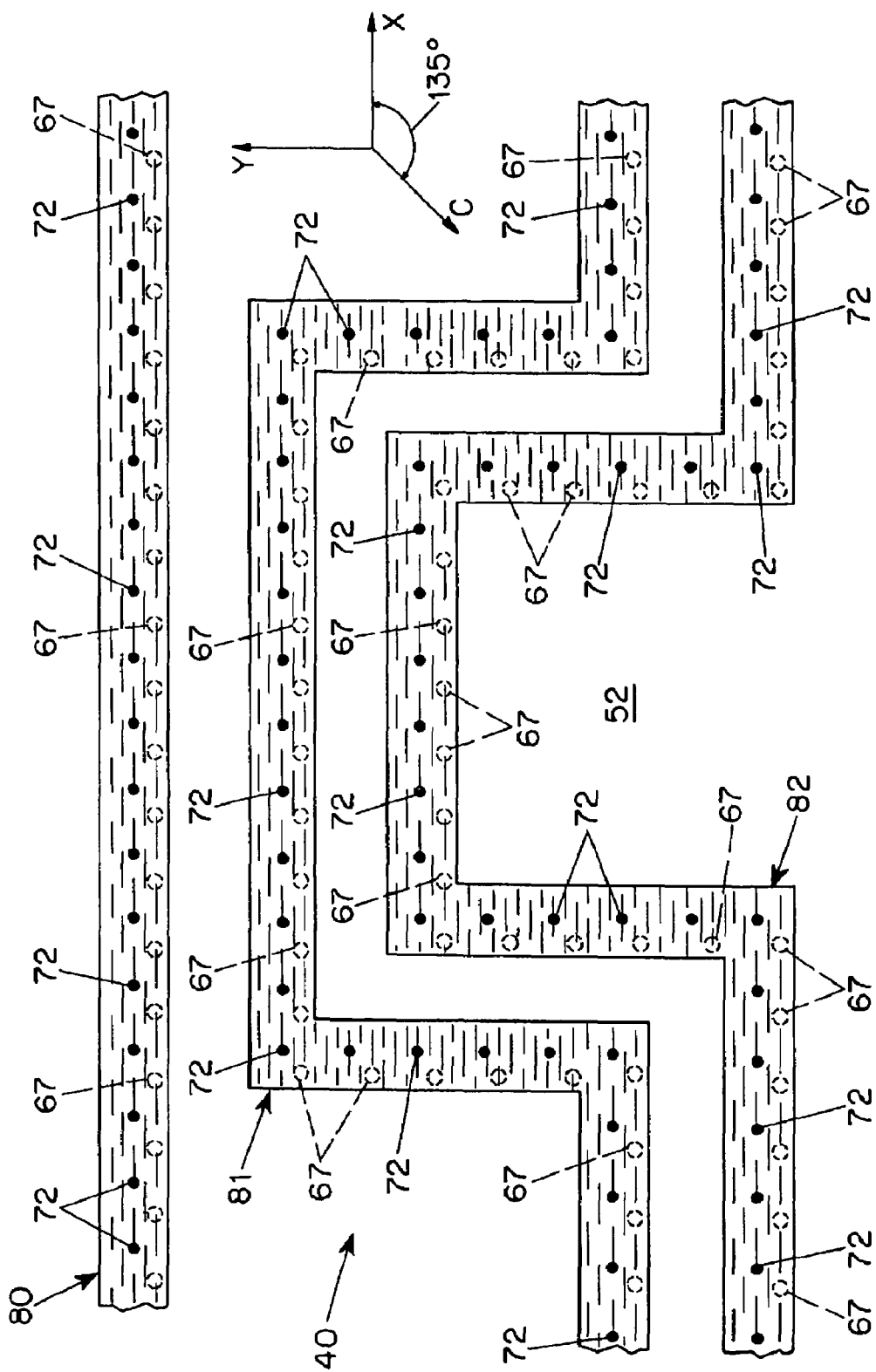

Turning now to FIG. 2H, after resolidification of each melted region following irradiation by the third radiation beam pulse region is completed, the sample 40 may be further microtranslated with respect to the pulsed radiation beam 164 in any direction by a distance less than the largest abutting grain growth distance after the third radiation beam pulse so that the thrice-shifted shadow regions 63 of the intensity pattern of a fourth radiation beam pulse each overlap a different region within a respective one of the resolidification regions 69. In the exemplary embodiment illustrated in FIG. 6H, the direction of further microtranslation C is at −135° with respect to the X axis, and the distance of the further microtranslation is in the range of 0.01 μm to 10 μm. After the sample 40 is microtranslated in this direction by this distance, the metal layer strips 80, 81, 82 are irradiated by the fourth radiation beam pulse having the same intensity pattern as that of the third radiation beam pulses illustrated in FIG. 2F, but where the shadow regions 72 and the beamlet have each been shifted three times with respect to the metal layer strips 80, 81, 82.

Figure 2I:
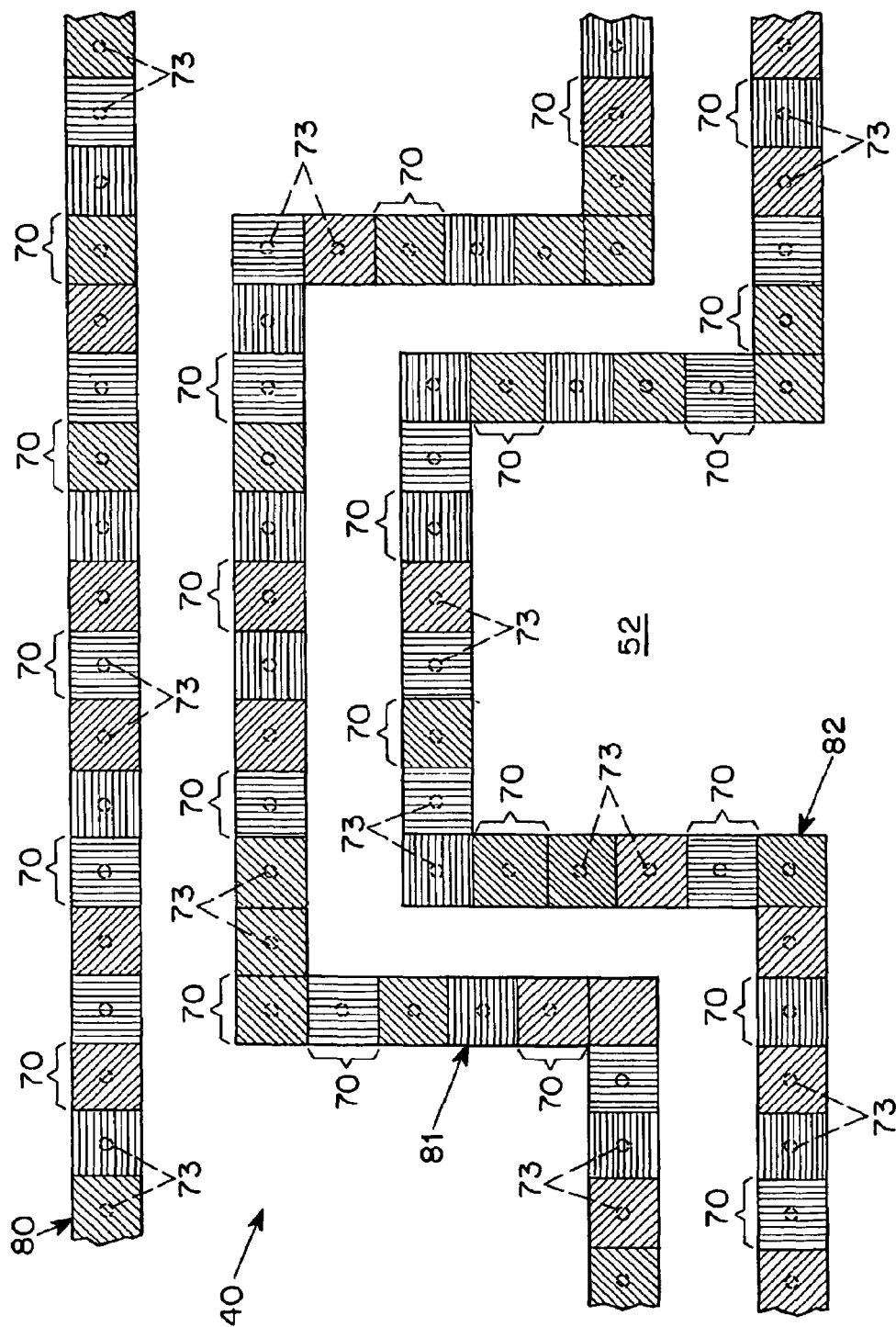

With reference to FIG. 2I, there is shown the resolidified metal layer strips 80, 81, 82 after irradiation by the fourth radiation beam pulse and completion of resolidification of each melted region. Because the at least partially unmelted regions 73 overlapped by respective ones of the thrice-shifted shadow regions 63 (i.e., the thrice-shifted at least partially unmelted regions) each contain a single grain, there will be an equal or greater number of grains that will be grown in a corresponding one of the new resolidification regions 70 upon completion of resolidification of the melted regions of the metal layer strips 80, 81, 82. As illustrated in FIG. 2I, the growth of grains takes place laterally from each one of the thrice-shifted at least partially unmelted regions 73 to either reach an edge of a respective one of the metal layer strips 80, 81, 82 or to abut the grains growing from adjacent thrice-shifted at least partially unmelted regions 73 to define the new resolidification regions 70. As shown in FIG. 2I, each one of the new resolidification regions 70 of the metal layer strips 80, 81, 82 is a single grain, and each grain boundary is substantially perpendicular to a respective one of the metal layer strips 80, 81, 82 at the location of the grain boundary. Accordingly, if the metal layer strips 80, 81, 82 are interconnect line portions of an integrated circuit device, electromigration in these interconnect line portions is substantially reduced. It is noted that the metal layer strips 80, 81, 82 may be subjected to more or fewer microtranslation, irradiation and resolidification steps, as described with reference to FIGS. 2A-2I, so as to obtain the desired grain structure illustrated in FIG. 2I in each one of the metal layer strips.

After completion of the above-described LS processing to obtain a desired grain structure in each one of the metal layer strips 80, 81, 82, the sample 40 may be translated to a next section for LS processing therein. A new mask 150 (shown in FIG. 1A) will be required for LS processing if the next section has a different configuration of metal layer strips since the series of shadow regions of the intensity pattern of the radiation beam pulses, as defined by the mask 150, must conform to the contours of the respective metal layer strips.

Figure 3A:
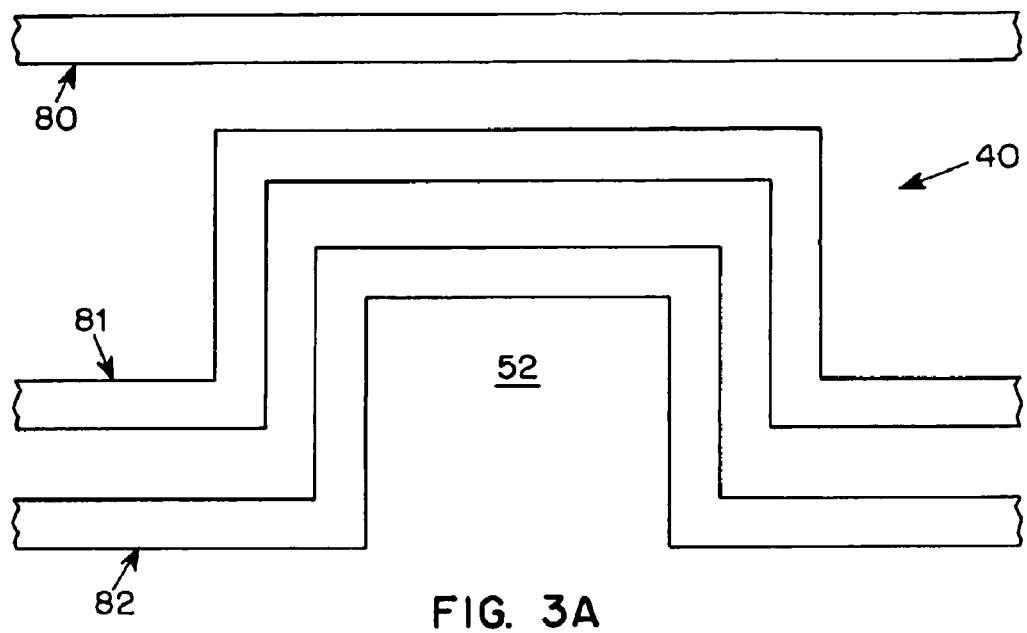
FIGS. 3A-3E illustrate the radiation beam pulse intensity pattern and the grain structure of relatively narrow metal layer strips at different stages of LS processing according to a second exemplary embodiment of the method of the present invention.

A second exemplary embodiment of the method of the present invention is now described with reference to FIGS. 3A-3E. For purposes of illustration, the same configuration of metal layer strips 80, 81, 82 used to describe the first exemplary embodiment, as illustrated in FIGS. 2A-2I, is used to describe the present embodiment. As in the first exemplary embodiment, the metal layer strips 80, 81, 82, which are shown in FIG. 3A, are formed of copper, for example, and initially have small grains and grain boundaries that are oriented in random directions. Each one of the metal layer strips has a width typically in the range of 0.1 μm to 10 μm and a thickness typically in the range of less than 0.1 μm to 10 μm.

Figure 3B:
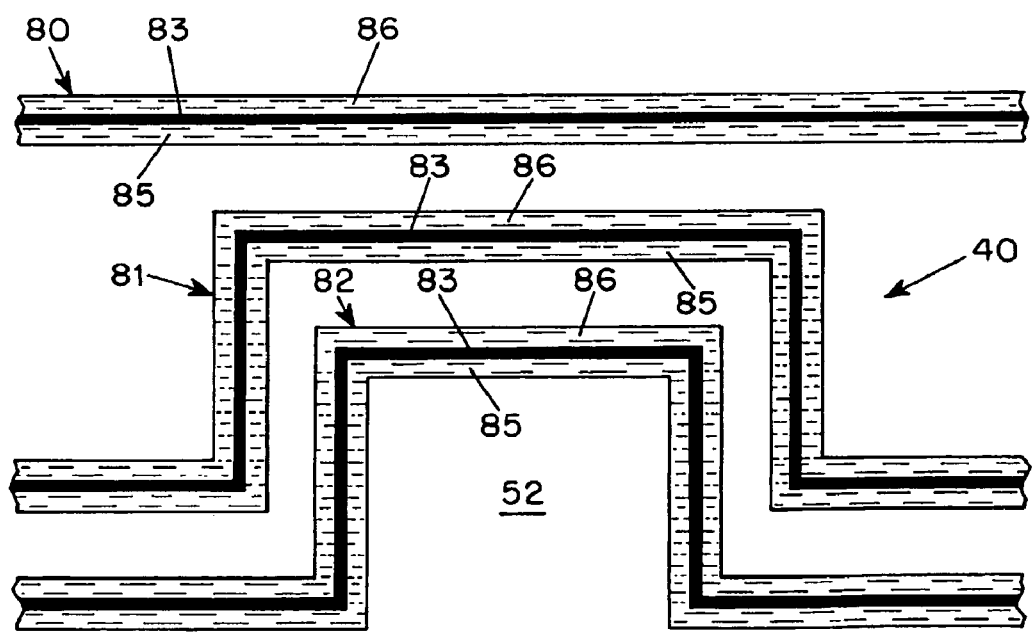

Referring to FIG. 3B, the metal layer strips 80, 81, 82 are irradiated by a first radiation beam pulse having an intensity pattern, as defined by the mask 150 (shown in FIG. 1A), that includes three relatively narrow stripe-like shadow regions 83 each having the same predefined contour of a respective one of the metal layer strips 80, 81, 82. In addition to the shadow regions 83, the intensity pattern of the first radiation beam pulses, as defined by the mask 150, also includes a beamlet that overlaps all regions of the metal layer strips 80, 81, 82 not overlapped by the shadow regions 72. Advantageously, the width of the shadow regions 83 is in the range of 0.01 μm to 5 μm. Initially, the sample 40 is positioned so that the shadow regions 72 of the intensity pattern of the first radiation beam pulses overlap respective ones of the metal layer strips 80, 81, 82 along the center line of each one of the metal layer strips. Upon being irradiated by the first radiation beam pulse, each region of the metal layer strips 80, 81, 82 overlapped by the beamlet is melted throughout its entire thickness, while each region of the metal layer strips overlapped by a respective one of the shadow region 72 remains at least partially unmelted. The shadow regions 83 of the intensity pattern of the radiation beam pulses are sufficiently wide so that thermal diffusion from the melted regions 85 and 86 in each one of the metal layer strips 80, 81, 82 do not significantly melt the regions of the metal layer strips 80, 81, 82 overlapped by respective ones of the shadow regions 83. After irradiation by the first radiation beam pulse, the at least partially unmelted regions 84 in each one of the metal layer strips 80, 81, 82 will have the original grain structure of the metal layer strips before LS processing.

Figure 3C:
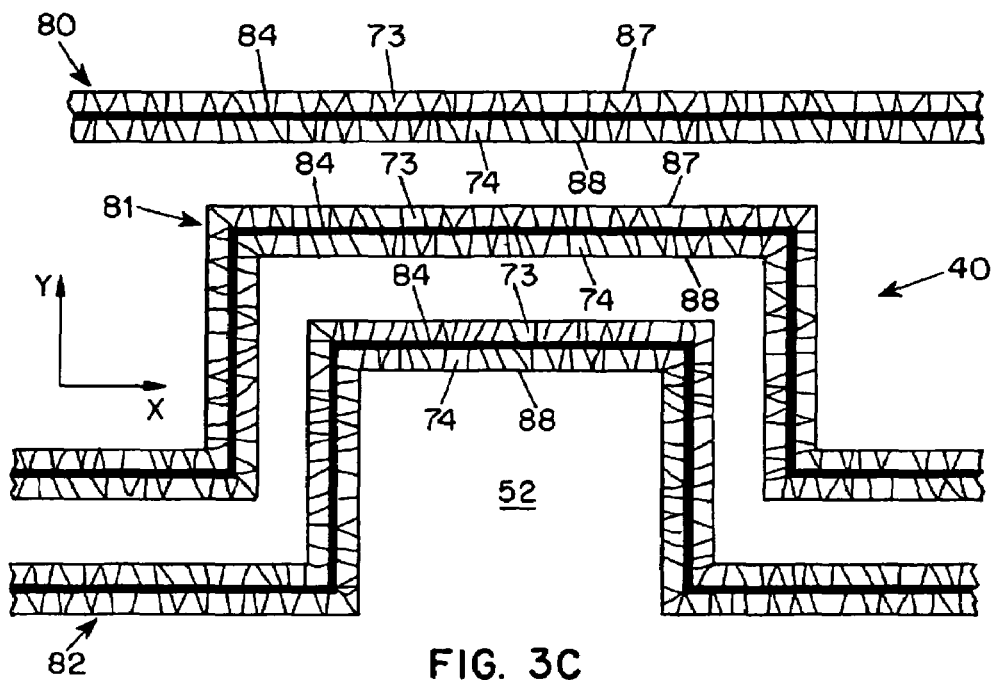

Turning now to FIG. 3C, upon cooling and resolidification of the melted regions 85 and 86 in each one of the metal layer strips 80, 81, 82 after irradiation by the first radiation beam pulse, lateral growth of grains will occur outwardly from each one of the at least partially unmelted regions 84 in the metal layer strips 80, 81, 82 to the edges of the respective metal layer strips. In this manner, resolidification regions 87, 88 are formed in each one of the metal layer strips 80, 81, 82 with each one of the resolidification regions 87, 88 having a respective row 73, 74 of larger metal grains with grain boundaries oriented at larger angles with respect to the metal layer strip.

Figure 3D:
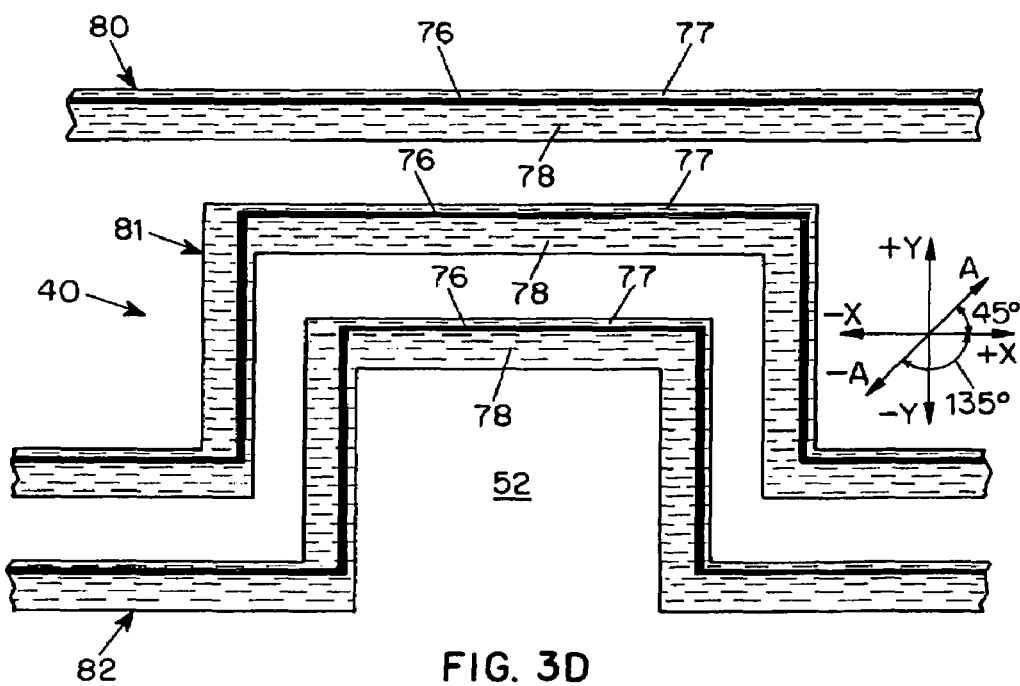
Figure 3E:
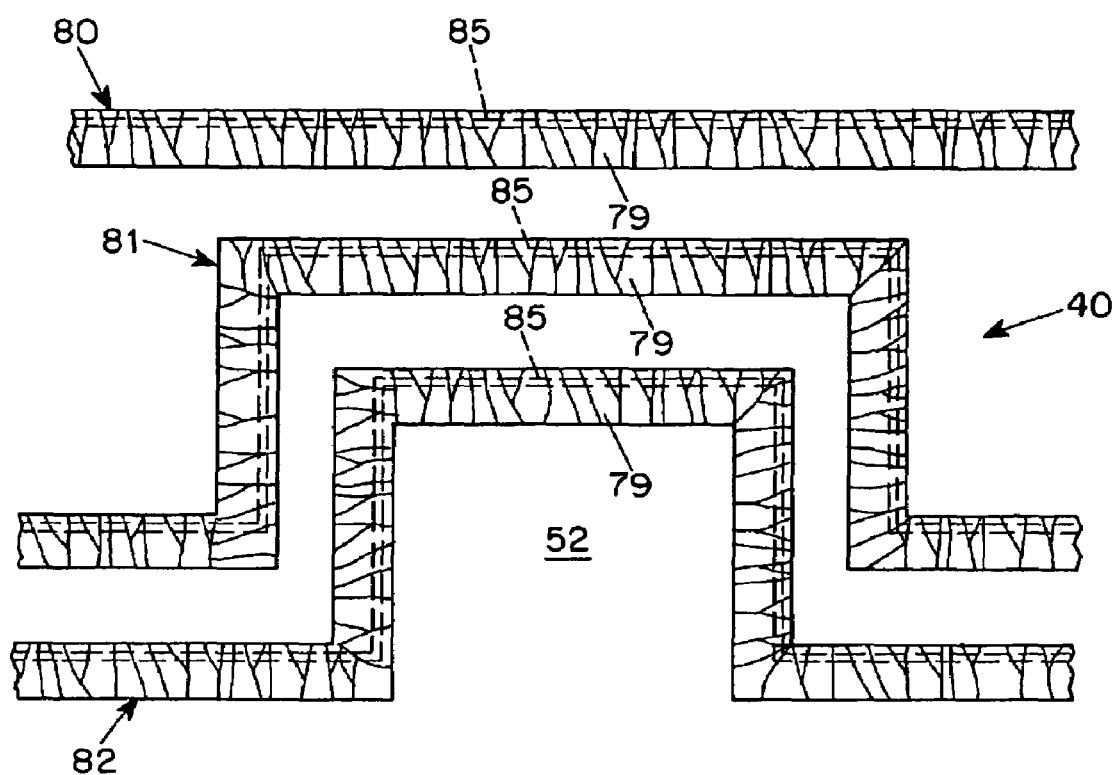

Turning now to FIG. 3D, after completion of resolidification of the melted regions 85 and 86 in each one of the metal layer strips 80, 81, 82 following irradiation by the first radiation beam pulse, the sample 40 is microtranslated in the A direction at −135° with respect to the X-axis, or the mask 150 (shown in FIG. 1A) may be microstranslated in the A direction at 45° with respect to the X-axis, to cause the shadow regions 76 of the intensity pattern of a second radiation beam pulse to be shifted so as to overlap respective ones of the upper rows of grains 73 in each of the metal layer strips 80, 81, 82. It will be understood by those skilled in the art that either the sample 40 or the mask 150, or both may be microtranslated so as to cause the shadow regions 76 of the second radiation beam pulse to overlap respective ones of the lower rows of grains 74 in each of the metal layer strips 80, 81, 82. Although the beamlet of the intensity pattern of the second radiation beam pulse is also shifted with respect to that of the intensity pattern of the first radiation beam pulse, the shifted beamlet still overlaps all regions of the metal layer strips 80, 81, 82 not overlapped by a respective one of the shifted shadow regions 76. Except for the shifting of the shadow regions 76 and the beamlet, the intensity pattern of the second radiation beam pulse is the same as that of the first radiation beam pulse.

After the microtranslation of the sample 40 or the mask 150, the metal layer strips 80, 81, 82 are irradiated by the second radiation beam pulse, so that each region of the metal layer strips 80, 81, 82 overlapped by the shifted beamlet is melted throughout its entire thickness, while each region of the metal layer strips overlapped by a respective one of the shifted shadow regions 76 remains at least partially unmelted. Each at least partially unmelted region adjoins adjacent melted regions. Because the at least partially unmelted regions will contain larger grains with grain boundaries forming larger angles with respect to the metal layer strips 80, 81, 82 than the grains and grain boundaries of the original metal layer strips, upon resolidification of the melted regions 77 and 78 in each of the metal layer strips 80, 81, 82, these larger grains will seed growth of grains laterally in each direction from the at least partially unmelted regions 85 towards respective edges of the metal layer strips 80, 81, 82 so that each one of the metal layer strips will have larger grains with grain boundaries that are oriented at large angles (i.e., close to 90°) with respect to the metal layer strips at respective locations of the grain boundaries, as illustratively represented in FIG. 3E.

After resolidification of the melted regions 77, 78 following irradiation by the second radiation beam pulse is completed, additional iterations of microtranslation of the either the sample 40 or the mask 150 in an appropriate direction, irradiation by a further radiation beam pulse, and resolidification of each melted region of the metal layer strips may be carried out to further reduce the number of grains in each one of the metal layer strips 80, 81, 82 and to have the grain boundaries oriented more consistently at large angles with respect to the metal layer strip at respective locations of the grain boundaries. In the foregoing exemplary embodiment, each one of the radiation beam pulses typically has a beamlet intensity in the range of 10 mJ/cm$^2$ to 10$^4$ mJ/cm$^2$, a pulse duration (FWHM) in the range of 10 nsec to 10$^3$ nsec, and a pulse repetition rate in the range of 10 Hz to 10$^4$ Hz.

After completion of the LS processing of the metal layer strips 80, 81, 82, as described above with reference to FIGS. 3A-3E, the sample 40 may be translated to a next section of the metal layer for LS processing therein. If the next section has metal layer strips with a different configuration then that shown in FIGS. 3A-3E, a different mask 150 defining shadow regions that conform to the respective predefined contours of the metal layer strip or strips of the next section must be used. The required mask for LS processing in accordance with the first and second exemplary embodiments described above are advantageously derived from the mask used to pattern a metal layer to form the metal layer strips, such as by conventional photolithography and etching.

Figure 4A:
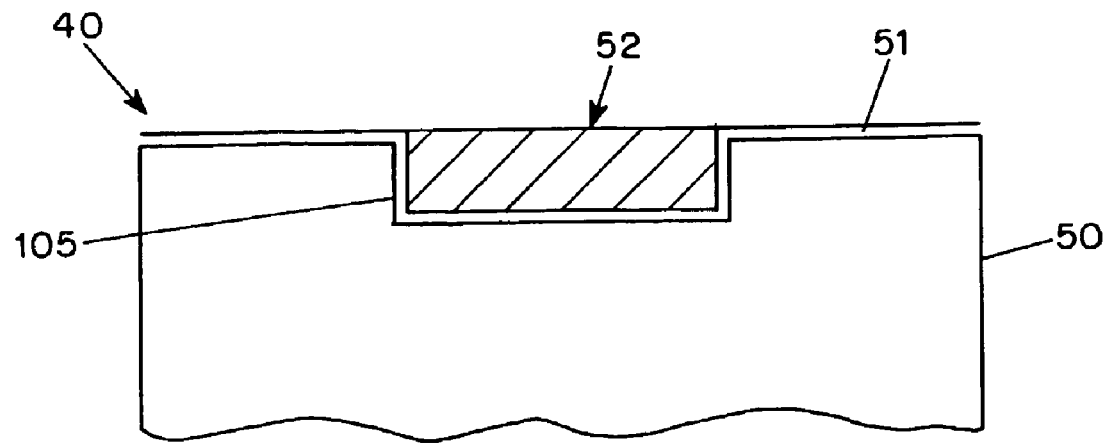
FIG. 4A is a cross sectional view of a second exemplary sample having a thin metal layer disposed in a groove of a substrate having a diffusion barrier layer.
Figure 4B:
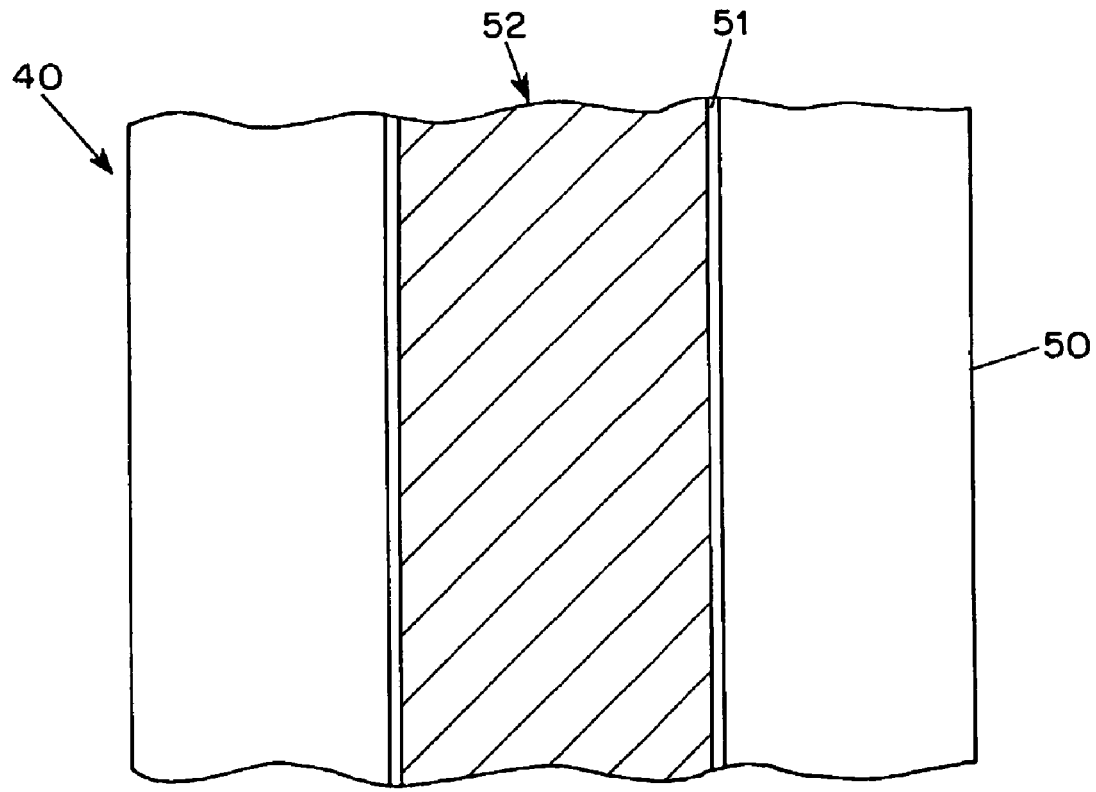
FIG. 4B is a plan view of the second exemplary sample of FIG. 4A.
Figure 4C:
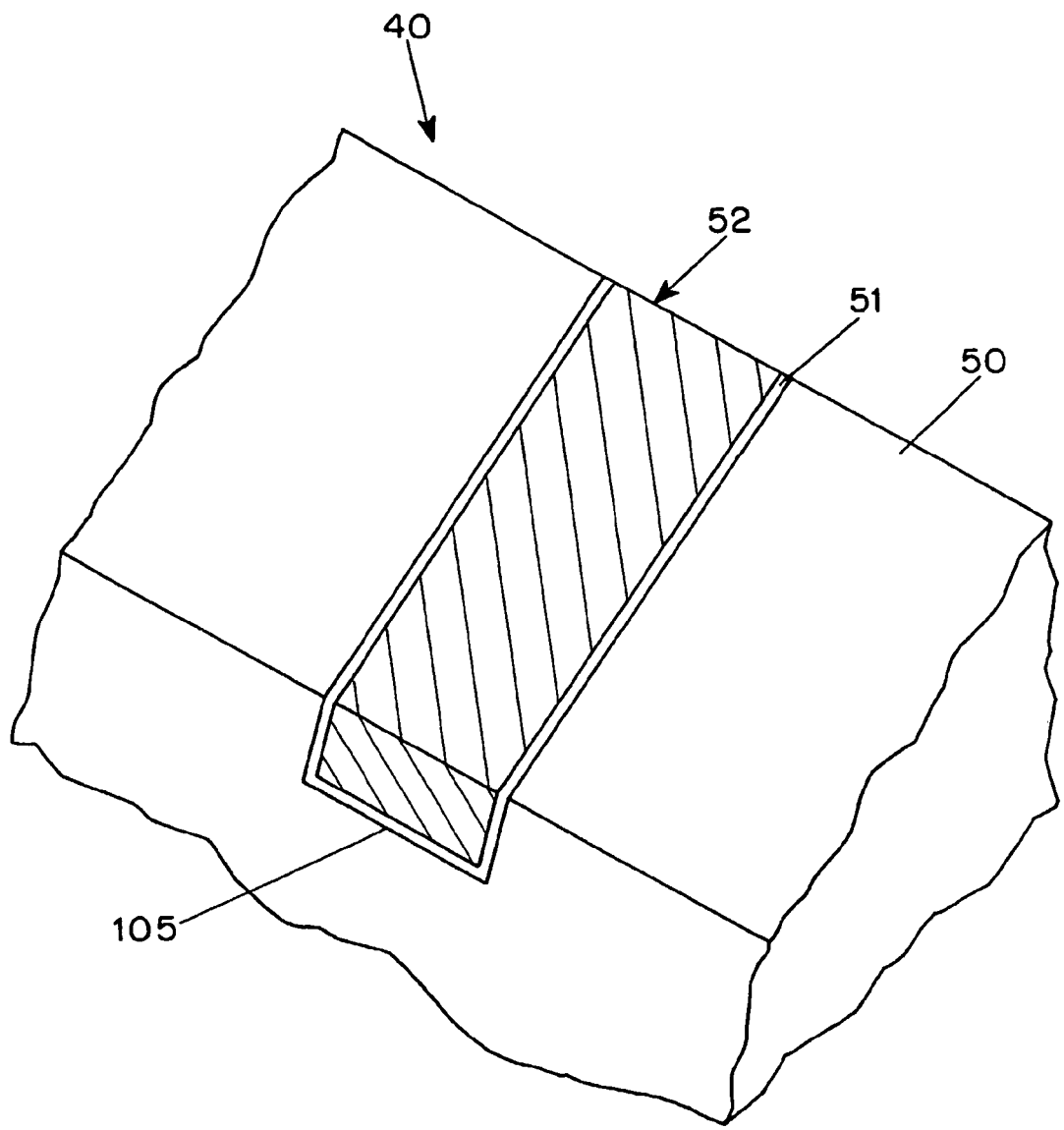
FIG. 4C is an isometric view of the second exemplary sample of FIG. 4A.

Referring to FIGS. 4A-4C, there are shown different views of a sample 40 having a substrate 50, a diffusion barrier layer 51 and a metal layer 52. The substrate 50 has a recess or groove 105 which is lined with the diffusion barrier layer 51, and then filled with or covered by a thin metal layer 52 over the diffusion barrier layer 51 within the recess or groove 105. As in the case of the sample depicted in FIG. 1B, the diffusion barrier layer 51 may consist of a thin layer of any suitable material that prevents the metal from the layer 52 from diffusing into the underlying substrate 50 on which the metal layer 52 is deposited, and permits lateral growth (but not seeding) of grains in the metal layer 52. The metal layer 52 may consist of any elemental metal, compounds metal or alloy, such as aluminum, copper, tungsten, titanium, platinum or gold. The methods and apparatus according to the present invention described above (and to be described below) may be used for LS processing of a metal layer 52 on a sample 40, as shown in FIGS. 4A-4C, to control the shape and size of grains, and to control the direction and orientation of grain boundaries in the metal layer 52. The sample 40 may be a partially fabricated integrated circuit device, multiple partially fabricated integrated circuit devices, or all partially fabricated integrated circuit devices on an entire wafer.

Figure 5:
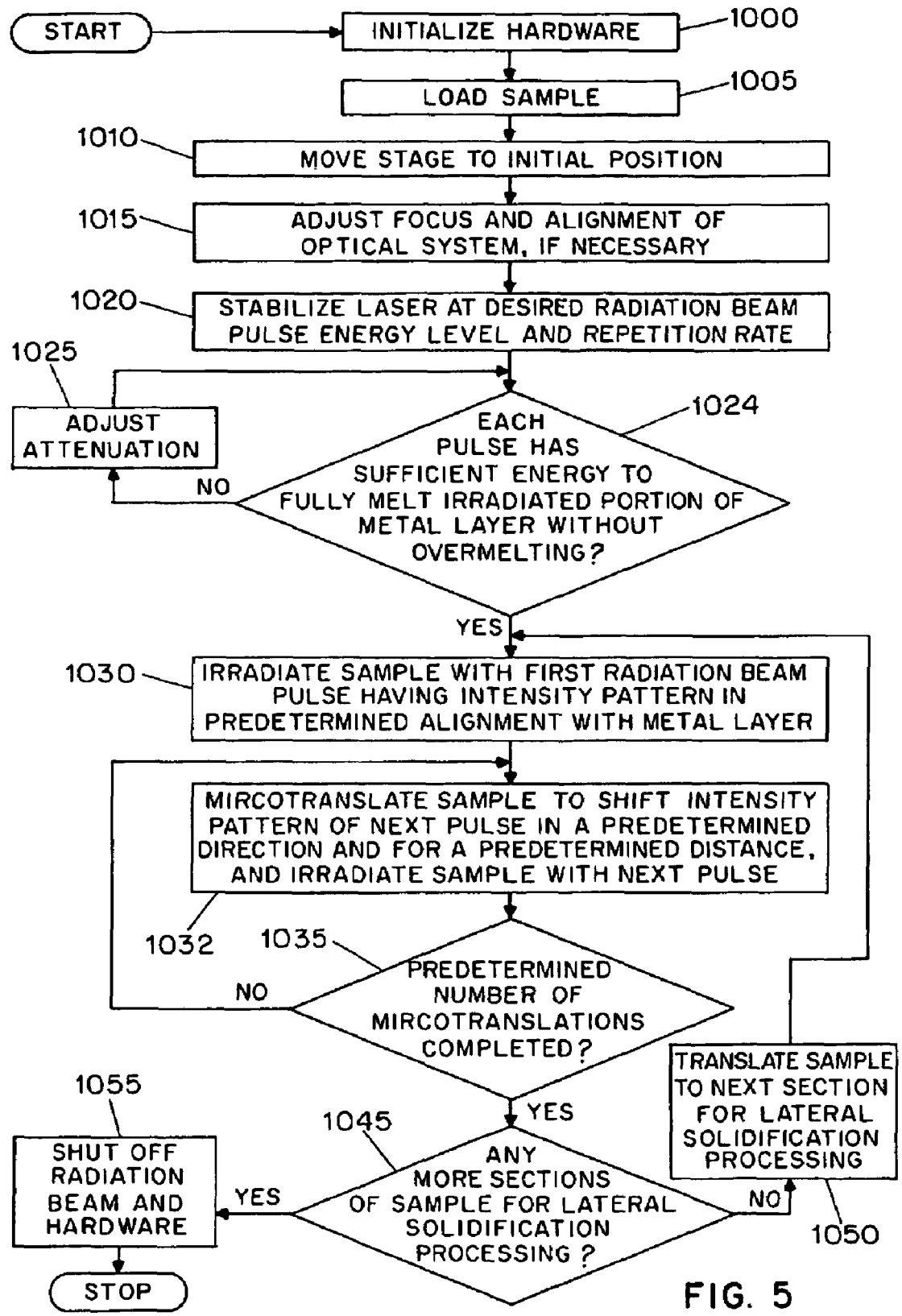
FIG. 5 is a flow diagram representing exemplary LS processing under at least partial computer control according to the method of the present invention as may be carried out by the apparatus of FIG. 1A.

Referring next to FIG. 5, there is shown a flow diagram of exemplary steps carried out with the aid of the computer 106 (or other control devices) for LS processing in accordance with the present invention to control the shape and size of grains, and the location and orientation of grain boundaries in a metal layer, such as that described in the first and second exemplary embodiments, and other exemplary embodiments described hereinbelow. As shown in the flow diagram, in step 1000 the hardware components of the apparatus of FIG. 1A, such as the radiation beam source 110, the beam energy density modulator 120, the beam attenuator 130 and the shutter 152 are first initialized at least in part by the computer 106. A sample 40 is loaded onto the sample translation stage 180 in step 1005. It should be noted that such loading may either be performed manually or automatically using known sample loading apparatus under the control of the computer 106.

Next, the sample translation stage 180 is moved, preferably under the control of the computer 106 to an initial position in step 1010. The various other optical components of the system are adjusted manually or under the control of the computer 106 for proper focus and alignment in step 1015, if necessary. The radiation beam pulses are then stabilized in step 1020 to a desired intensity, pulse duration and pulse repetition rate. In step 1024, it is determined whether each beamlet of the intensity pattern of each radiation beam pulse has sufficient intensity to melt each region of the metal layer 50 overlapped thereby throughout its entire thicknesses without substantially melting an adjacent region overlapped by a shadow region of the intensity pattern. If under-melting or over-melting occurs, the attenuator 130 is adjusted so that each radiation beam pulse has sufficient energy to fully melt the metal layer in irradiated regions without over melting adjoining unirradiated regions.

In step 1030 the sample is irradiated with the first radiation beam pulse having an intensity pattern in proper alignment with the metal layer 52 of the sample 40. In step 1032 the sample is microtranslated to shift the intensity pattern of the next radiation beam pulse in a predetermined direction and by a predetermined distance before the sample 40 is irradiated by a next radiation beam pulse.

In step 1035, it is determined whether LS processing of the metal layer 52, or a particular section thereof, has been completed by determining whether the sample 40 has undergone a predetermined number of microtranslations. If the sample 40 has not undergone the predetermined number of microtranslations, the process loops back to step 1032 for a further microtranslation to shift the intensity pattern of the next radiation beam pulse in a predetermined direction and by a predetermined distance, and irradiation of the sample by the next radiation beam pulse. If the sample has undergone the predetermined number of microtranslations, processing proceeds to step 1045. In step 1045 it is determined whether there are any more sections of the metal layer for LS processing. If there are more sections to be processed, in step 1050 the sample is translated to the next section for LS processing. If there are no more sections of the sample for LS processing, the process terminates.

Figure 6A:
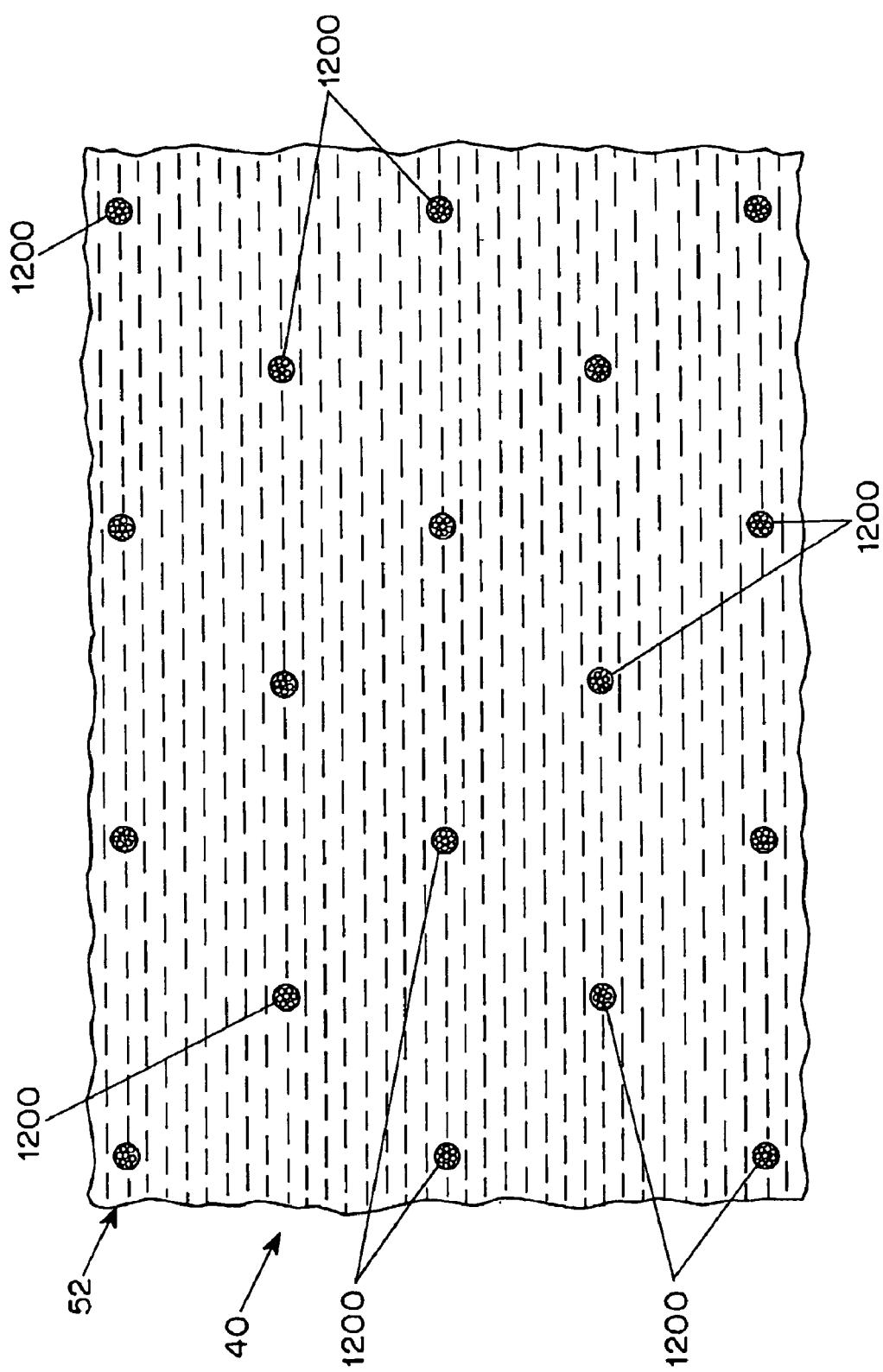

Referring now to FIGS. 6A-6E, there are shown the radiation beam pulse intensity pattern and the grain structure of the metal layer at different stages of LS processing according to a third exemplary embodiment of the method of the present invention. As shown in FIG. 6A, the metal layer 52 of the sample 40 is irradiated by a first radiation beam pulse having an intensity pattern that includes a predetermined regular array of relatively small, dot-like shadow regions 1200, as defined by the mask 150 (shown in FIG. 1A). The metal layer 52, which is formed of copper, for example, may be a metal layer deposited on one or more partially fabricated integrated circuit devices, or a wafer having multiple partially fabricated integrated circuit devices before the metal layer is patterned into interconnect lines of the integrated circuit devices.

Still referring to FIG. 6A, in addition to the array of dot-like shadow regions 1200, which are located at respective intersections of mutually orthogonal diagonal lines, the intensity pattern of the first radiation beam pulse includes a beamlet that overlaps all regions of the metal layer 52, or an entire section thereof, not overlapped by the shadow regions 1200. When the metal layer is irradiated by the first radiation beam pulse, each region of the metal layer 52 overlapped by the beamlet is melted throughout its entire thickness, and each region of the metal layer overlapped by a respective one of the shadow regions 1200 remains at least partially unmelted. The shadow regions 1200 are sufficiently large so that thermal diffusion from the melted regions of the metal film 52 does not cause substantial melting of the regions of the metal layer 52 overlapped by the shadow regions 1200. Therefore, the at least partially unmelted dot-like regions 1201 shown in FIG. 6B each have the grain structure of the metal layer 52 as originally formed. The dot-like shadow regions 1200 may have any shape, such as circular, square, hexagonal, etc. Advantageously, the dot-like shadow regions 1200 are circular and have a diameter in the range of 1 μm to 10 μm, and a nearest neighbor spacing of 2 μm to 100 μm.

Figure 6B:
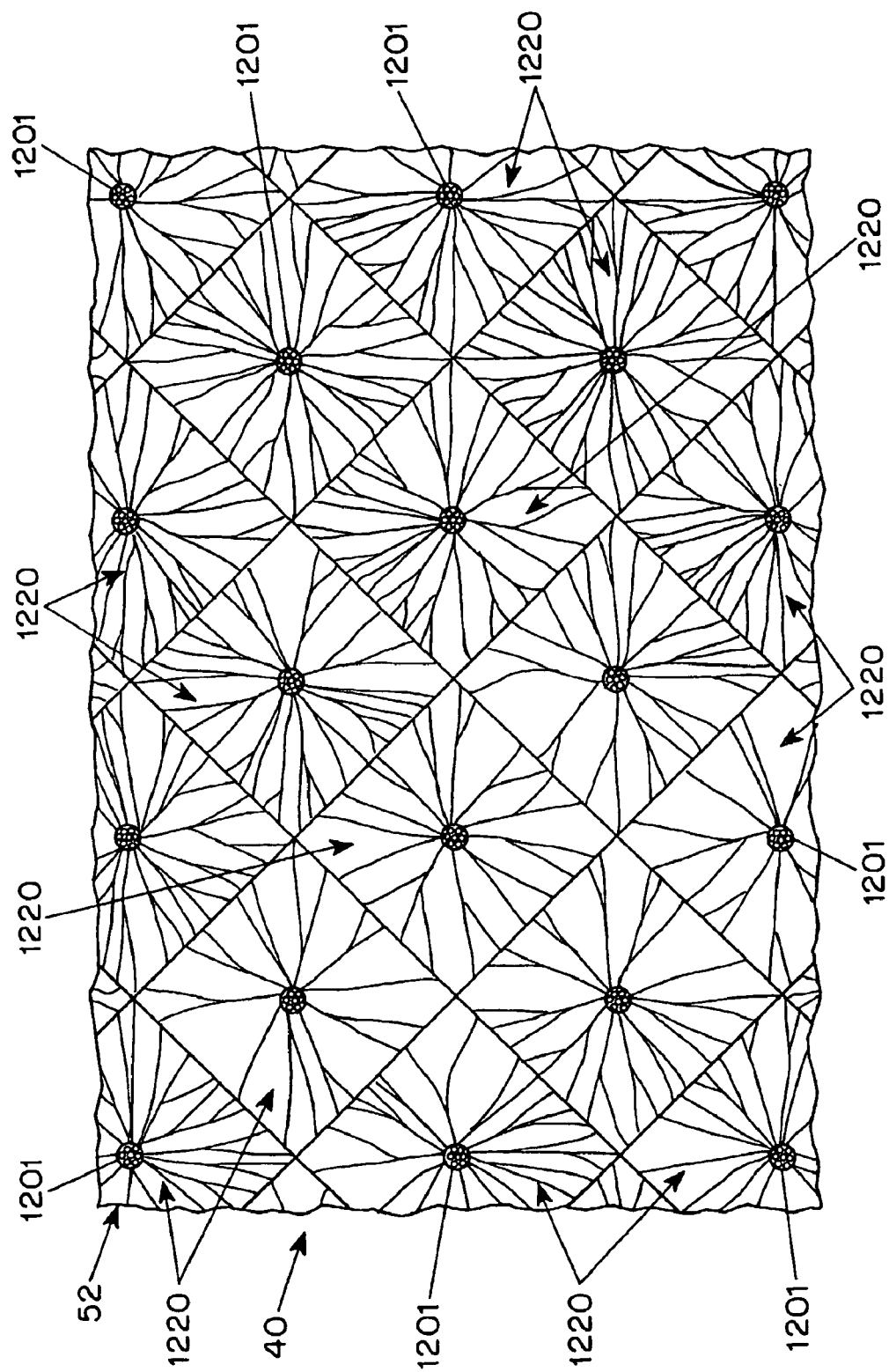

Turning to FIG. 6B, there are shown the melted and the at least partially unmelted regions of the metal layer 52 as the melted regions resolidify after irradiation by the first radiation beam pulse. During resolidification of each melted region, grains grow laterally from each one of the at least partially unmelted regions 1201 until such grains abut other grains growing from adjacent at least partially unmelted regions 1201 after the abutting of grains have grown by a characteristic growth distance, and there are formed approximately square-shaped first resolidification regions 1220 defined by first grain abutment boundaries. Respective abutting grain growth distances of the abutting grain are defined by the pitch of the shadow regions 1200 (i.e., the nearest neighbor spacings). After completion of resolidification of each melted region of the metal layer 52 after irradiation by the first radiation beam pulse, each resolidification region 1220 has a smaller number of larger grains than the metal layer 52 as originally formed.

Referring now to FIG. 6C, after completion of resolidification of each melted region of the metal layer 52 following irradiation by the first radiation beam pulse, the sample 40 having the metal layer 52 is microtranslated in any direction by a distance less than the characteristic growth distance, so that the shadow regions 1240 of the intensity pattern of a second radiation beam pulse are shifted with respect to corresponding ones of the shadow regions 1200 of the intensity pattern of the first radiation beam pulse so as to overlap different regions within respective ones of the first resolidification regions 1220. In the example of FIG. 6C, the sample 40 is microtranslated by a few micrometers (i.e., less than the abutting grain growth distance following irradiation by the first radiation beam pulse) in the A direction, which forms an angle of minus 135° with the X axis. Although the beamlet of the intensity pattern of the second radiation beam pulse is also shifted with respect to the metal layer 52, the shifted beamlet still overlaps all regions of the metal layer 52 not overlapped by the shifted shadow regions 1240.

After microtranslation of the sample 40, the metal layer 52 is irradiated with the second radiation beam pulse so that each region of the metal layer 52 overlapped by the shifted beamlet is melted throughout its entire thickness, and each region of the metal layer 52 overlapped by a respective one of the shifted shadow regions 1240 remains at least partially unmelted. The microtranslation of the metal layer 52 causes the at least partially unmelted regions 1241, shown in FIG. 6D, to contain fewer grains than the at least partially unmelted regions 1201 after irradiation by the first radiation beam pulse. It is noted that instead of microtranslating the sample 40, the same intensity pattern of the second radiation beam pulse having the shifted shadow regions 1240 may be obtained by microtranslating the mask 150 (shown in FIG. 1A) while the sample 40 remains stationary. Except for the shifting of the shadow regions 1240 and the beamlet, the intensity pattern of the second radiation beam pulse is the same as that of the first radiation beam pulse.

Figure 6D:
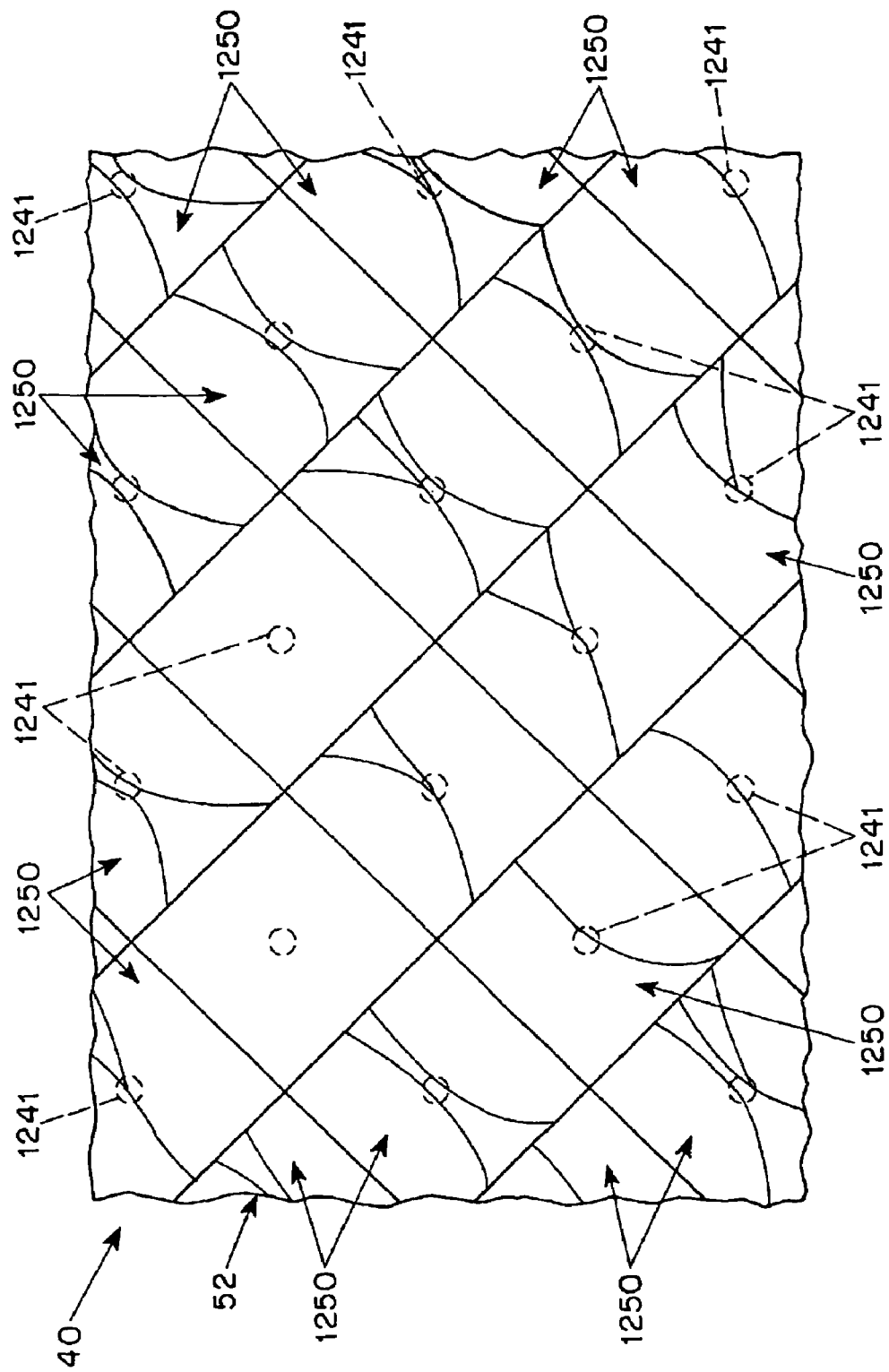

Turning now to FIG. 6D, upon resolidification of the melted regions of the metal layer 52, grains will grow outwardly from each of the shifted at least partially unmelted regions 1241 until such grains abut other grains growing outwardly from adjacent shifted at least partially unmelted regions 1241 after the abutting grains have grown by the characteristic growth distance, and there are formed approximately square shaped second resolidification regions 1250 defined by respective second grain abutment boundaries. Comparing FIG. 6D to FIG. 6B, the metal layer 52 after completion of resolidification following irradiation by the second radiation beam pulse has fewer and larger grains than it did after resolidification following irradiation by the first radiation beam pulse.

Figure 6E:
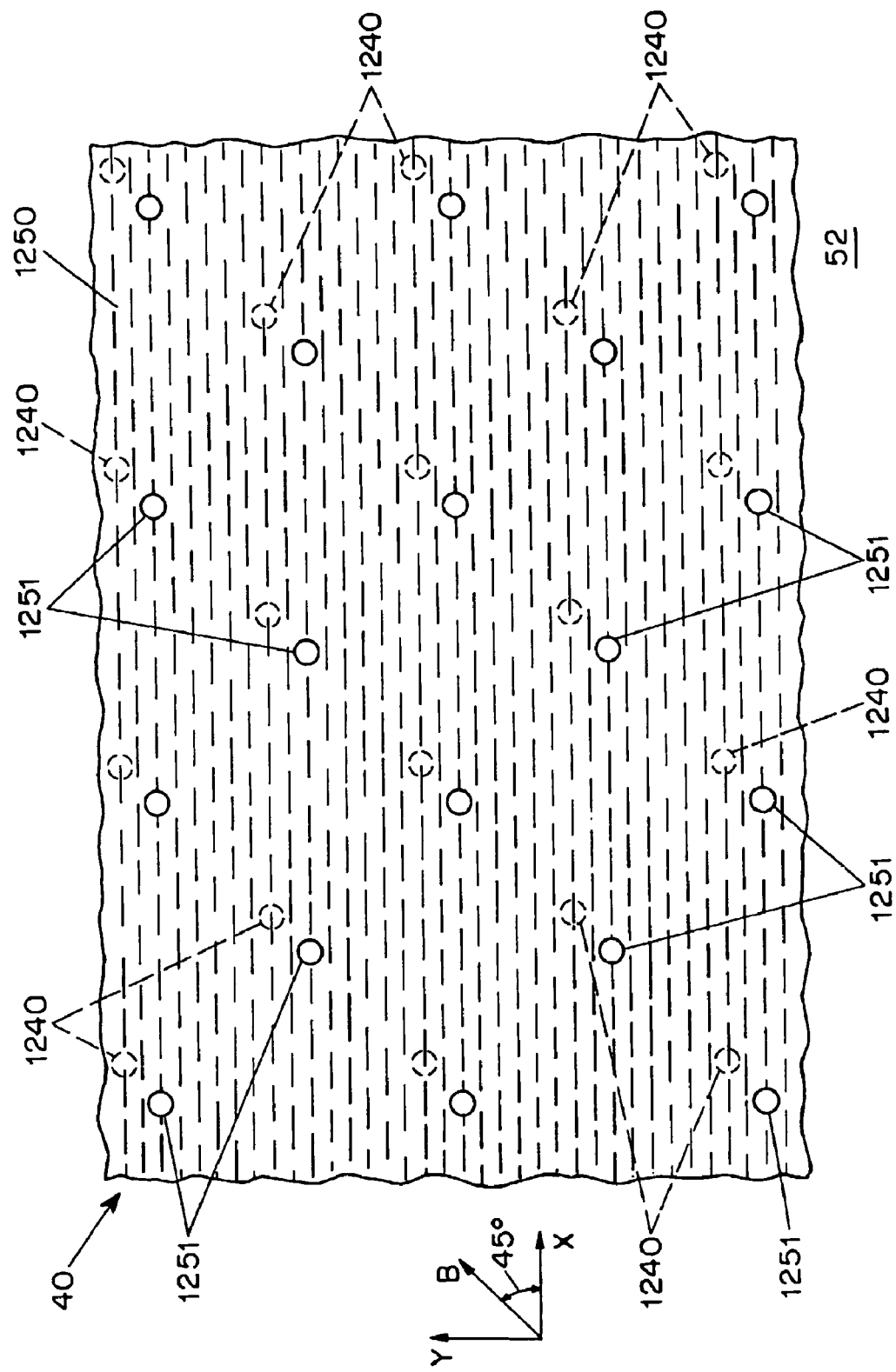

Referring to FIG. 6E, after completion of resolidification following irradiation by the second radiation beam pulse the sample 40 is microtranslated in any direction by a distance less than the characteristic growth distance, so that the shadow regions 1250 of the intensity pattern of a third radiation beam pulse are shifted with respect to corresponding ones of the shadow regions 1240 of the intensity pattern of the second radiation beam pulse by a distance less than the characteristic growth distance so as to overlap different regions within respective ones of the second resolidification regions. In the example of FIG. 6E, the sample 40 is microtranslated by a distance in the range from 1 µm to 100 µm in the −B direction, which forms an angle of 45° with the X axis. Although the beamlet of the intensity pattern of the third radiation beam pulse is also shifted with respect to that of the intensity pattern of the second radiation beam pulse, the twice-shifted beamlet still overlaps all regions of the metal layer 52 not overlapped by the shifted shadow regions 1250. The metal layer 52 is then irradiated with the third radiation beam pulse, so that each region of the metal layer 52 overlapped by the twice-shifted beamlet 1250 is melted throughout its entire thickness, while each region of the metal layer 52 overlapped by a respective one of the twice-shifted shadow regions 1250 remains at least partially unmelted. Upon resolidification of each melted region of the metal layer 52, grains grow outwardly from each one of the twice-shifted at least partially unmelted regions 1251, shown in FIG. 6F, until such grains abut other grains growing outwardly from adjacent twice-shifted at least partially unmelted regions, and there are formed approximately square-shaped third resolidification regions 1260 defined by third grain abutment boundaries. Because microtranslation of the sample 40 causes each one of the at least partially unmelted regions 1251 to contain only a single grain, each of the third resolidification areas 1260 has only a single grain. It is noted once again that instead of microtranslating the sample 40, the same intensity pattern of the third radiation beam pulse having the twice-shifted shadow regions 1250 (and beamlet) may be obtained by microtranslating the mask 150 (shown in FIG. 1A) while the sample 40 remains stationary. Typically the radiation beam pulses have a beamlet intensity in the range of 10 mJ/cm² to 10⁴ mJ/cm², a pulse duration (FWHM) in the range of 10 nsec to 10³ nsec, and a pulse repetition rate in the range of 10 Hz to 10⁴ Hz.

Figure 6F:
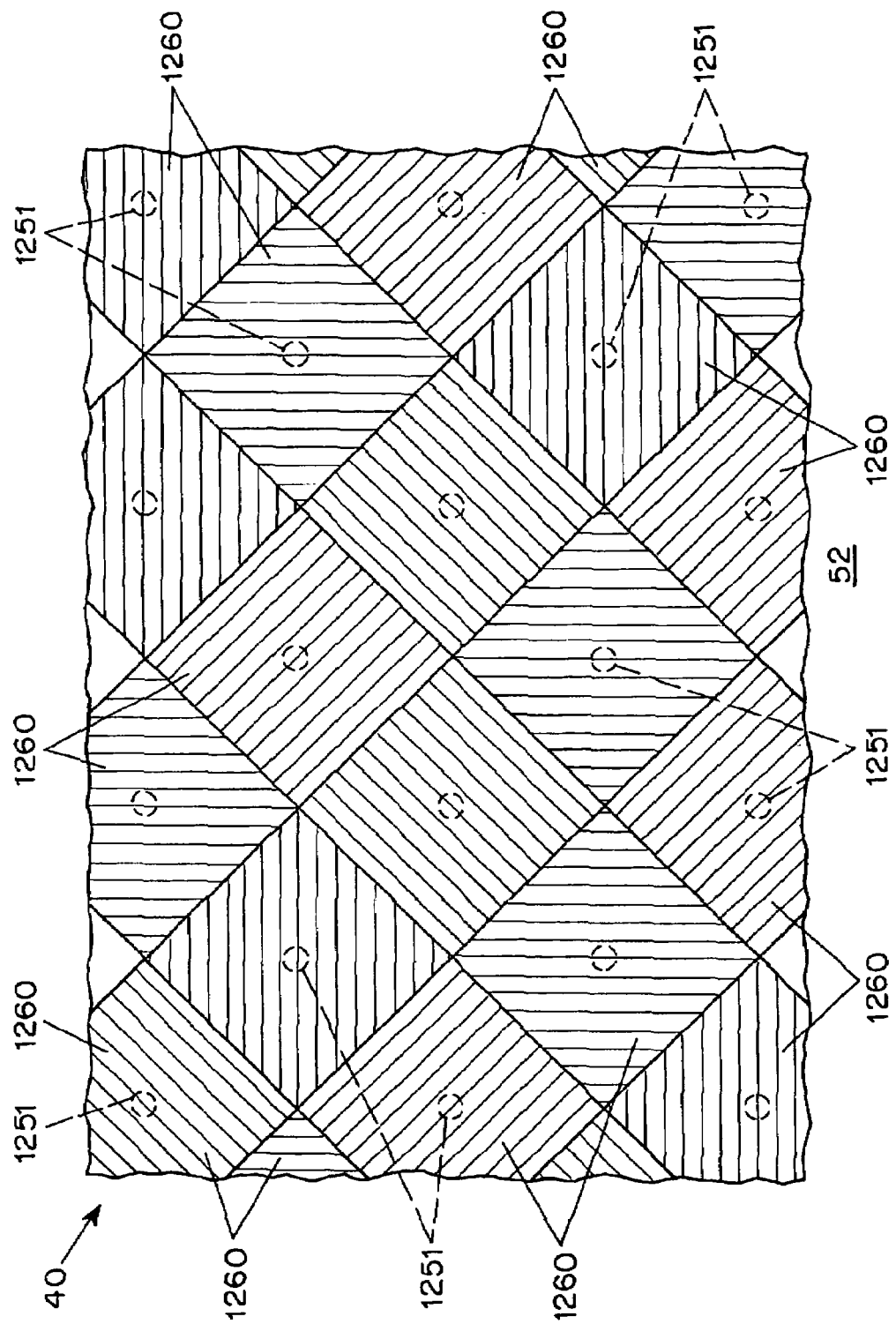

If the LS-processed metal layer 52 shown in FIG. 6F is patterned to form interconnect lines of an integrated circuit device, it is advantageous to form the interconnect lines so that the direction of current flow is substantially perpendicular to third grain abutment boundaries of the resolidification regions 1260 so as to minimize electromigration.

It will be understood by those skilled in the art that the array of shadow regions of the intensity pattern of the radiation beam pulses, as defined by the mask 150, need not have the configuration shown in FIGS. 6A-6F, but may be an array having a different configuration, in which case the resolidification regions will each have a correspondingly different shape. Moreover, additional microtranslations of the sample 40 each followed by irradiation of the metal layer 52 by a further radiation beam pulse and resolidification of each melted region of the metal layer may be required in order to obtain resolidification regions each having only a single grain.

Figure 7A:
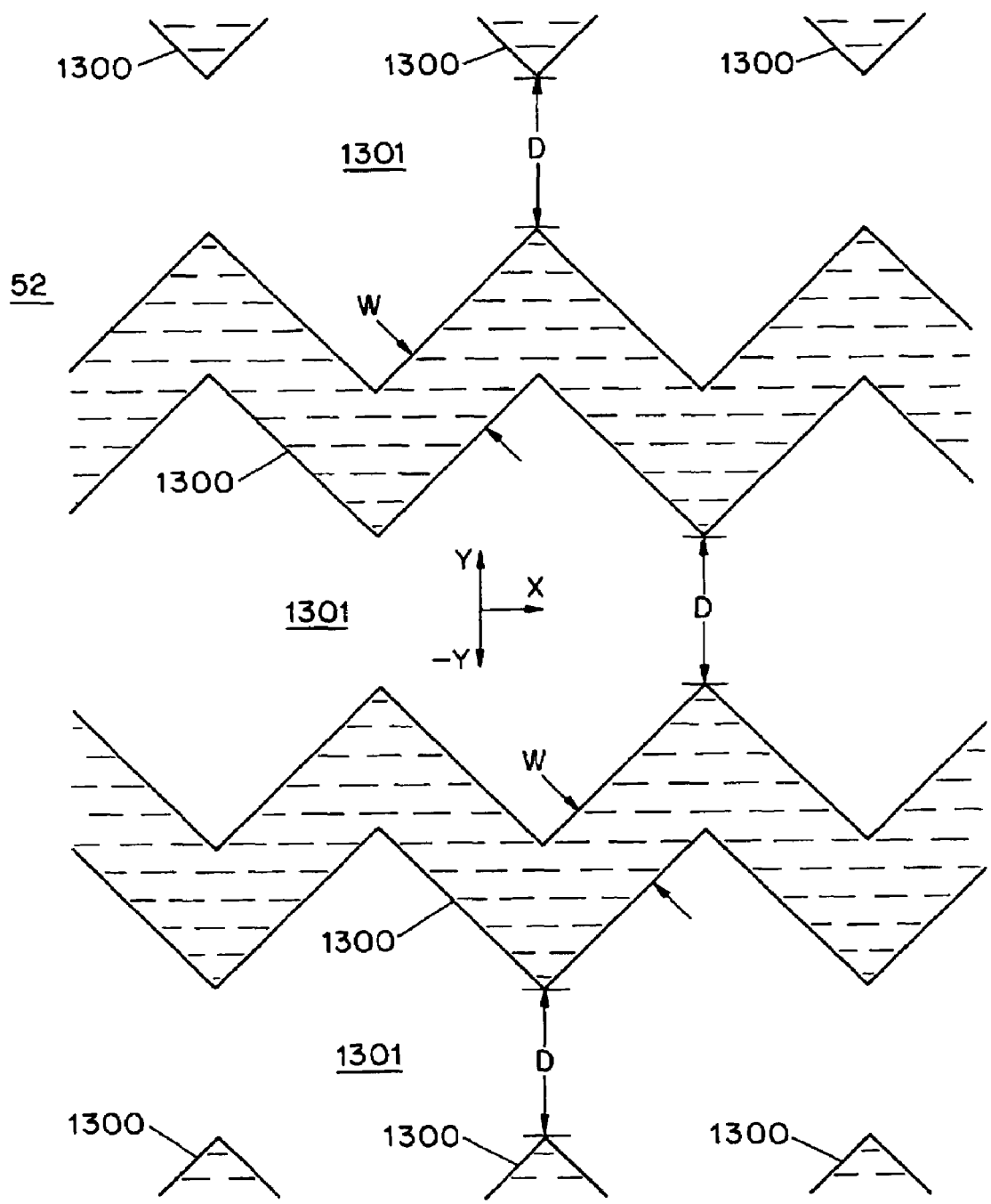
FIGS. 7A-7H illustrate the radiation beam pulse intensity pattern and the grain structure of a portion of a metal layer at different stages of LS processing according to a fourth exemplary embodiment of the method of the present invention, in which the intensity pattern of the radiation beam pulses has beamlets in the form of regularly spaced, repeating chevrons where adjacent repeating chevron-shaped beamlets are staggered with respect to one another.

Referring to FIGS. 7A-7H, there are shown the radiation beam pulse intensity pattern and the metal layer grain structure at different stages of LS processing of a metal layer according to a fourth embodiment of the method of the present invention. In FIG. 7A, a metal layer 52, which is formed of copper, for example, on a sample 40 is irradiated by a first radiation beam pulse having an intensity pattern, as defined by the mask 150 (shown in FIG. 1A), having multiple, regularly spaced beamlets 1300 each having the shape of repeating chevrons (i.e., a sawtooth shape), and multiple shadow regions 1301 each positioned in between and adjoining respective adjacent ones of the beamlets 1300. Adjacent repeating chevron-shaped beamlets 1300 are staggered with respect to one another such that downward pointing apexes of each repeating chevron-shaped beamlet 1300 are aligned in the Y direction with a respective ones of upward pointing apexes of adjacent repeating chevron-shaped beamlets 1300, and upward pointing apexes of each repeating chevron-shaped beamlets 1300 are aligned in the Y direction with respective ones of downward pointing apexes of adjacent repeating chevron-shaped beamlets 1300. Each beamlet 1300 has sufficient intensity such that each region of the metal layer 52 overlapped by a respective one of the beamlets 1300 is melted throughout its entire thickness, and each region of the metal layer 52 overlapped by a respective one of the shadow regions 1301 remains at least partially unmelted. The width W of the repeating chevron-shaped beamlets 1300 is preferably in the range of 1 µm to 10 µm, and the minimum separation D between adjacent beamlets 1300 is preferably in the range of 1 µm to 10³ µm.

Figure 7B:
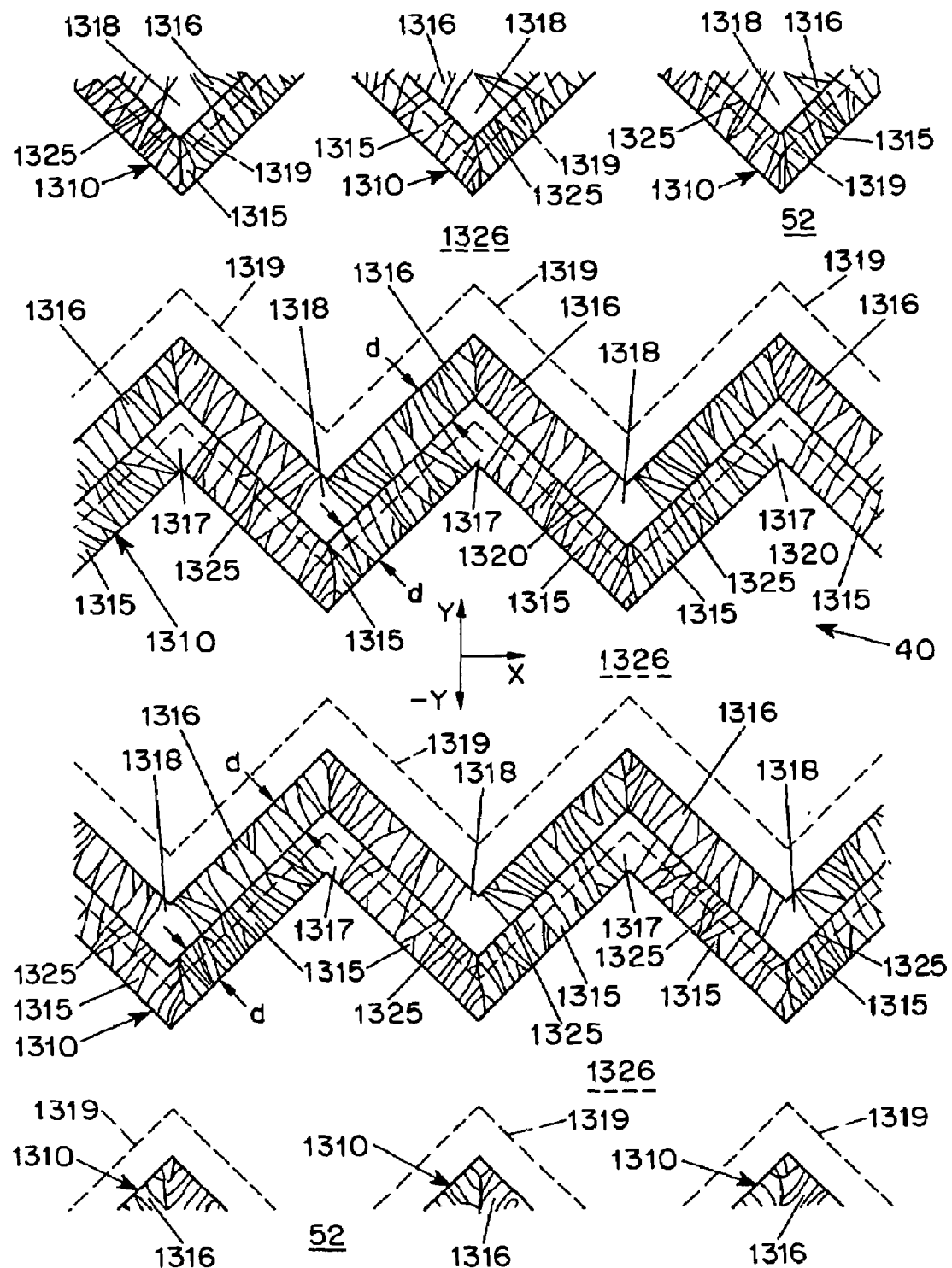

Turning now to FIG. 7B, following irradiation by the first radiation beam pulse, the melted regions of the metal layer 52 are permitted to cool and resolidify. During resolidification of each melted region, grains grow laterally therein from the opposing boundaries of the melted region until rows of grains 1315, 1316 growing in opposite directions towards one another abut one another along a respective one of first grain abutment boundaries 1325 extending approximately along the center line of each melted region to form first resolidification regions 1310. In this manner, each first resolidification region 1310 has an upwardly (in the +Y direction) grown row of grains 1315 and a downwardly (in the −Y direction) grown row of grains 1316 that abut one another after the abutting grains have grown by an abutting grain growth distance, d, defined by the beamlets and shadow regions. In each first resolidification region 1310, there is a relatively large single grain 1317 at each upward pointing apex of the upwardly grown row of grains 1315, and a relatively large single grain 1318 at each downward pointing apex of the downwardly grown row of grains 1316.

After completion of resolidification of each melted region of the metal layer 52, the sample 40 is microtranslated downwardly in the vertical direction (i.e., in the −Y direction) so that the beamlets 1319 and shadow regions 1326 of the intensity pattern of a second radiation beam pulse are shifted with respect to the beamlets 1300 and the shadow regions 1301 of the intensity pattern of the first radiation beam pulse so that a respective one of the shifted beamlets 1319 overlaps a portion of the upwardly grown row of grains 1315 in each resolidification region 1310. Specifically, the beamlets 1319 and the shadow regions 1326 (in between and adjoining respective adjacent beamlets 1319) of the radiation beam pulse are shifted by less than the abutting grain growth distance, d. The shifted beamlets 1319 are indicated in FIG. 7B by dashed lines. It is noted that the same shifting of the beamlets and shadow regions may be achieved by microtranslating the mask 150 (shown in FIG. 1A) instead of microtranslating the sample 40.

Figure 7C:
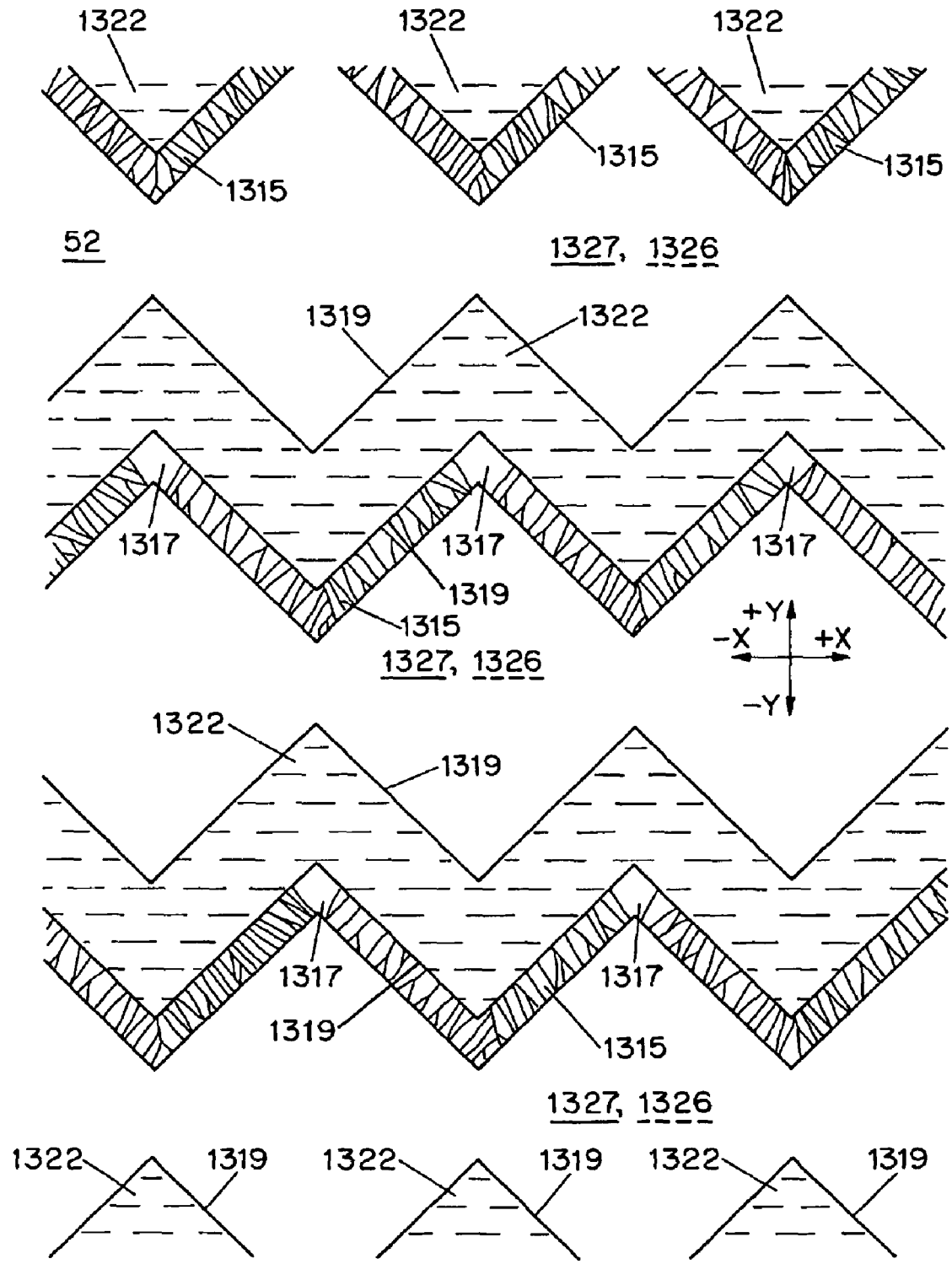

Referring to FIG. 7C, when the metal layer 52 is irradiated by the second radiation beam pulse, each region 1322 of the metal layer 52 overlapped by a respective one of the shifted beamlets 1319 is melted throughout its entire thickness, while each region 1327 overlapped by a respective one of the shadow regions 1326 remains at least partially unmelted. Each at least partially unmelted region adjoins respective adjacent melted regions. In particular, portions of the upwardly grown rows of grains 1315 of the first resolidification regions 1310 overlapped by the shifted shadow regions 1326 remain at least partially unmelted, including portions of the single grain regions 1317.

Figure 7D:
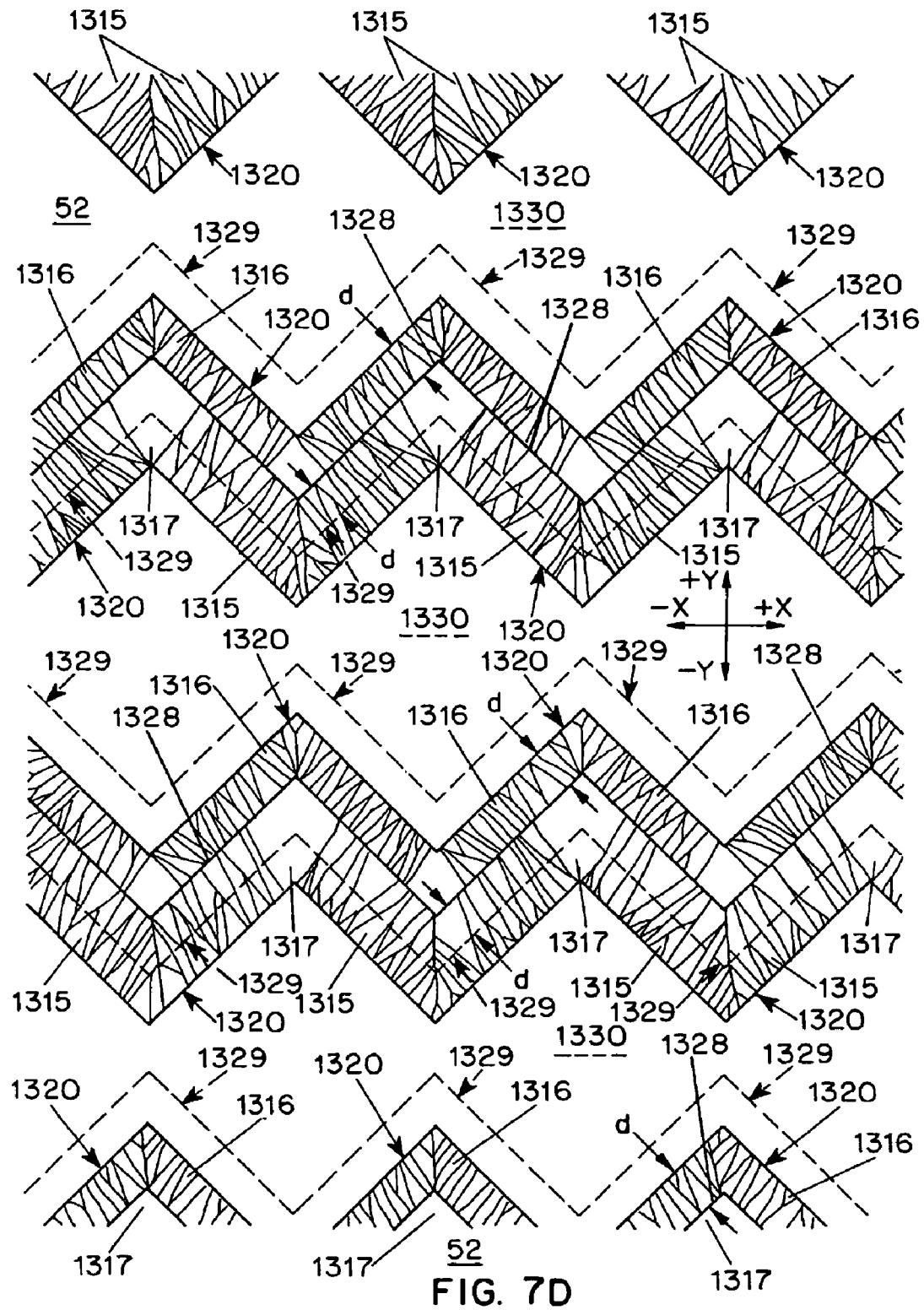

Turning to FIG. 7D, after irradiation of the metal layer 52 by the second radiation beam pulse, each melted region 1322 of the metal layer 52 is permitted to cool and resolidify to form second resolidification regions 1320. Each second resolidification region 1320 has a row of upwardly grown grains 1315 and a row of downwardly grown grains 1316 which abut one another along a respective one of second grain abutment boundaries 1328, extending approximately along the center line of the second resolidification region 1320. The abutting of the upwardly grown grains 1315 with the downwardly grown grains 1316 occurs after the grains have grown by the abutting grain growth distance, d. Because growth of the row of upwardly grown grains 1315 in each one of the second resolidification regions 1320 is seeded by the at least partially unmelted portion of the row of upwardly grown grains 1315 in the first resolidification regions 1310, the upwardly grown grains 1315 are larger in size. In particular, the single grain region 1317 at each upward pointing apex of the row of upwardly grown grains in each one of the second resolidification regions 1320 has increased in size.

Referring to FIG. 7D, after the growth of grains in the second resolidification regions 1320 is completed, the sample 40 (shown in FIG. 1A) is again microtranslated in the downward vertical direction (i.e., the −Y direction) such that each one of the beamlets 1329 and the shadow regions 1330 (in between and adjoining respective adjacent beamlets 1329) of the intensity pattern of a third radiation beam pulse is shifted with respect to the beamlets 1319 and the shadow regions 1326 of the intensity pattern of the second radiation beam pulse by a distance less than the characteristic growth distance d so that the twice shifted beamlets 1329 overlap respective portions of the rows of upwardly grown grains 1315 in the second resolidification regions 1320. After such microtranslation, the metal layer 52 (shown in FIG. 1A) is irradiated by the third radiation beam pulse so that each region of the metal layer 52 overlapped by a respective one of the twice-shifted beamlets 1329 is melted throughout its entire thickness, and each region of metal layer overlapped by a respective one of the twice-shifted shadow regions 1330, including respective portions of the rows of upwardly grown grains 1315 in the second resolidification regions 1320, remain at least partially unmelted. After irradiation of the metal layer 52 by the third radiation beam pulse, the melted regions are permitted to cool and resolidify so as to form third resolidification regions (not shown), each having abutting rows of upwardly grown and downwardly grown grains. In each one of the third resolidification regions (not shown), the upwardly grown grains have become larger in size, including the single-grain regions at respective upward pointing apexes of the row of upwardly grown grains.

Figure 7E:
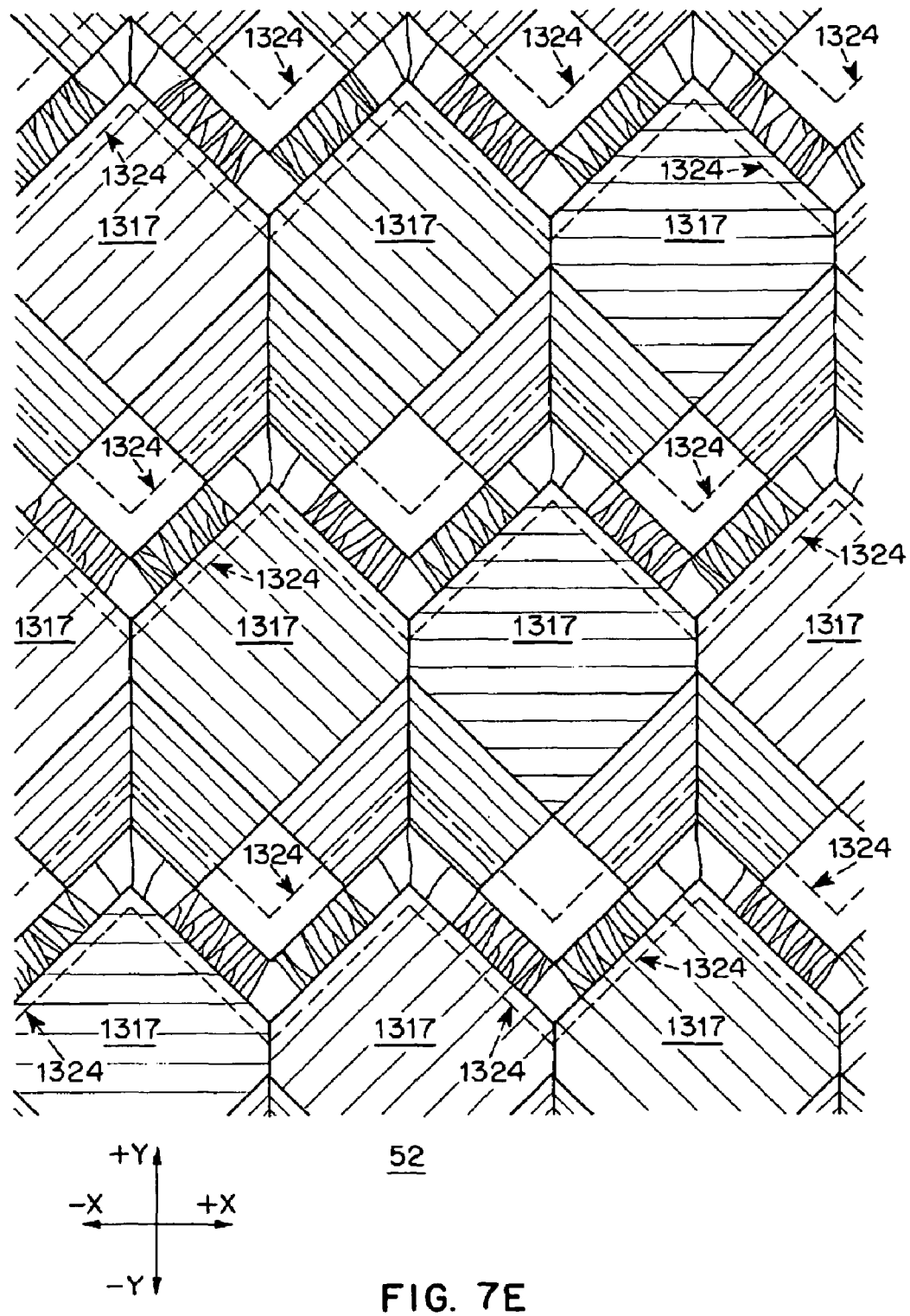

Turning now to FIG. 7E, after a number of microtranslations, irradiations and resolidifications in the manner described above, the single-grain region 1317 at each one of the upward pointing apexes of each row of upwardly grown grains continues to grow in size and begins to abut horizontally adjacent (i.e., in the +X and −X directions) single-grain regions 1317. In addition, each one of the single-grain regions 1317 in each one of the resolidification regions extends into its vertically adjacent resolidification region directly above (i.e., in the +Y direction). As shown in FIG. 7E, after resolidification is completed, the sample is microtranslated in the downward vertical direction (i.e., the −Y direction) in the manner described above, and shifted beamlets 1324 of the intensity pattern of a next radiation beam pulse, which are indicated by dashed lines, overlap respective portions of the single-crystal regions 1317 and other regions in the manner shown in FIG. 7E.

Figure 7F:
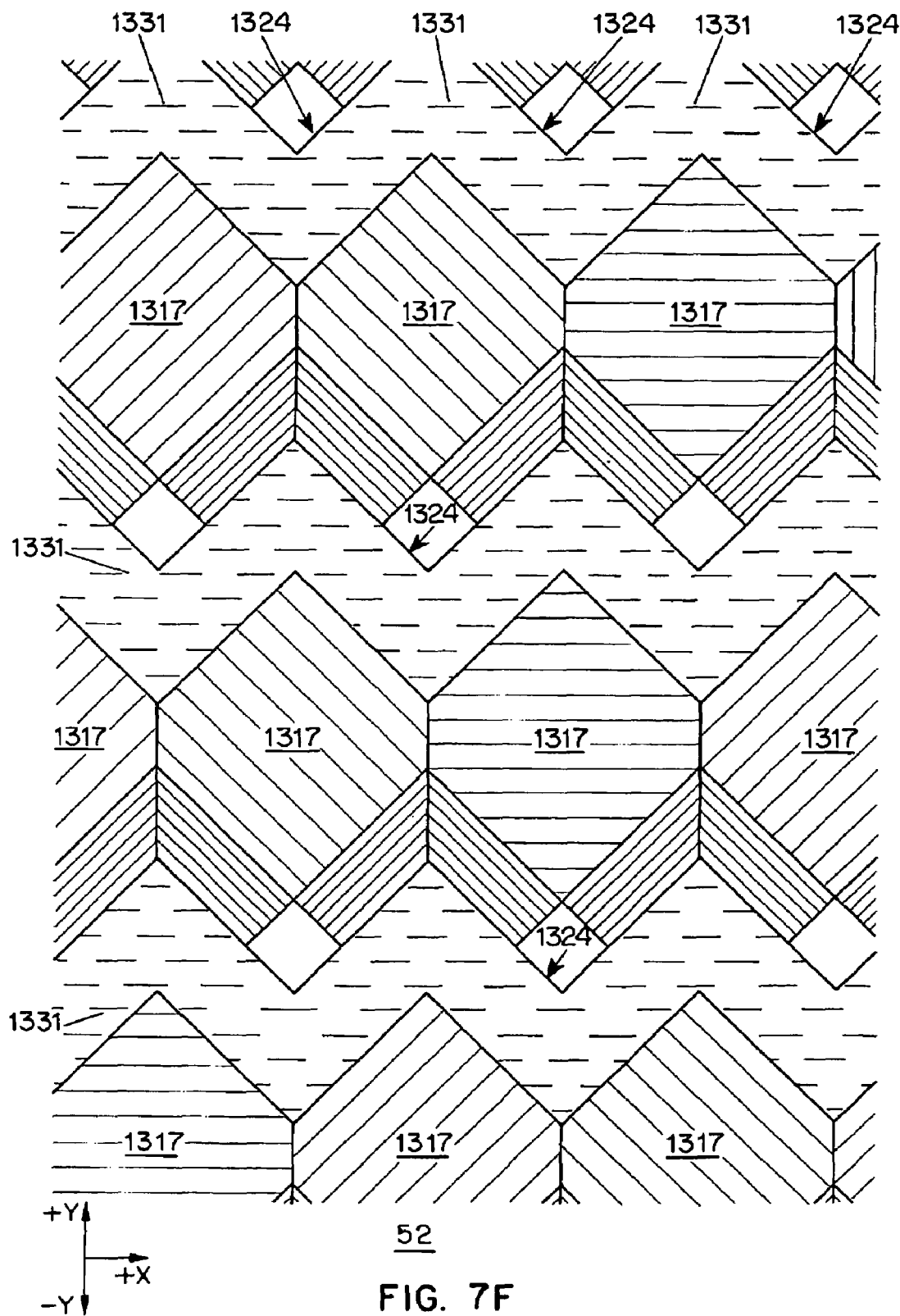
Figure 7G:
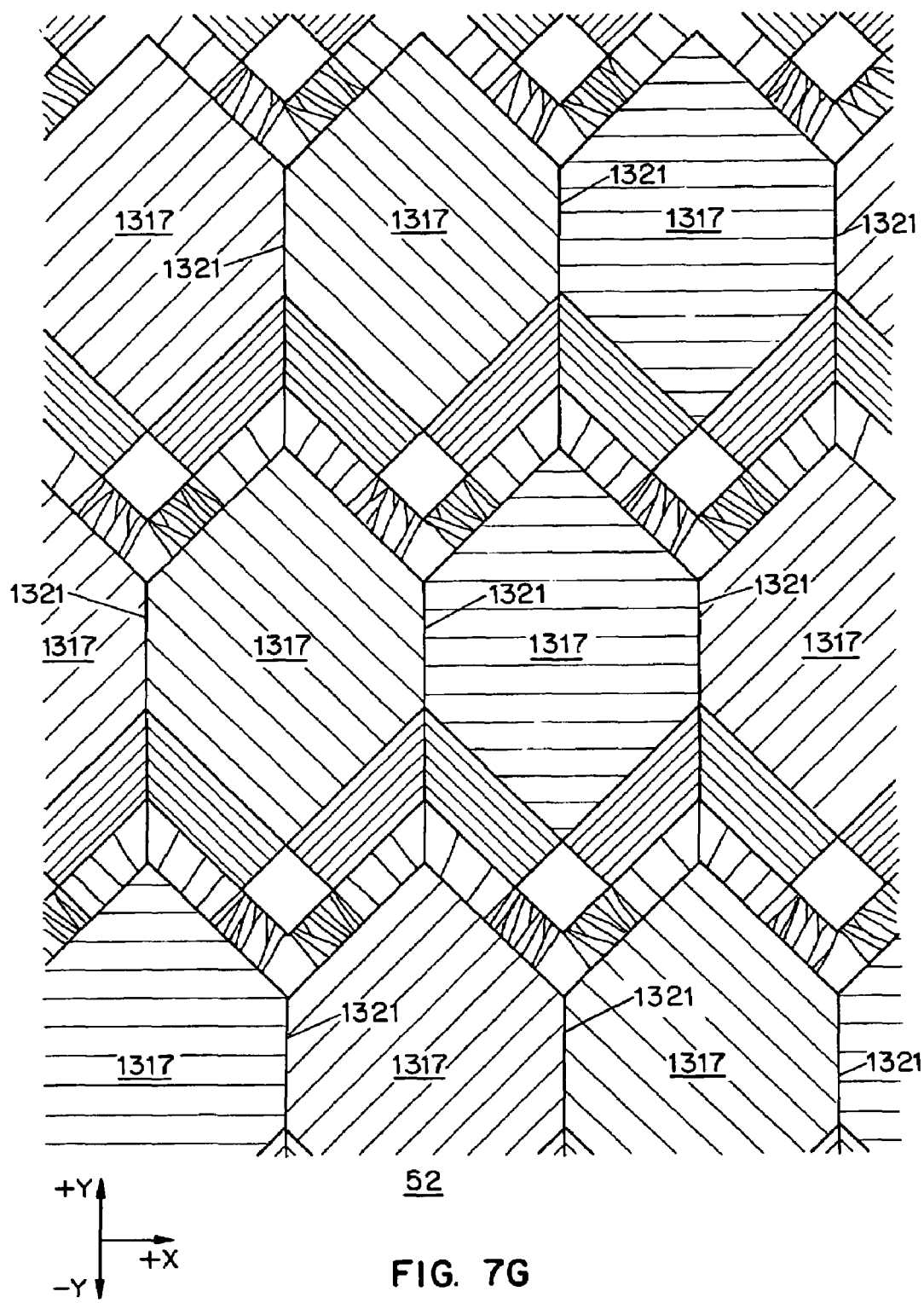

Referring to FIG. 7F, upon irradiation by the next radiation beam pulse, each region 1331 of the metal layer 52 overlapped by a respective one of the shifted beamlets 1324 is melted throughout its entire thickness, and each region of the metal layer 52 overlapped by a respective one of the shadow regions (in between and adjoining respective adjacent shifted beamlets 1324) remains at least partially unmelted. Upon resolidification of each melted region 1331, as shown in FIG. 7G, the single-grain regions 1317 grow even larger so as to abut horizontally adjacent single-grain regions 1317 over longer grain abutment boundaries 1321. Moreover, each one of the single-grain regions 1317 extends closer to single-grain regions 1317 in the vertically adjacent direction (i.e., the +Y direction).

Figure 7H:
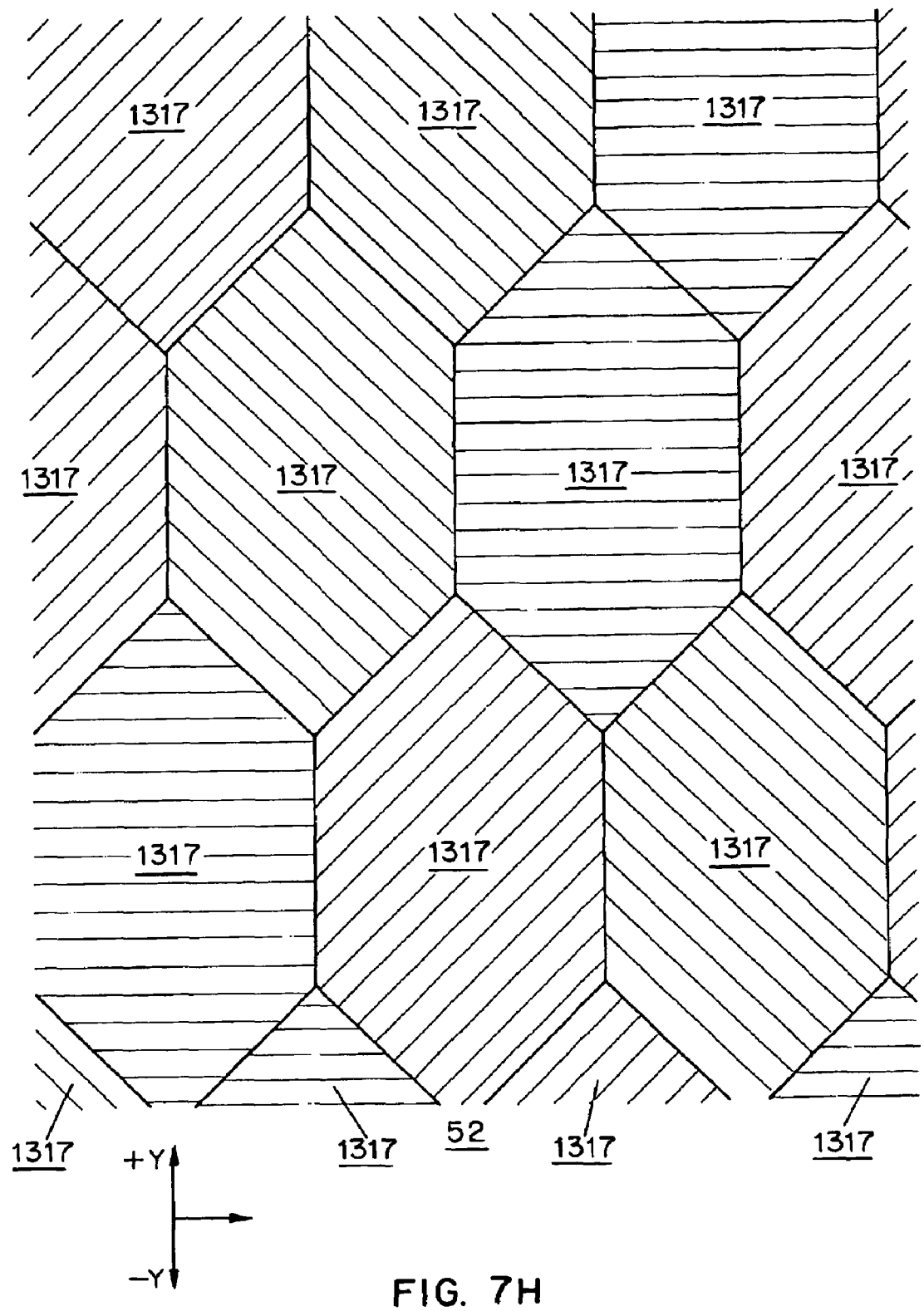

Turning to FIG. 7H, after a number of additional microtranslations, irradiations and resolidifications in the manner described above, each one of the single-grain regions 1317 grows so as to abut its two vertically adjacent (i.e., the +Y direction) single-grain region 1317. When each one of the single-grain regions 1317 has grown to fully abut its vertical adjacent single grain regions 1317, the metal layer 52 processed in the foregoing manner consists of fully abutting single-grain regions 1317 each having a generally hexagonal shape, as shown in FIG. 7H.

Advantageously, in the foregoing exemplary embodiment, each radiation beam pulse provides a beamlet intensity in the range of 10 mJ/cm$^2$ to 10$^4$ mJ/cm$^2$ with a pulse duration in the region of 10 nsec to 10$^3$ nsec and a pulse repetition rate in the range of 10 Hz to 10$^3$ Hz.

If the metal layer 52 (shown in FIG. 1A) is to be patterned, it is advantageously patterned after the above-described LS processing, such as patterning by conventional photolithography and etching to form interconnection lines for integrated circuit devices or to form a patterned metal layer for other applications. As mentioned above, instead of microtranslating the sample 40 having the metal film 52, the shifts of the intensity pattern of a next radiation beam pulse with respect to that of a previous radiation beam pulse may be accomplished by microtranslating the mask 150 (shown in FIG. 1A) using a conventional mask translation stage which is not shown. Furthermore, instead of microtranslating the sample 40 or the mask 150 to shift the intensity pattern of a next radiation beam pulse in the upward direction (i.e., the +Y direction) with respect to the intensity pattern of a previous radiation beam pulse after each irradiation by a previous radiation pulse and resolidification of each melted region of the metal layer, the same result shown in FIG. 7H may be achieved by microtranslating the sample 40 or the mask 150 to shift the intensity pattern of the next radiation beam pulse in the downward direction (i.e., the −Y direction) with respect to that of a previous radiation beam pulse after each irradiation and resolidification.

Referring to FIG. 1A, if LS processing is being carried on a metal layer 52 on a section-by-section basis, after completion of the LS processing in the manner described above on a section of the metal layer 52, the sample 40 may be translated to a next section of the metal layer 52 for LS processing in accordance with the foregoing exemplary embodiment.

Figure 8C:
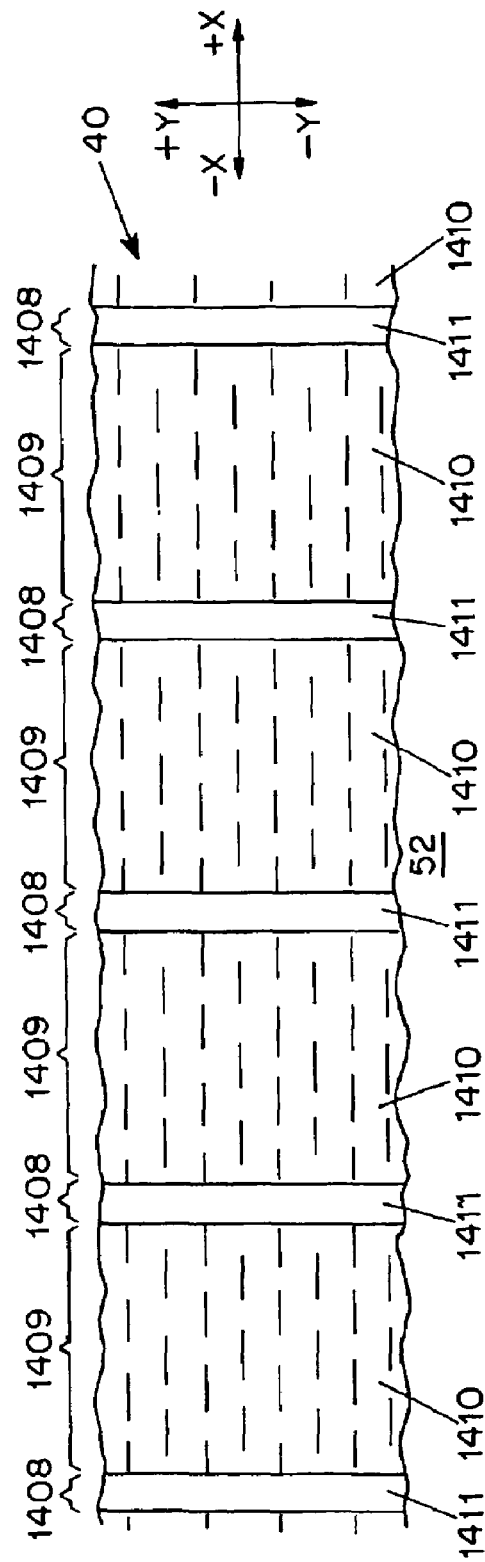

Referring to FIGS. 8A-8D, there are illustrated the radiation beam pulse intensity pattern and the metal layer grain structure at different stages of LS processing according to a fifth exemplary embodiment of the method of the present invention. The metal layer 52 is formed of copper, for example. As shown in FIG. 8A, the intensity pattern of the first radiation beam pulse, as defined by the mask 150 (shown in FIG. 1A), consists of a plurality of regularly spaced, relatively narrow, linear, stripe-like shadow regions 1401 each extending along the Y direction, and a plurality of regularly spaced, relatively wide, linear, stripe-like beamlets 1400 each extending along the +Y directions. Each one of the beamlets is positioned in between and adjoining respective adjacent shadow regions 1401. The intensity pattern of the first radiation beam pulse may have any number of shadow regions 1401 and beamlets 1400 of any length in the ±Y directions, subject to the area of the metal layer 52 being processed and the limitation that the radiation beam pulse must provide sufficient intensity to each beamlet 1400 to melt a respective metal layer region overlapped by the beamlet throughout the region's entire thickness. Preferably, each one of the shadow regions 1401 has a small width dimension of less than 1 μm to 10 m, and each one of the beamlets 1400 has a small width dimension of 1 μm to $10^3$ μm. When the metal layer 52 is irradiated by the first radiation beam pulse having such an intensity pattern, each region 1402 of the metal layer 52 overlapped by a respective one of the beamlets 1400 is melted throughout its entire thickness, while each region 1403 of the metal layer 1403 overlapped by a respective one of the shadow regions 1401 remains at least partially unmelted. Each one of the at least partially unmelted regions 1403 adjoins respective adjacent melted regions 1402. The metal layer in the at least partially unmelted regions 1403 has the relatively small grains with randomly oriented grain boundaries of the metal layer as originally formed.

As shown in FIG. 8B, after irradiation by the first radiation beam pulse, melted region 1402 (shown in FIG. 8A) of the metal layer 52 is permitted to cool and resolidify. During resolidification of each melted region 1402, grains grow from each at least partially unmelted region 1403 in each adjoining melted region 1402, and in each melted region 1402, grains grow from adjoining at least partially unmelted regions 1403 in opposite directions towards one another, and abut one another along a respective one of first grain abutment boundaries 1407 located approximately along the center line of each melted region 1402 to form resolidification regions 1404. Each one of the resolidification regions 1404 has two columns of horizontally extending (i.e., in the ±X directions) grains 1405 and 1406, which abut one another after having grown by an abutting grain growth distance, d, of approximately half the width of the beamlets. After resolidification of each melted region 1402 of the metal layer 52 is completed, the metal layer 52 is irradiated by a second radiation beam pulse having the same intensity pattern as the first radiation beam pulse, but where shadow regions and beamlets thereof are shifted with respect to those of the intensity pattern of the first radiation beam pulse in the X direction by a distance at least equal to the width of the shadow region 1401 (shown in FIG. 8A) by microtranslation of the sample 40 (shown in FIG. 1A) in the X direction or by microtranslation of the mask 150 (shown in FIG. 1A). In the present embodiment the sample 40 is microtranslated in the −X direction by a distance at least equal to the width of the shadow regions 1401, such that the shifted shadow regions 1408 (indicated by dashed lines in FIG. 8B) overlap respective regions having larger grains in each one of the solidification regions 1404. Each shifted shadow regions 1408 may overlap a region on either side of the first grain abutment boundary 1407 in each resolidification region 1404. Advantageously, the shifted shadow regions 1408 should be relatively close to the first grain abutment boundary 1407 in each resolidification region 1404, but should not overlap the first grain abutment boundary 1407.

Turning now to FIG. 8C, after shifting the intensity pattern, the metal layer 52 (shown in FIG. 1A) is irradiated by the second radiation pulse, which causes each region 1410 (shown in FIG. 8C) of the metal layer 52 overlapped by a respective one of the shifted beamlets 1409 to be melted throughout its entire thickness, while each region 1411 of the metal layer 52 overlapped by a respective one of the shifted shadow regions 1408 remains at least partially unmelted. Each one of the at least partially unmelted regions 1411 adjoins respective adjacent melted regions 1410.

Figure 8D:
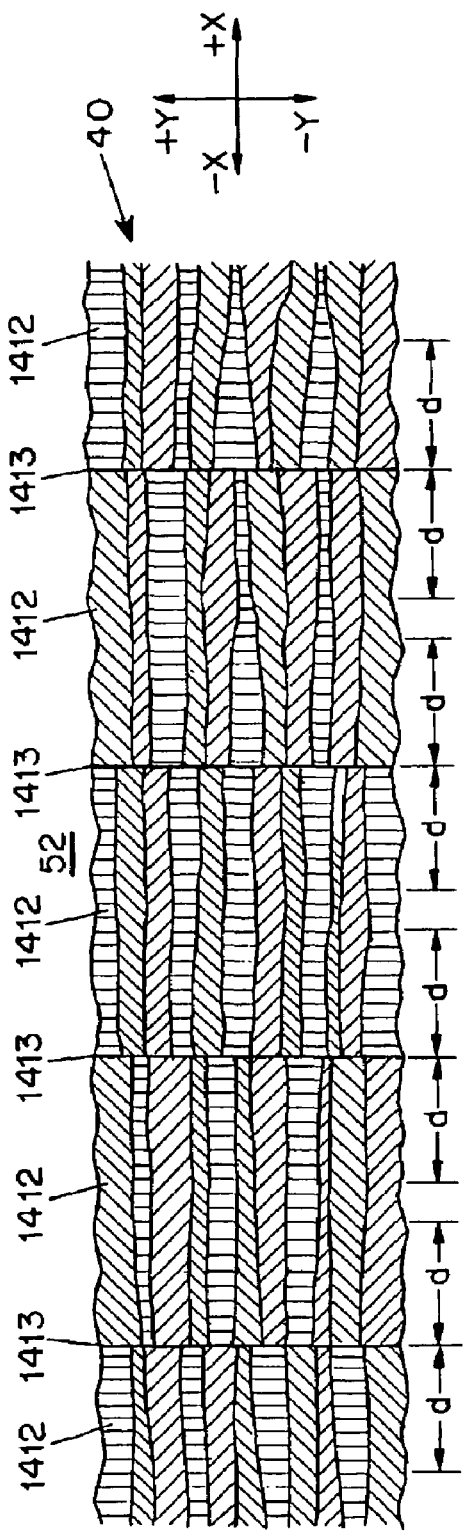

Referring to FIG. 8D, upon cooling and resolidification of the melted regions 1410, respective grains grow from each at least partially unmelted region 1411 in each adjoining melted region 1412. In each melted region 1410 respective grains 1412 grow from each adjoining at least partially unmelted region 1411 in opposite directions towards one another, and abut one another along a respective one of second grain abutment boundaries 1413 after the abutting grains having grown by the abutting grain growth distance, d. Each one of the second grain abutment boundaries 1413 is located approximately along the vertical (i.e., the ±Y directions) center line of a respective one of the melted regions 1410. Because the at least partially unmelted regions 1411 each contain relatively large grains having lateral grain boundaries extending generally along the horizontal direction (i.e., the ±X directions), the grains 1412 growing in opposite horizontal directions from each at least partially unmelted region 1411 will be seeded by such relatively large grains contained therein. As shown in FIG. 8D, the resulting grains 1412 are wider and longer, and extend between respective adjacent second grain abutment boundaries 1413.

As is apparent from the description of the present exemplary embodiment, the width of the melted regions 1402 and 1410 (as determined by the width of the beamlets 1400, 1409) after irradiation by the first and second radiation beam pulses, respectively, should be no greater than that which permits grains growing from the adjoining at least partially unmelted regions 1403 and 1411 to respectively reach the first and second grain abutment boundaries 1407 and 1413 before nucleation of new grains occur in the melted regions 1402 and 1410. Typically, each of the first and second radiation beam pulses provides a beamlet intensity in the range of 10 mJ/cm$^2$ to $10^4$ mJ/cm$^2$ with a pulse duration in the range of 10 nsec to $10^3$ nsec and a pulse repetition rate in the range of 10 Hz to $10^3$ Hz. It will be understood by those skilled in the art that the same result may be obtained by shifting the intensity pattern of the second radiation beam pulse in the −X direction. Except for the shifting of the shadow regions and the beamlets, the intensity pattern of the second radiation beam pulse is the same as that of the first radiation beam pulse.

It is noted that interconnect lines for an integrated circuit device may be advantageously formed from a metal layer having the grain structure shown in FIG. 8D by patterning the segments of the interconnect lines to be diagonally oriented with respect to the horizontal direction of the grain boundaries (e.g., oriented at ±45° with respect to the X axis) of the LS-processed metal layer in order to minimize electromigration.

Figure 9B:
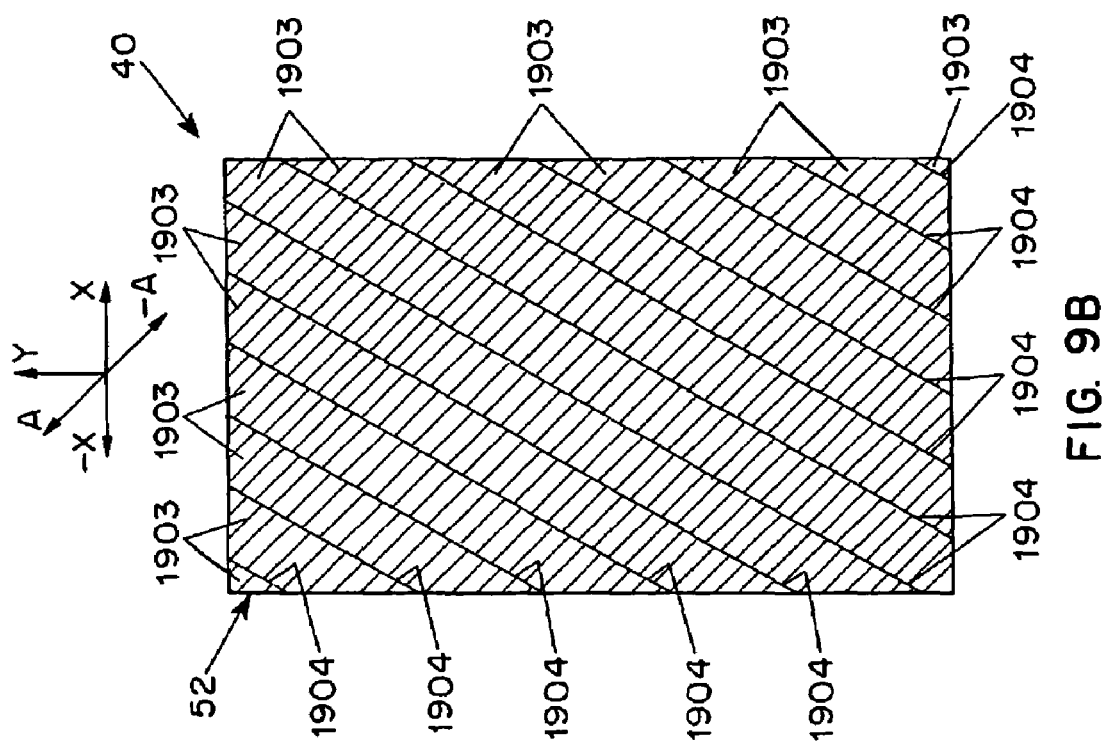
FIGS. 9A and 9B illustrate the radiation beam pulse intensity pattern and metal layer grain structure obtained using a variation of the fifth exemplary embodiment of the method of the present invention, in which the shadow regions and the beamlets of the radiation beam pulse intensity pattern are oriented diagonally with respect to the X and Y directions to obtain diagonally oriented grains that extend between respective adjacent grain abutment boundaries.
Figure 9A:
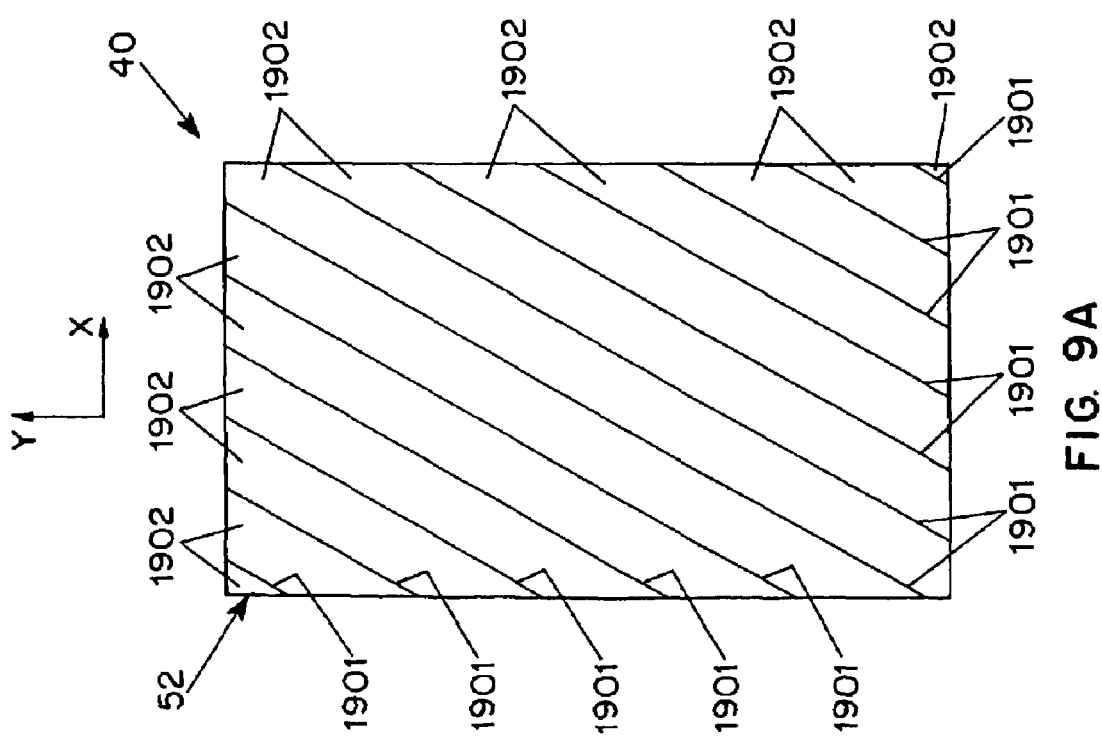

Referring to FIGS. 9A and 9B, the above-described LS process may be carried out using a pulsed radiation beam having an intensity pattern, as defined by the mask 150 (shown in FIG. 1A), in which the shadow regions 1901 and beamlets 1902 are oriented diagonally with respect to the X and Y directions, as shown in FIG. 9A. Then LS processing may be carried out using the same procedure as described above for vertically oriented (i.e., in the ±Y direction) shadow regions and beamlets, except that the intensity pattern of the second radiation beam pulses is shifted in a direction perpendicular to the diagonally oriented shadow regions 1901 and the beamlets 1902. In this manner, diagonal rows of relatively wide and long grains extending between respective adjacent ones of diagonally oriented second grain abutment boundaries 1904 are formed.

Referring now to FIGS. 10A-10E, there are illustrated the radiation beam pulse intensity pattern and metal layer grain structure at different stages of LS processing according to a sixth exemplary embodiment of the method of the present invention. The present exemplary embodiment is advantageously an extension of the fifth exemplary embodiment described above with reference to FIGS. 8A-8D. After completion of the LS processing according to the fifth exemplary embodiment to obtain the grain structure illustrated in FIG. 8D, the sample 40 having the metal layer 52 (shown in FIG. 1A) is rotated by 90° with respect to the second grain abutment boundaries 1413 to obtain the grain structure illustrated in FIG. 10A. After the 90° rotation, contiguous columns of relatively long and wide grains 1412 illustrated in FIG. 8D become contiguous rows of relatively long and wide grains 1412 depicted in FIG. 10A, and the vertically extending second grain abutment boundaries 1413 in FIG. 8D become horizontally extending second grain abutment boundaries 1413 in FIG. 10A. Each row of grains illustrated in FIG. 10A has a height of λ, which is approximately in the range of 2 μm to $10^3$ μm.

Figure 10A:
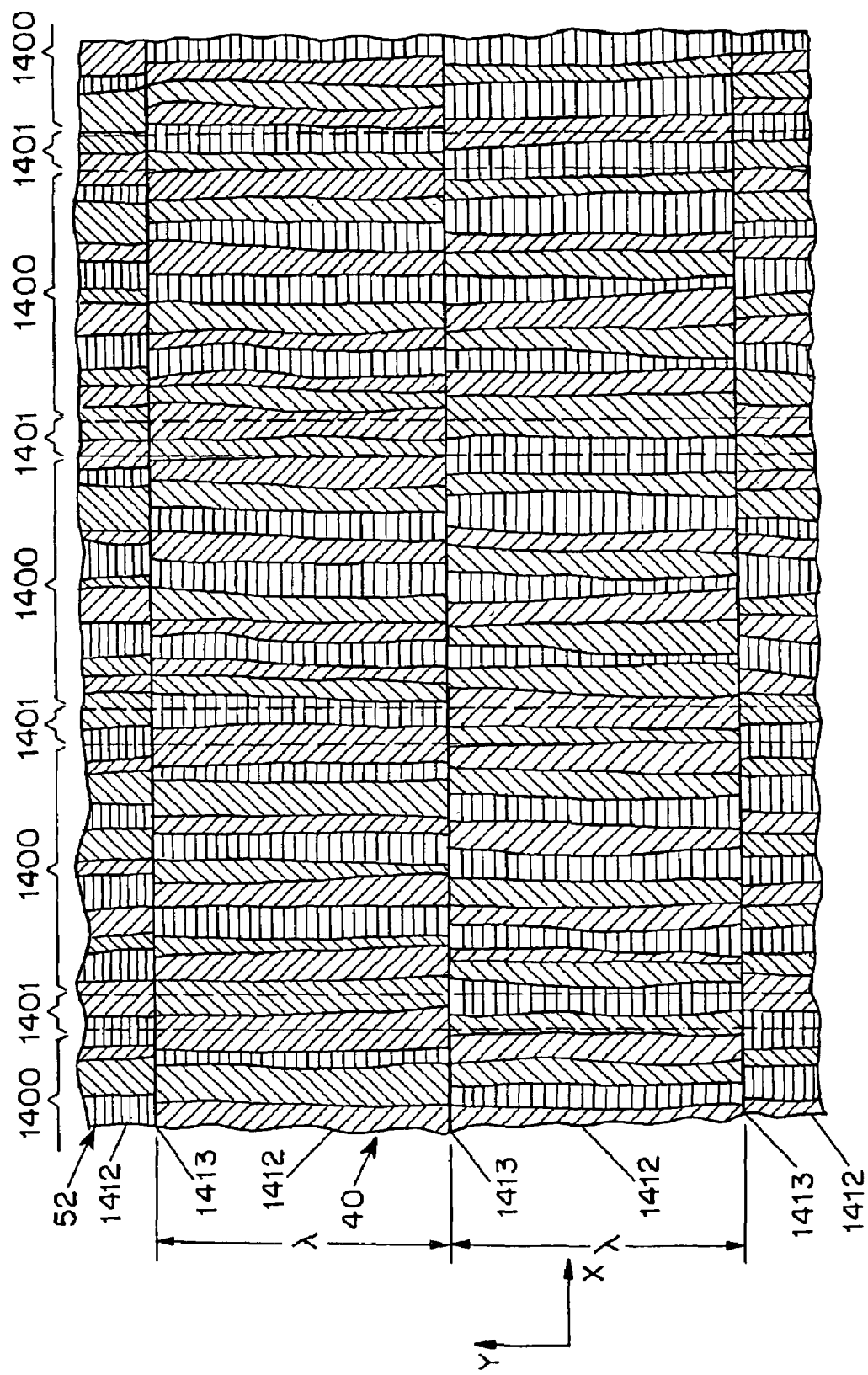
FIGS. 10A-10E illustrate the radiation beam pulse intensity pattern and the grain structure of a portion of a metal layer at various stages of LS processing according to a sixth exemplary embodiment of the method of the present invention, the sixth exemplary embodiment being an extension of the fifth exemplary embodiment.
Figure 10B:
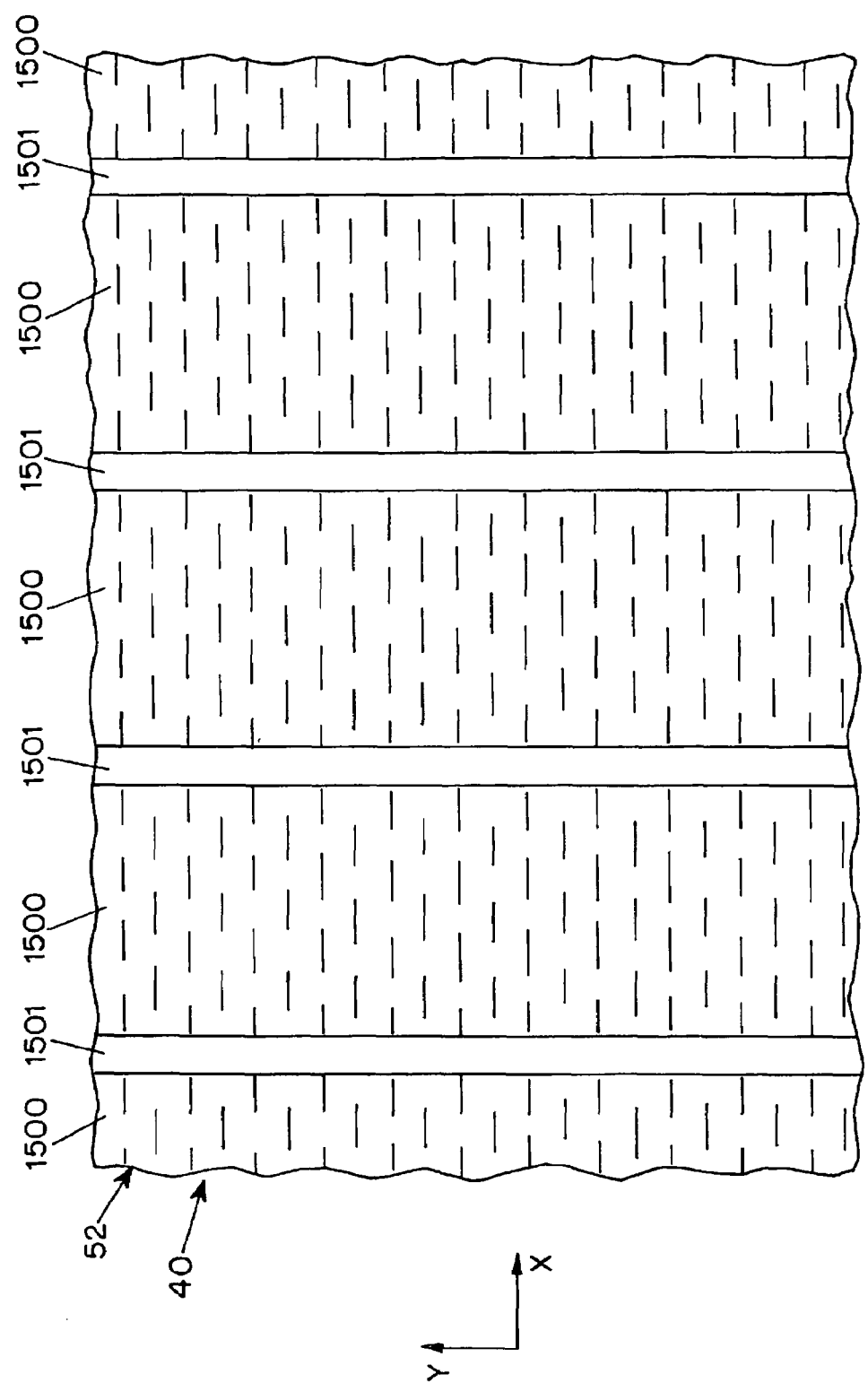

Referring to FIG. 10A, after the 90° rotation the metal layer 52 of the sample 40 (shown in FIG. 1A) is irradiated by a radiation beam pulse having the same intensity pattern as the first radiation beam pulse of the fifth exemplary embodiment illustrated in FIG. 8A, having regularly spaced, relatively wide, linear, stripe-like beamlets 1400 and regularly spaced, relatively narrow, linear, stripe-like shadow regions 1401, as indicated by dashed lines in FIG. 9A. Irradiation of the metal layer 52 of the sample 40 by the first radiation beam pulse after the 90° rotation causes each region 1500 of the metal layer 52 overlapped by a respective one of the beamlets 1400 to melt throughout its entire thickness, while each region 1501 overlapped by a respective one of the shadow regions 1401 remains at least partially unmelted, as illustrated in FIG. 10B. Each at least partially unmelted region 1501 adjoins adjacent melted regions 1500.

Figure 10C:
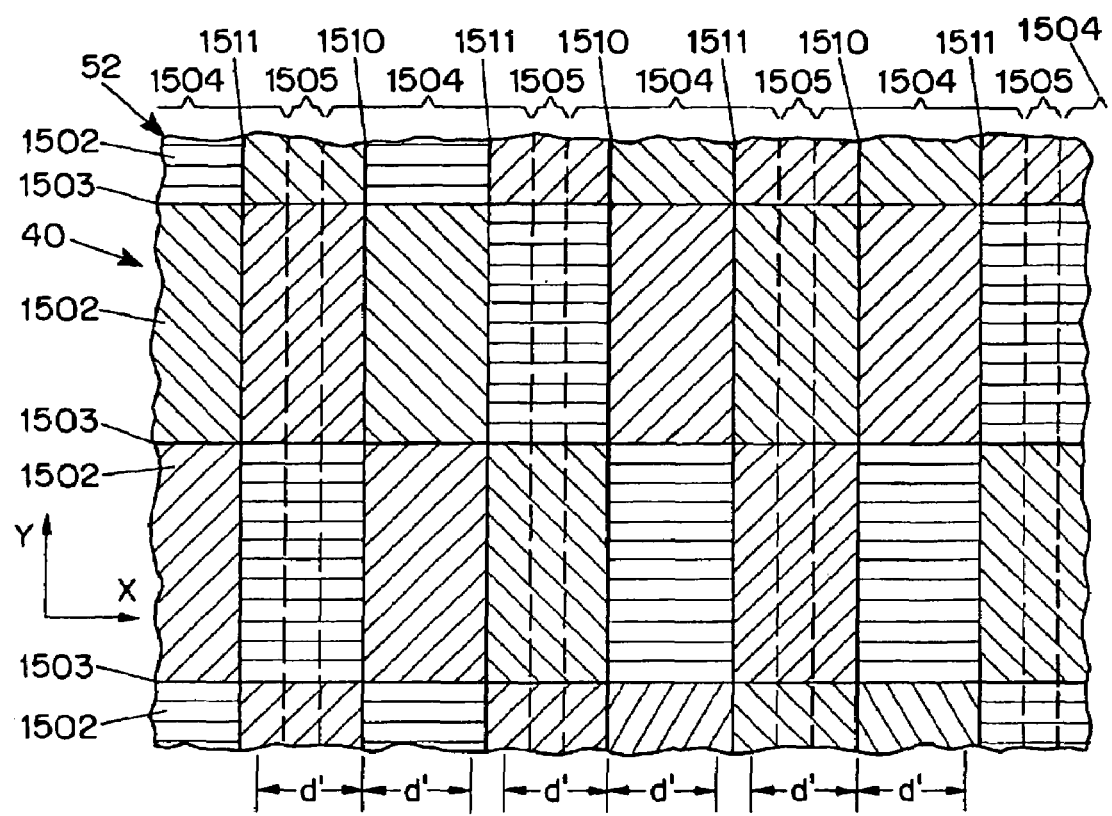

After irradiation by the first radiation beam pulse after the 90° rotation, each melted region of the metal layer 52 is permitted to cool and resolidify. During resolidification of each melted region 1500 of the metal layer 52, different single grains grow from each at least partially unmelted region 1501 in each adjoining melted region 1500. Referring to FIG. 10C, in each melted region 1500, respective single grains grow from adjoining at least partially unmelted regions 1501 in opposite directions towards one another until the grains abut one another along a respective one of the third grain abutment boundaries 1510 after the abutting grains have grown by a second abutting grain growth distance, d', of approximately half the width of the beamlets. The grain structure of the metal layer 52 after completion of resolidification following irradiation by the first radiation beam pulse is depicted in FIG. 10C. Because the width of each one of the shadow regions 1401 is sufficient to overlap two grains in each one of the rows of grains 1412 illustrated in FIG. 10A, the grain structure depicted in FIG. 10C consists of contiguous rows 1502 of large grains separated by horizontal grain abutment boundaries 1503. In each one of the rows 1502, the grains are separated by respective grain boundaries 1511 and respective vertical grain abutment boundaries 1510.

Figure 10D:
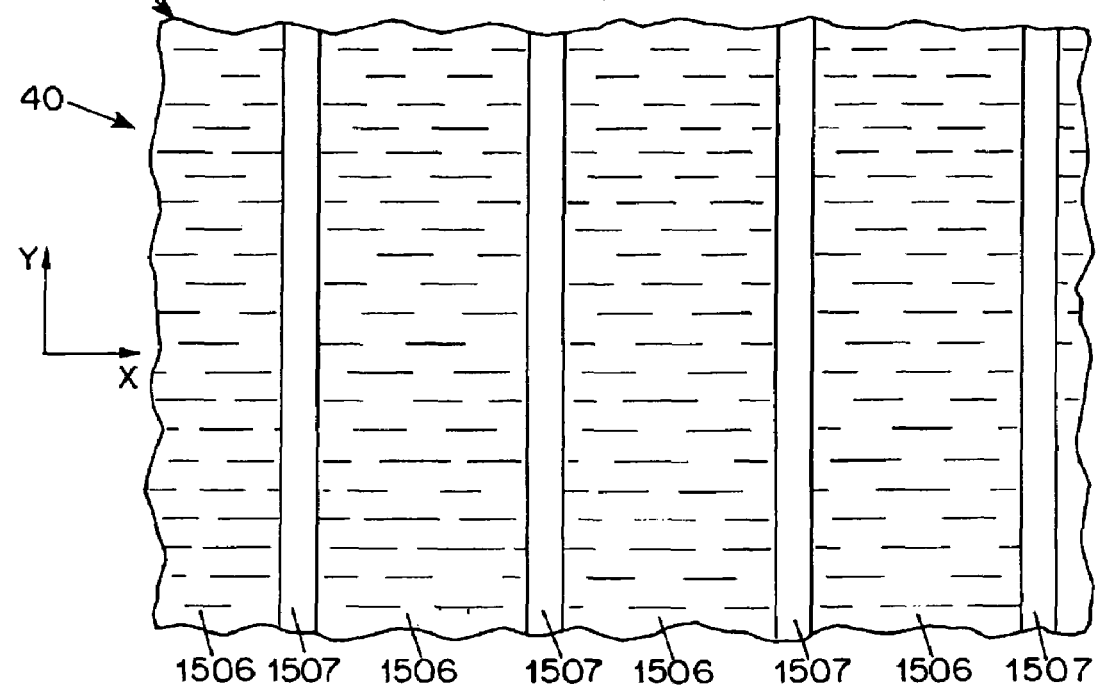
Figure 10E:
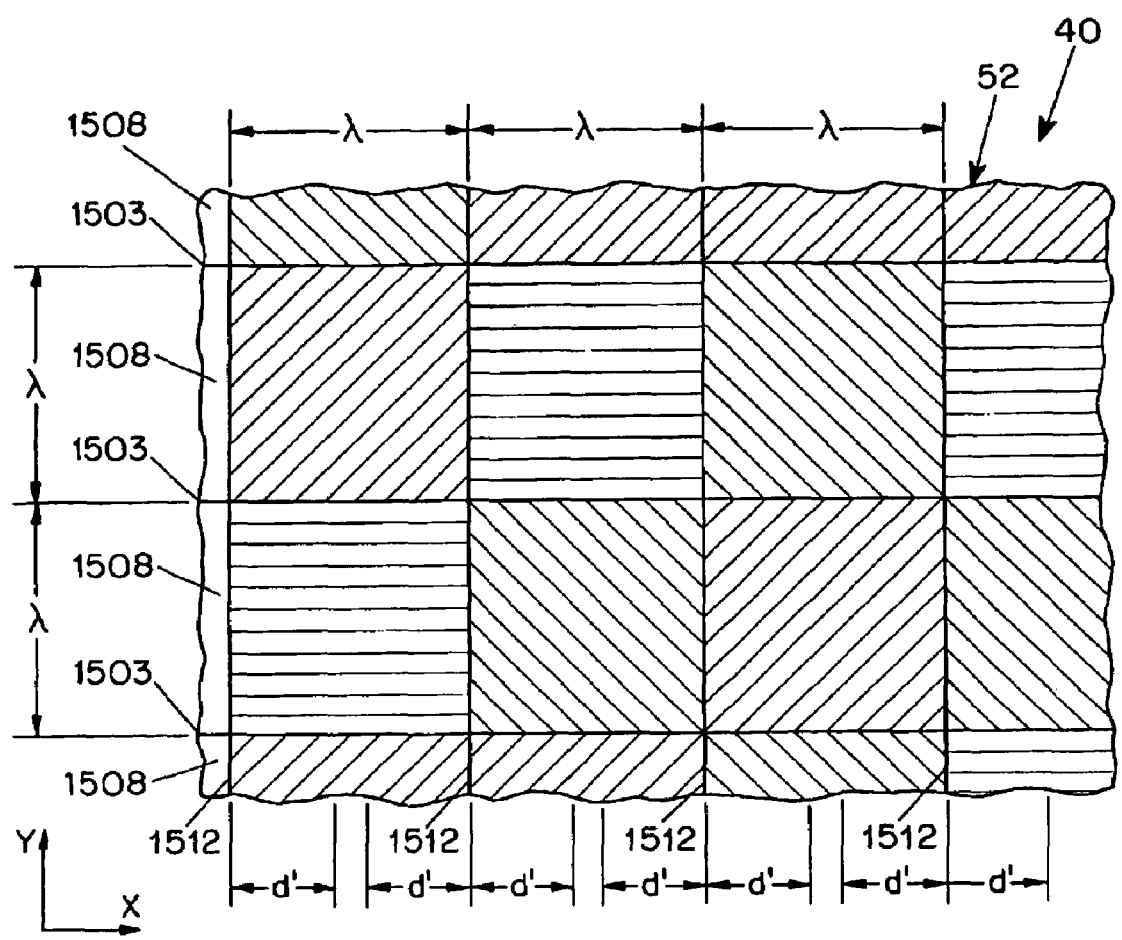

After completion of resolidification following irradiation by the first radiation beam pulse after the 90° rotation, the sample 40 or the mask 150 (both shown in FIG. 1A) is microtranslated so as to produce a horizontal shift of the intensity pattern of a second radiation beam pulse in the +X direction, for example. The shifted intensity pattern has shifted beamlets 1504 and shifted shadow regions 1505, as indicated by dashed lines in FIG. 10C. As shown in FIG. 10D, each region 1506 of the metal layer 52 (shown in FIG. 1A) overlapped by a respective one of the shifted beamlets 1504 is melted throughout its entire thickness, while each region 1507 overlapped by a respective one of the shifted shadow regions 1505 remains at least partially unmelted. Each at least partially unmelted region adjoins respective adjacent melted regions. As shown in FIG. 10C, each at least partially unmelted region 1507 contains a single grain in each one of the rows 1502. Therefore, as shown in FIG. 10E, when the melted regions 1506 (shown in FIG. 10D) resolidify, a respective single grain in each one of the rows 1502 grows laterally from each at least partially unmelted region 1507 in each adjoining melted region 1506, and in each melted region a respective pair of single grains in each one of the rows 1502 grow from adjoining at least partially unmelted regions in opposite directions towards one another, and abut one another along a respective one of fourth vertical grain abutment boundaries 1512 after the abutting grains have grown by the characteristic growth distance, d'. When resolidification after irradiation by the second radiation beam pulse following the 90° rotation is completed, the grain structure of the metal layer 52 is illustrated in FIG. 10E. As shown in FIG. 10E, the resulting grain structure consists of rows 1508 of generally square single grain regions having dimensions λ×λ, each single grain region being bounded by respective ones of the horizontal grain abutment boundaries 1503 and respective ones of the second vertical grain abutment boundaries 1512, where λ is the distance between adjacent ones of the second grain abutment boundaries 1413 shown in FIG. 10A. The typical radiation beam pulse intensity, pulse duration and pulse repetition interval are the same as for the fifth exemplary embodiment.

Figure 11A:
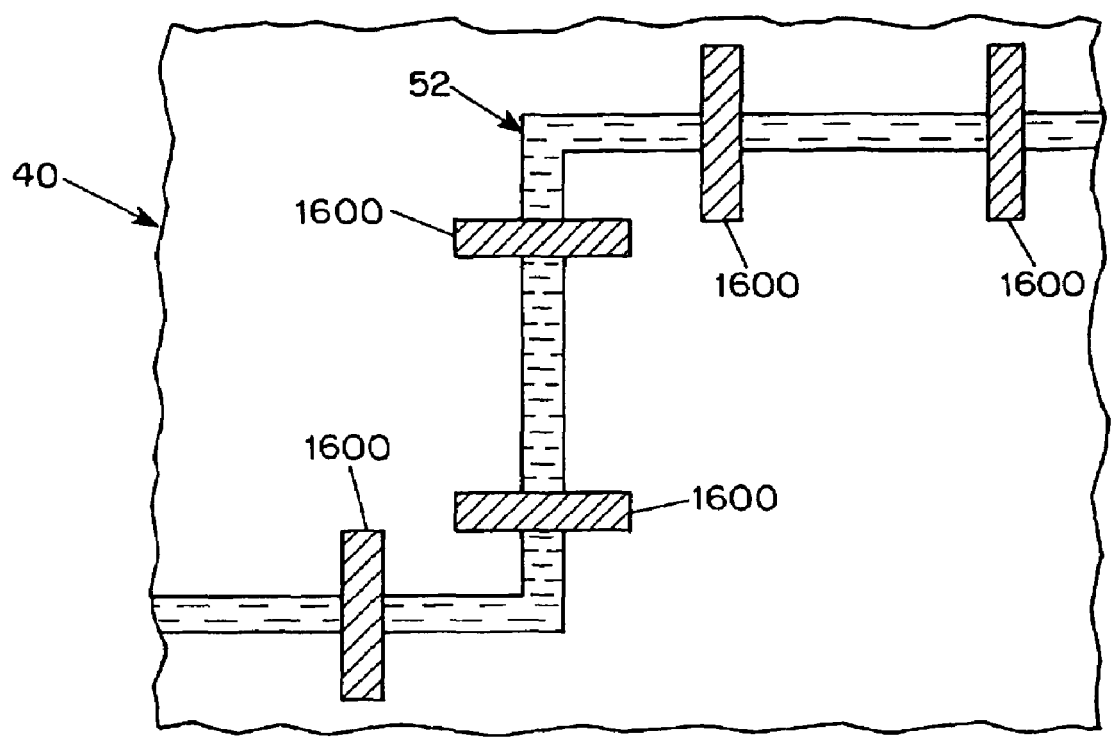
FIGS. 11A-11D illustrate the radiation beam pulse intensity pattern and the grain structure of a metal layer strip at various stages of LS processing according to a seventh exemplary embodiment of the method of the present invention, in which the intensity pattern of the radiation beam pulses has a plurality of relatively narrow, linear, stripe-like shadow regions overlapping the metal layer strip at regular intervals and a beamlet overlapping all regions of the metal layer strip not overlapped by the shadow regions.

Turning now to FIGS. 11A-11D, there are illustrated the radiation beam pulse intensity pattern and the metal layer grain structure at different stages of LS processing according to a seventh exemplary embodiment of the method of the present invention. Referring to FIG. 11A, a sample 40 has disposed thereon a metal layer 52 which has been prepatterned into a relatively narrow strip having a width, for example, in the range of 0.1 μm to 10 μm. The metal layer strip 52, which is formed of copper, for example, and which has a predefined contour conforming to the Manhattan geometry, is irradiated by a first radiation beam pulse having an intensity pattern that includes a plurality of relatively narrow, linear, stripe-like shadow regions 1600 positioned to overlap the metal layer strip 52 at regularly spaced intervals along the predefined contour. The intensity pattern of the first radiation beam pulse also includes a beamlet that overlaps all regions of the metal layer strip 52 that are not overlapped by a respective one of the shadow regions 1600. The shadow regions 1600 advantageously have a width in the range of less than 1 µm to 10 µm and a length in the range of 2 µm to 100 µm sufficient to completely overlap the width of the metal layer strip 52 after the intensity pattern of the radiation beam pulse has been shifted, as described hereinbelow.

Figure 11B:
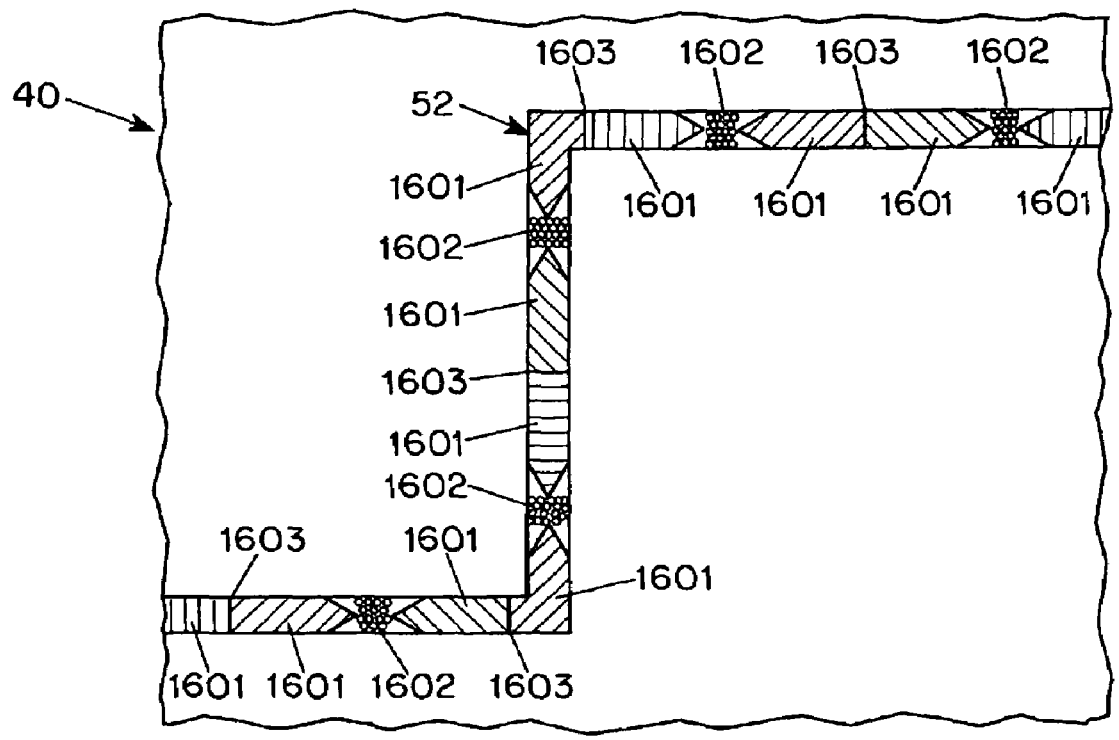

When the metal layer strip 52 is irradiated by the first radiation beam pulse, each region of the metal layer strip overlapped by the beamlet is melted throughout its entire thickness, while each region of the metal layer strip overlapped by a respective one of the shadow regions 1600 remains at least partially unmelted. Each at least partially unmelted region adjoins respective adjacent melted regions, and contains small grains with randomly oriented grain boundaries of the metal layer strip 52 as originally formed. After irradiation by the first radiation beam pulse, each melted region is permitted to cool and resolidify. Referring to FIG. 11B, during resolidification of each melted region, grains 1601 grow laterally from each one of the at least partially unmelted regions in adjoining melted regions. Here, because of the narrowness of the metal layer strip 52, only single grains 1601 can grow in the metal layer strip 52. Therefore, single grains 1601 grow from each one of the at least partially unmelted regions 1602 of the metal layer strip 52 in each adjoining melted region, and in each melted region respective grains 1601 grow from adjoining melted regions in opposite directions towards one another, and abut one another at a respective one of a plurality of first grain abutment boundaries 1603.

The grain structure of the metal layer strip 52 after completion of resolidification following irradiation by the first radiation beam pulse is represented in FIG. 11B. As shown in FIG. 11B, the grain structure of each at least partially unmelted region 1602 of the metal layer strip 52 has clusters of small grains with randomly oriented grain boundaries, while the grain structure of each resolidified region has relatively long grains 1601 grown from adjoining at least partially unmelted regions 1602 in opposite directions towards one another so as to abut at a respective one of a plurality of first grain abutment boundaries 1603 after the abutting grains have grown by an abutting grain growth distance of approximately half the distance between adjacent shadow regions 1600 along the contour of the metal strip 52.

Figure 11C:
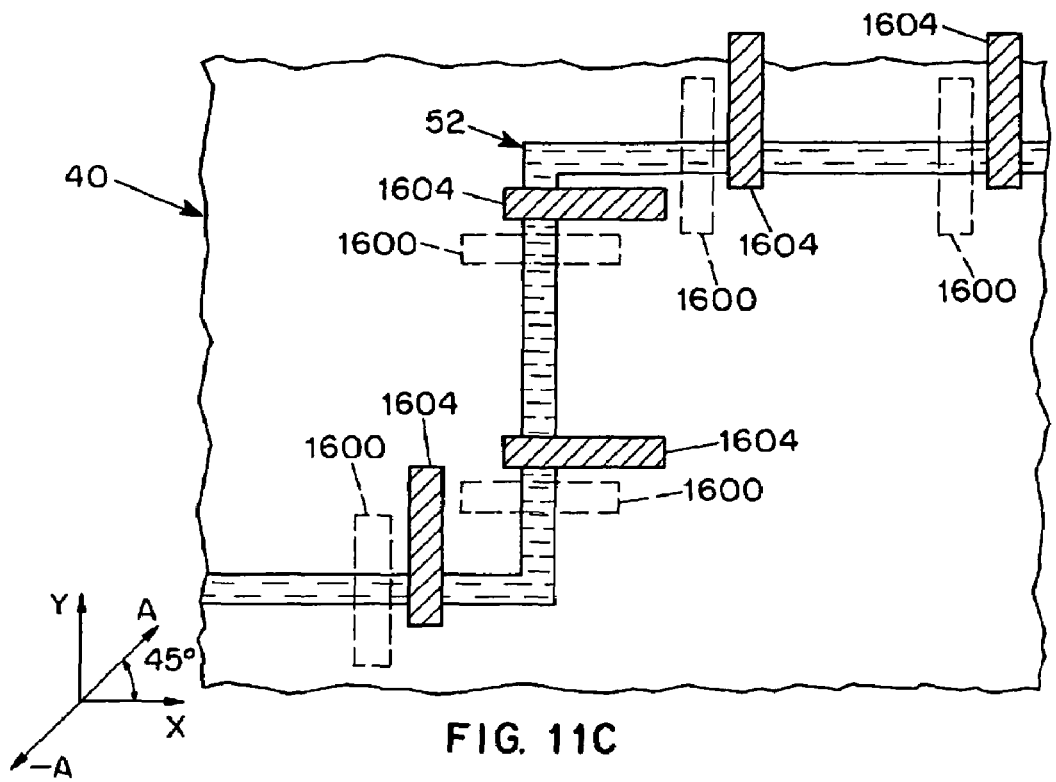

Turning now to FIG. 11C, after completion of resolidification following irradiation by the first radiation beam pulse, the metal layer strip 52 is irradiated by a second radiation beam pulse having the same intensity pattern as the first radiation beam pulse, but where the shadow regions 1604 thereof are shifted with respect to those of the intensity pattern of the first radiation beam pulse so that each shifted shadow region overlaps a respective one of the single grain regions 1601 of the metal layer strip 52. While the beamlet of the intensity pattern of the second radiation beam pulse is also shifted, it still overlaps all regions of the metal layer strip 52 not overlapped by a respective one of the shifted shadow regions 1604. In the present exemplary embodiment, the shifting of the shadow regions 1604 and the beamlet with respect to the metal layer strip 52 is achieved by microtranslating the sample 40 (shown in FIG. 1A) in a diagonal direction (e.g., in the A direction oriented at 45° relative to the X axis) with respect to the segments of the metal layer strip 52.

In the alternative, the shifting of the shadow regions 1604 may also be achieved by microtranslating the mask 150 (shown in FIG. 1A) instead of microtranslating the sample 40.

When the metal layer strip 52 is irradiated by the second radiation beam pulse, each region of the metal layer strip 52 overlapped by the shifted beamlet is melted throughout its entire thickness, while each region of the metal layer strip overlapped by a respective one of the shadow regions 1604 remains at least partially unmelted. Each at least partially unmelted region adjoins respective adjacent melted regions and contains a respective single grain. After irradiation by the second radiation beam pulse, each melted region of the metal layer strip 52 is permitted to cool and resolidify. During resolidification, the respective single grain in each at least partially unmelted region grows in each adjoining melted region, and in each melted region respective single grains grow from adjoining at least partially unmelted regions in opposite directions towards one another and abut one another at a respective one of second grain boundaries 1606 after the abutting grains have grown by the abutting grain growth distance.

Figure 11D:
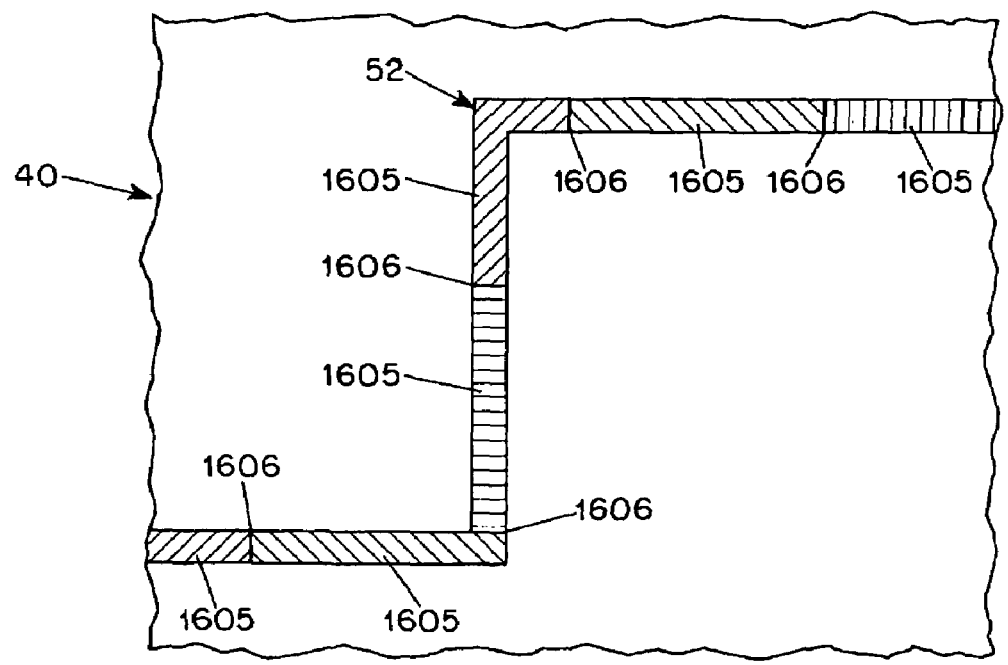

The grain structure of the metal layer strip 52 after completion of resolidification following the second radiation beam pulse is illustrated in FIG. 11D. The grain structure consists of single grain regions 1605 abutting at respective second grain abutment boundaries 1606, the second grain abutment boundaries 1606 being substantially perpendicular to the metal layer strip 52 at respective locations of the boundaries 1606. Advantageously, in the foregoing exemplary embodiment, the radiation beam pulses provide a beamlet intensity in the range of 10 mJ/cm$^2$ to 10$^4$ mJ/cm$^2$ with a pulse duration in the range of 10 nsec to 10$^3$ nsec and a pulse repetition rate in the range of 10 Hz to 10$^3$ Hz. Except for the shifting of the shadow regions and the beamlets of the intensity pattern of the second radiation beam pulse with respect to those of the intensity pattern of the first radiation beam pulse, the intensity patterns of the first and second radiation beam pulses are the same.

Figure 12A:
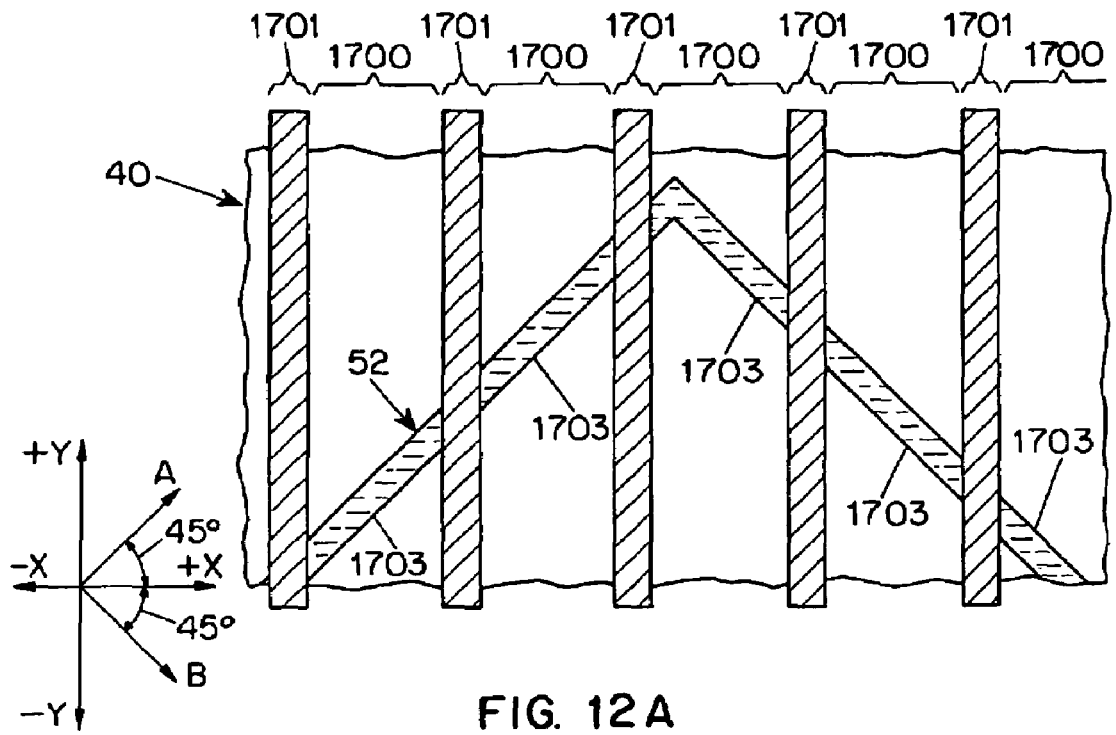
FIGS. 12A-12D illustrate the radiation beam pulse intensity pattern and the grain structure of a metal layer strip having a right angle bend at various stages of LS processing according to an eighth exemplary embodiment of the method of the present invention, in which the intensity pattern of the pulsed radiation beam has regularly spaced, relatively narrow, linear, stripe-like shadow regions and regularly spaced relatively wide, linear, stripe-like beamlets, each one of the beamlets being positioned in between and adjoining respective adjacent shadow regions, each segment of the metal layer strip being oriented diagonally with respect to the shadow regions and beamlets.

Referring to FIGS. 12A-12D, there are illustrated the radiation beam pulse intensity pattern and the metal layer grain structure at different stages of LS processing according to an eighth exemplary embodiment of the method of the present invention. In FIG. 12A there is shown a portion of the substrate 40 having a metal layer 52 which is formed of copper, for example, and which has been patterned into a strip having a right angle bend. Advantageously, the metal layer strip 52 has a width of 10 µm or narrower and is representative of metal layer interconnect lines of modern integrated circuit devices, in which the metal interconnect lines are laid out to have the Manhattan geometry.

The metal layer strip 52 is irradiated by a first radiation beam pulse having an intensity pattern, as defined by the mask 150 (shown in FIG. 1A), that includes a plurality of regularly spaced-apart, relatively wide, linear, stripe-like beamlets 1700 and a plurality of regularly spaced-apart, relatively narrow, linear, stripe-like shadow regions 1701 with both the shadow regions 1701 and the beamlets 1700 extending along the Y direction. Each one of the beamlets 1700 is positioned in between and adjoining respective adjacent shadow regions 1701. Each right angle segment of the metal layer strip 52 is oriented diagonally with respect to the shadow regions 1701 and beamlets 1700. Preferably, each right angle segment of the metal layer strip 52 is oriented either in the A direction (i.e., at 45° with respect to the X axis) or in the B direction (i.e., at −45° with respect to X axis). Advantageously, the width of the beamlets 1700 is in the range of less than 1 µm to 100 µm, and the width of the shadow regions 1701 is in the range of less than 1 g/m to 10 μm. Upon irradiation by the first radiation beam pulse, each region 1703 of the metal layer strip 52 overlapped by respective ones of the beamlets 1700 is melted throughout its entire thickness, while each region of the metal layer strip 52 overlapped by a respective one of the shadow regions 1701 remains at least partially unmelted. Each at least partially unmelted region adjoins respective adjacent melted regions, and contains small grains with randomly oriented grain boundaries of the metal layer strip 52 as it was originally formed.

Following irradiation by the first radiation beam pulse, each melted region 1703 of the metal layer strip 52 is permitted cool and resolidify. During such resolidification, single grains grow from each at least partially unmelted region of the metal layer strip 52 in each adjoining melted region 1703, and in each melted region respective single grains grow from adjoining at least partially unmelted regions in opposite directions towards one another, and abut one another at a respective one of a plurality of first grain abutment boundaries 1706 after the abutting grains have grown by an abutting grain growth distance of approximately half the distance between adjacent shadow regions 1701 along the contour of the metal strip 52. Because of the narrowness of the metal layer strip 52, only single grains can grow in the strip.

Figure 12B:
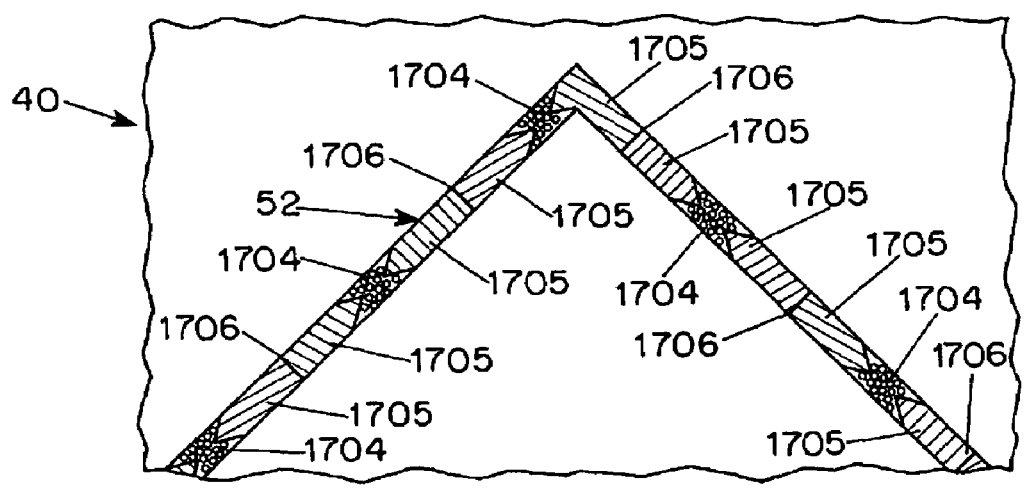

The grain structure of the metal layer strip 52 after completion of resolidification following irradiation by the first radiation beam pulse is illustrated in FIG. 12B. Referring to FIG. 12B, the grain structure comprises clusters of small grains having randomly oriented grain boundaries in each at least partially unmelted region 1704, single grain regions 1705 grown in melted regions 1703 adjoining respective at least partially unmelted regions 1704, and first grain abutment boundaries 1706 where respective single grains 1705 growing in opposite directions in the melted regions 1703 abut one another.

Figure 12C:
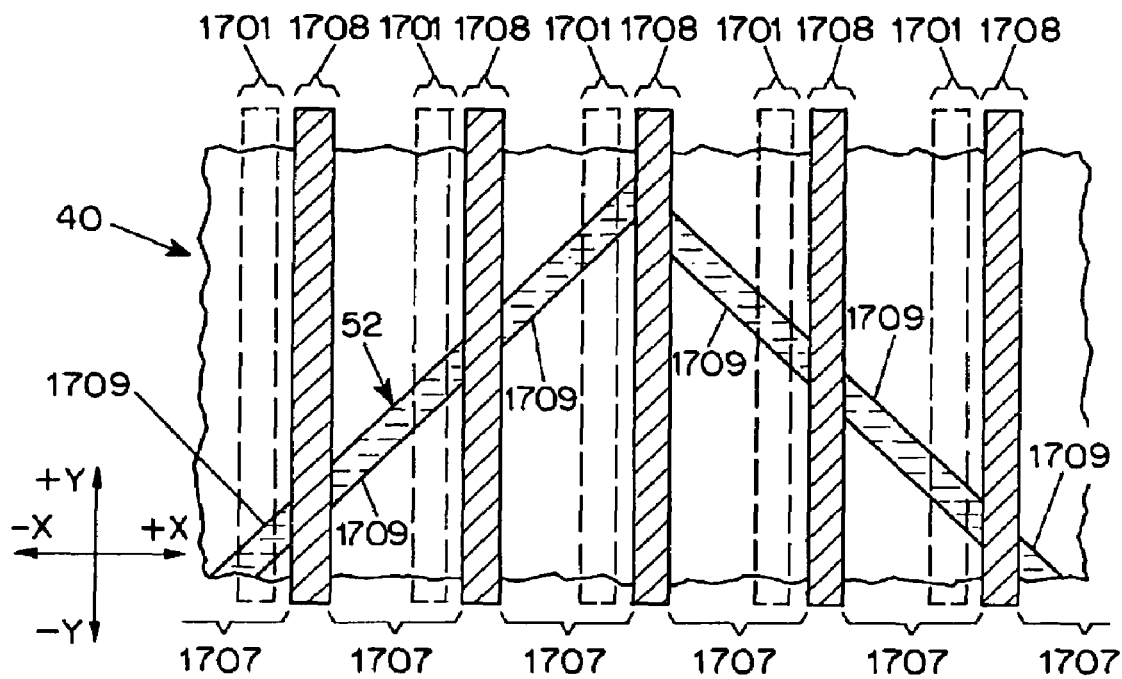

Turning now to FIG. 12C, after completion of resolidification following irradiation by the first radiation beam pulse, the metal layer strip 52 is irradiated by a second radiation beam pulse having the same intensity pattern as the first radiation beam pulse, but where the beamlets 1707 and the shadow regions 1708 are shifted with respect to those of the intensity pattern of the first radiation beam pulse in a direction perpendicular to the beamlets and shadow regions by a distance at least equal to the width of the shadow regions 1701 and 1708 but less than the distance that would cause the shadow regions 1708 to overlap the first grain abutment boundary 1706. In this manner, each shifted shadow region 1708 overlaps a respective one of the single grain regions 1705 (shown in FIG. 12B). In the present exemplary embodiment, shifting of the intensity pattern is in the +X direction, and is obtained by microtranslating the sample 40 in the −X direction. Alternatively, the intensity pattern (i.e., the beamlets 1707 and the shadow regions 1708) may be shifted in the −X direction by translating the sample 40 in the +X direction. As a further alternative, the mask 150 (shown in FIG. 1A) may be microtranslated instead of the sample to shift the intensity pattern of the second radiation beam pulse in either the X direction or the −X direction.

Upon irradiation by the second radiation beam pulse, each region of the metal layer strip 52 overlapped by a respective one of the shifted beamlets 1707 is melted throughout its entire thickness, while each region of the metal layer strip 52 overlapped by a respective one of the shadow regions 1708 remains at least partially unmelted. Each at least partially unmelted region adjoins respective adjacent melted regions and contains a respective single grain region. After irradiation by the second radiation beam pulse, each melted region of the metal layer strip 52 is permitted to cool and resolidify. During resolidification of each melted region 1709, the respective single grain in each at least partially unmelted region grows in each adjoining melted region 1709, and in each melted region, respective single grains grow from adjoining at least partially unmelted regions in opposite directions towards one another, and abut one another at a respective one of a plurality of second grain abutment boundaries 1711, as shown in FIG. 12D.

Figure 12D:
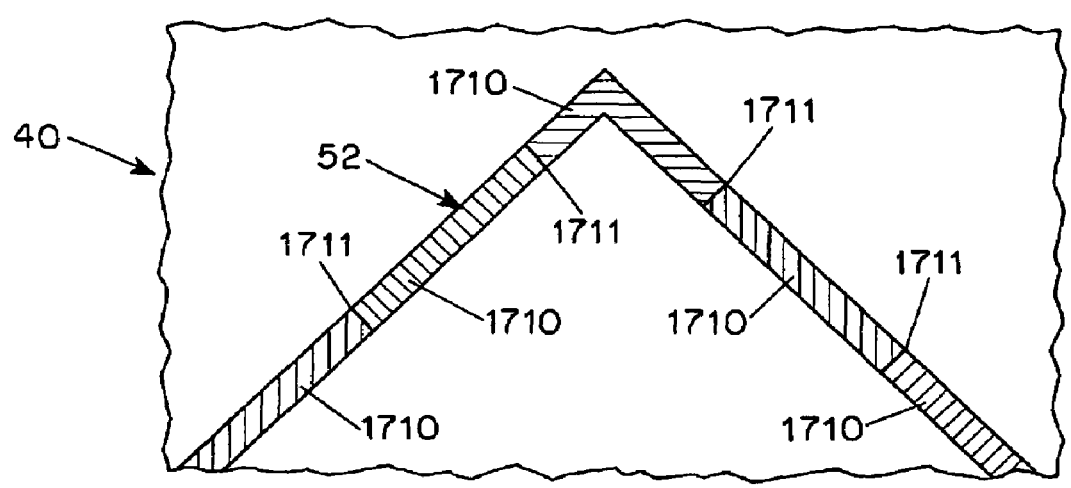

The grain structure of the metal layer strip 52 after completion of resolidification following the second radiation beam pulse is depicted in FIG. 12D. The grain structure shown comprises single grain regions 1710 that extend between respective adjacent second grain abutment boundaries 1711, each second grain abutment boundary 1711 being diagonally oriented at approximately 45° with respect to the metal layer strip 52 at the location of the boundary 1711. Advantageously, in the foregoing exemplary embodiment, each radiation beam pulse provides a beamlet intensity in the range of 10 mJ/cm$^2$ to $10^4$ mJ/cm$^2$ with a pulse duration in the range of 10 nsec to $10^3$ nsec and a pulse repetition rate in the range of 10 Hz to $10^3$ Hz.

The exemplary embodiment illustrated in FIGS. 12A-12D may be applied to a multiplicity of prepatterned metal layer strips having the Manhattan geometry, such as the interconnect lines of a partially fabricated integrated circuit device, of multiple partially fabricated integrated circuit devices or of all partially fabricated integrated circuit devices on an entire wafer, at the same time.

Figure 13A:
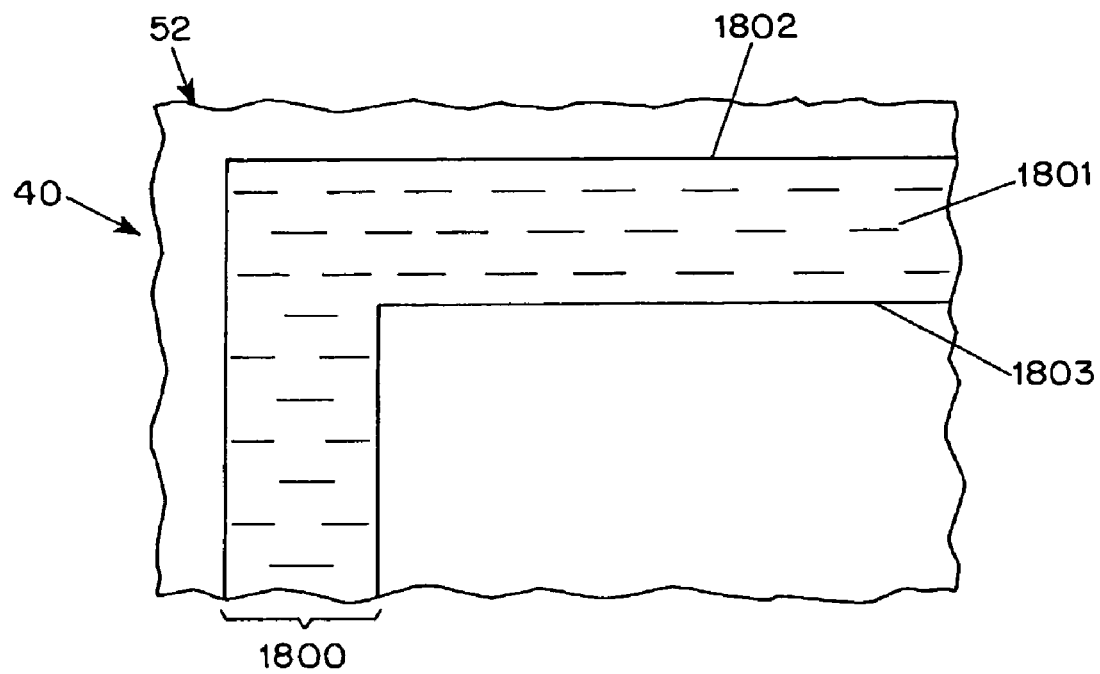
FIGS. 13A-13C illustrate different stages of formation of a metal layer strip having single grain regions separated by grain boundaries that are at large angles with respect to the metal layer strip at respective locations of the grain boundaries according to a ninth exemplary embodiment of the method of the present invention.
Figure 13B:
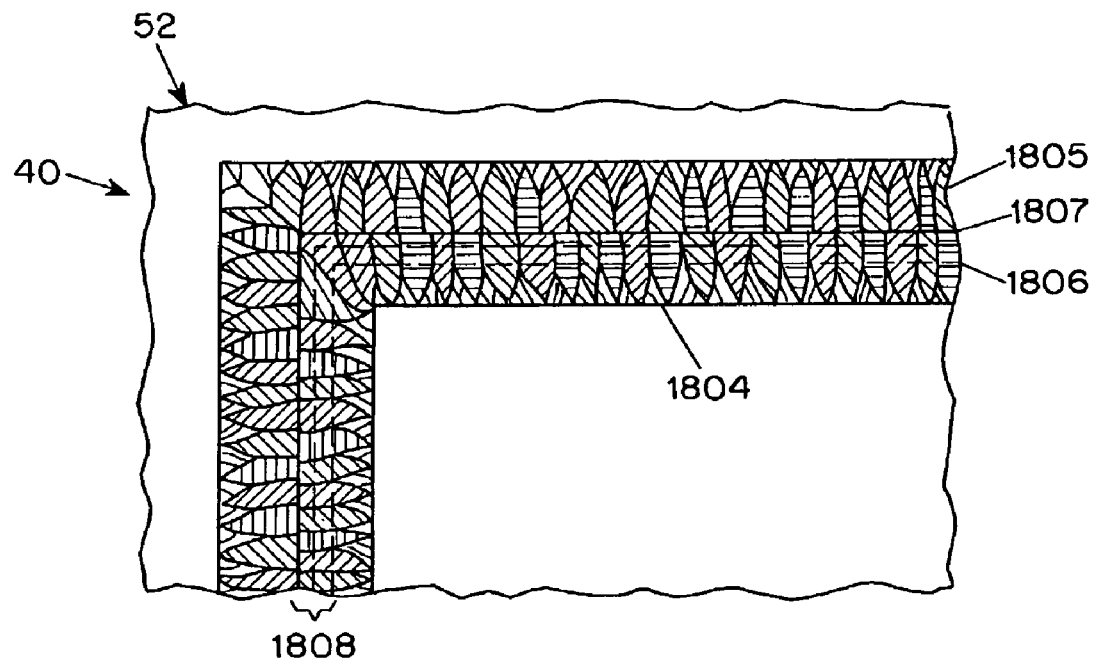
Figure 13C:
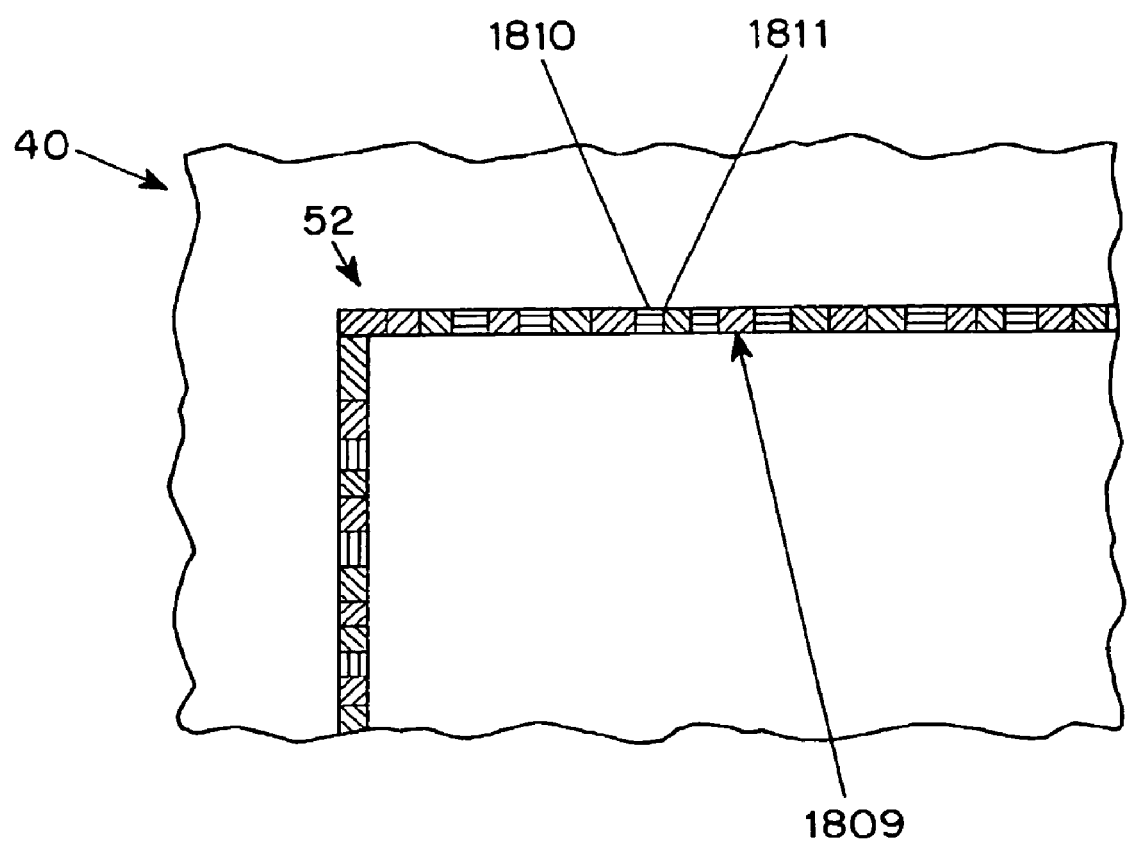

Referring to FIGS. 13A-13C, there are illustrated the radiation beam pulse intensity pattern and metal layer grain structure at different stages of LS processing according to a ninth exemplary embodiment of the method of the present invention. In the present exemplary embodiment, a metal layer strip, which is formed of copper, for example, having single grain sections and grain boundaries forming large angles with respect to the direction of the metal layer strip, is formed by irradiating a metal layer 52 on a sample 40 (both shown in FIG. 1A) with a radiation beam pulse having an intensity pattern that includes a beamlet that conforms to the same contour as the metal layer strip to be formed, but which is wider than the metal layer strip. As shown in FIG. 13A, a portion of a metal layer 52 is irradiated by a radiation beam pulse having an intensity pattern that includes a stripe-like beamlet 1800 having a right angle bend and a shadow region that overlaps all regions of the metal layer not overlapped by the beamlet 1800. A region 1801 of the metal layer 52 overlapped by the beamlet 1800 is melted throughout its entire thickness, while each region overlapped by the shadow region remains at least partially unmelted. The melted region 1801 adjoins adjacent at least partially unmelted regions along its two edges 1802 and 1803. Advantageously, the width of the beamlet 1800 is in the range of 1 μm to 10 μm for forming a metal layer strip having a width in the range of 0.1 μm to 10 μm.

Following irradiation by the radiation beam pulse, the melted region 1801 of the metal layer 52 is permitted to cool and resolidify. During resolidification of the melted region 1801, grains grow laterally in the melted region 1801 from its two at least partially unmelted edges 1802 and 1803. As illustrated in FIG. 13B, two rows of grains 1805 and 1806 growing laterally towards one another from the opposing edges 1802 and 1803, respectively, abut one another along a grain abutment boundary 1807 that approximately coincides with the center line of the melted region 1801 so as to form a resolidification region 1804.

After the melted region 1801 of the metal layer 52 has fully resolidified, the grain structure of the resulting resolidification region 1804 as illustrated in FIG. 13B, has two rows of grains 1805 and 1806 which abut along the grain abutment boundary 1807. A relatively narrow metal layer strip is formed by patterning the metal layer 52 having resolidification region 1804. In the present exemplary embodiment, a strip like region 1807 (indicated by dashed lines in FIG. 13B) in the lower row of grains 1806 close to but not overlapping the grain abutment boundary 1807 is formed by conventional photolithography and etching of the metal layer 52.

The metal layer strip 1809 obtained after patterning of the metal layer 52 is shown in FIG. 13C. As shown in FIG. 13C, the metal layer strip 1809 consists of single grain sections 1810 separated from one another by grain boundaries 1811 which generally form large angles (i.e., close to 90°) with respect to the metal layer strip 1809 at respective locations of the grain boundaries 1811. In the foregoing exemplary embodiment, the radiation beam pulse provides a beamlet intensity in the range of 10 mJ/cm$^2$ to $10^4$ mJ/cm$^2$ with a pulse duration in the range of 10 nsec to $10^3$ nsec.

While the present exemplary embodiment forms the metal layer strip 1809 from a strip-like region 1808 in the lower row of grains 1806, it is noted that a similar metal layer strip may be formed from a strip-like region in the other row of grains 1805. It is also noted that while the width of the beamlet in the exemplary embodiment is sufficiently narrow so that the two rows of grains 1805 and 1806 of the resolidification region 1804 abut at the grain abutment boundary 1807, a wider beamlet 1800 may be used to melt a wider region 1801 of the metal layer 52 so that growth of the rows of grains 1805 and 1806 do not abut one another before the melted region is completely resolidified. In such circumstances the two rows of grains 1805 and 1806 are separated by a fine grain metal layer region formed by nucleation (not shown) extending along the central portion of the resolidification region, and the metal layer strip 1809 may be formed from strip-like regions in either one of the two non-abutting rows of grains 1805 and 1806. The characteristic growth distance of each of the two non-abutting rows of grains 1805 and 1806 depends primarily on the thermal evolution of the melted metal region 1801. Advantageously, the strip-like region from which the metal layer strip 1809 is formed lies close to but does not overlap the fine grain region (not shown) separating the two rows of grain 1805 and 1806.

Figure 14:
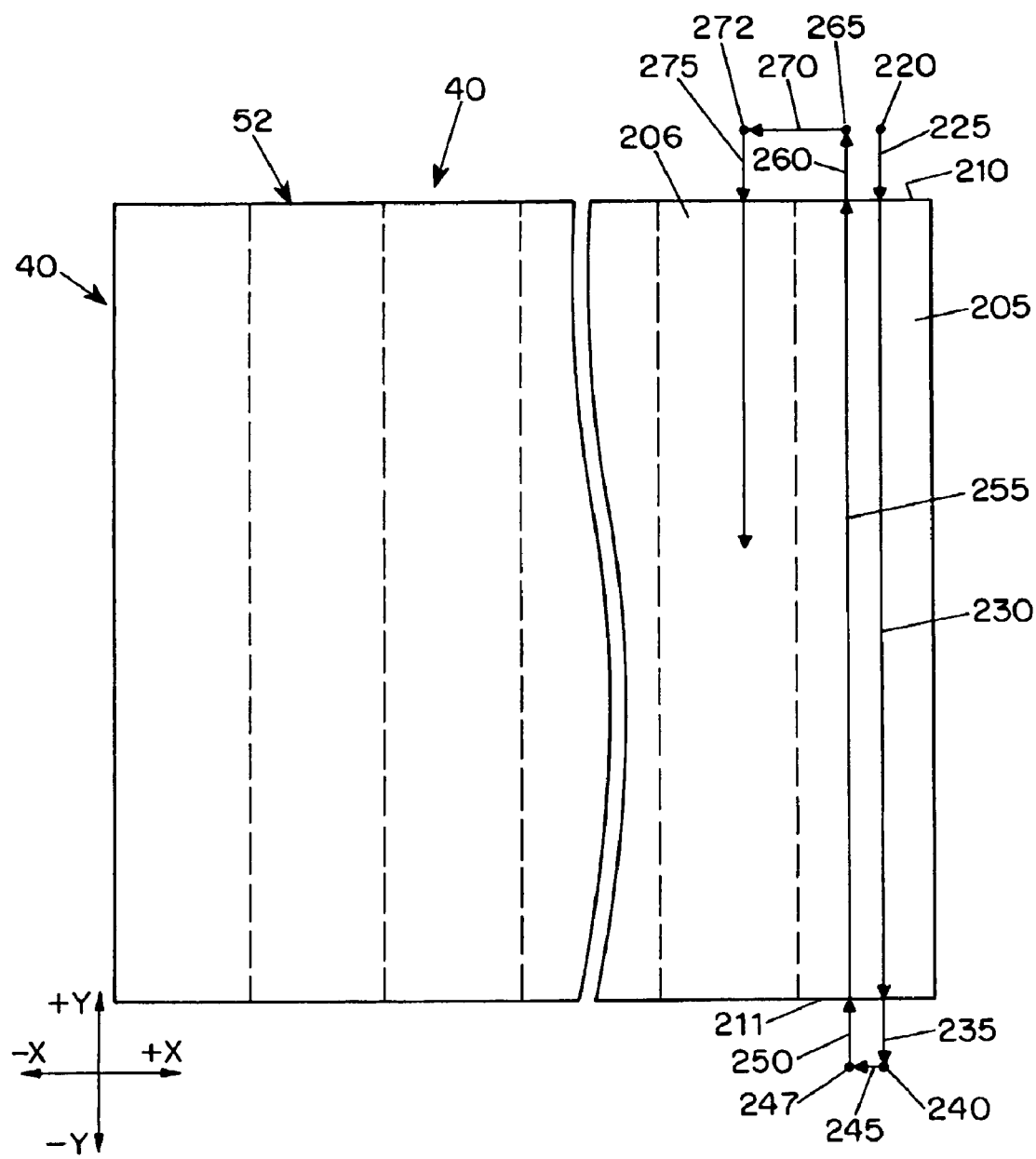
FIG. 14 illustrates a metal layer undergoing continuous LS processing according to a tenth exemplary embodiment of the method of the present invention, where for simplicity of the depiction the positions and irradiation paths of the stationary pulsed radiation beam are shown in the frame of reference of the translating sample.

Referring to FIGS. 14 and 15A-15G, there are illustrated the irradiation paths, the radiation beam pulse intensity pattern and metal layer grain structure at different stages of LS processing according to a tenth exemplary embodiment of the method of the present invention. Turning first to FIG. 14, there is shown a sample 40 having a metal layer 52 formed of copper, for example, disposed thereon. Referring back to the apparatus illustrated in FIG. 1A, the sample 40 is placed on the sample translation stage 180, which is controlled by the computer 106. A fixed position pulsed radiation beam 164 having an intensity pattern defined by the mask 150 impinges the metal layer 52 on the sample 40. By controlling the motion of the sample translation stage 180 in the X and Y directions, the computer 106 controls the relative position of the sample 40 with respect to the stationary pulsed radiation beam 164 which irradiates the metal layer 52 on the sample 40. The pulse duration, the pulse repetition rate and the energy of each pulse of the pulsed radiation beam 164 are also controlled by the computer 106.

In the present embodiment the sample 40 (shown in FIG. 1A) is translated with respect to the stationary pulsed radiation beam 164 (shown in FIG. 1A) in order to sequentially irradiate successive portions of the metal layer 52 (shown in FIG. 1A) along predefined paths of irradiation to obtain lateral growth of large grains having controlled grain size and shape, and controlled grain boundary location and orientation in the metal layer 52. The pulses of the pulsed radiation beam 164 are not limited to any particular intensity pattern, so long as each beamlet of the intensity pattern of each radiation beam pulsed has sufficient energy to melt a region of the metal layer 52 overlapped by the beamlet throughout its entire thickness, and each melted region of the metal layer 52 has sufficiently small dimensions to allow lateral growth of grains in the melted region.

For simplicity of illustration the paths of irradiation are shown in FIG. 14 in the frame of reference of the translating sample 40 so that the stationary pulsed radiation beam 164 is depicted as traversing a stationary sample.

Turning back to FIG. 14, in the exemplary embodiment the metal layer 52 on the sample 40 is subdivided for processing purposes into a number of columns extending in the Y direction (e.g., a first column 205, a second column 206, etc.). The positions and dimensions of the columns of the subdivided metal layer 52 are stored in the computer 106 (shown in FIG. 1A) and utilized by the computer to control the processing of the metal layer 52 on the sample 40. Exemplary dimensions of each column may be 2 cm in the X direction by 40 cm in the Y direction so as to subdivide the metal layer 52 on the sample 40 into, for example, 15 columns. It is preferable to have the irradiation of adjacent columns overlap one another by a small area so as to avoid the possibility of having any unirradiated areas of the metal layer 52. The overlapping area may have a width of 50 μm, for example.

Referring again to FIG. 1A, the computer 106 causes the pulsed radiation beam 164 to be emitted and the sample 40 to be positioned so that the pulsed radiation beam 164 impinges on a first location 220 in the frame of reference of the sample 40. The sample 40 is then accelerated in the +Y direction under the control of the computer 106 to reach a predetermined velocity with respect to the stationary pulsed radiation beam 164, which traces a first path 225 not on the sample 40. It is noted again that the path 225 is not the result of movement of the pulsed radiation beam 164, which is stationary, but represents the movement of the sample 40 towards the stationary pulsed radiation beam.

When the upper edge 210 of the sample 40 reaches the position of impingement of the pulsed radiation beam 164, the sample is moving at the predetermined velocity with respect to the stationary pulsed radiation beam 164. Thereafter, the sample 40 is translated in the +Y direction at the predetermined velocity so that the pulsed radiation beam 164 irradiates successive portions of the metal layer 52 on the sample 40 at a predetermined pulsed repetition rate along a second irradiation path 230, which traverses the length of the sample 40 in the −Y direction. When the lower edge 211 of the sample 40 reaches the fixed position of impingement of the pulsed radiation beam 164, translation of the sample 40 is slowed along a third path 235 until coming to a full stop when the fixed position of impingement of the pulsed radiation beam 164 is at a second location 240 with respect to the sample 40. In the present embodiment the predetermined pulse repetition rate is, for example, in the range of 50 Hz to 103 Hz pulses/sec and each pulse provides a beamlet intensity in the range of 10 mJ/cm$^2$ to $10^4$ mJ/cm$^2$ with a pulse duration in the range of 10 nsec to $10^3$ nsec.

Figure 15A:
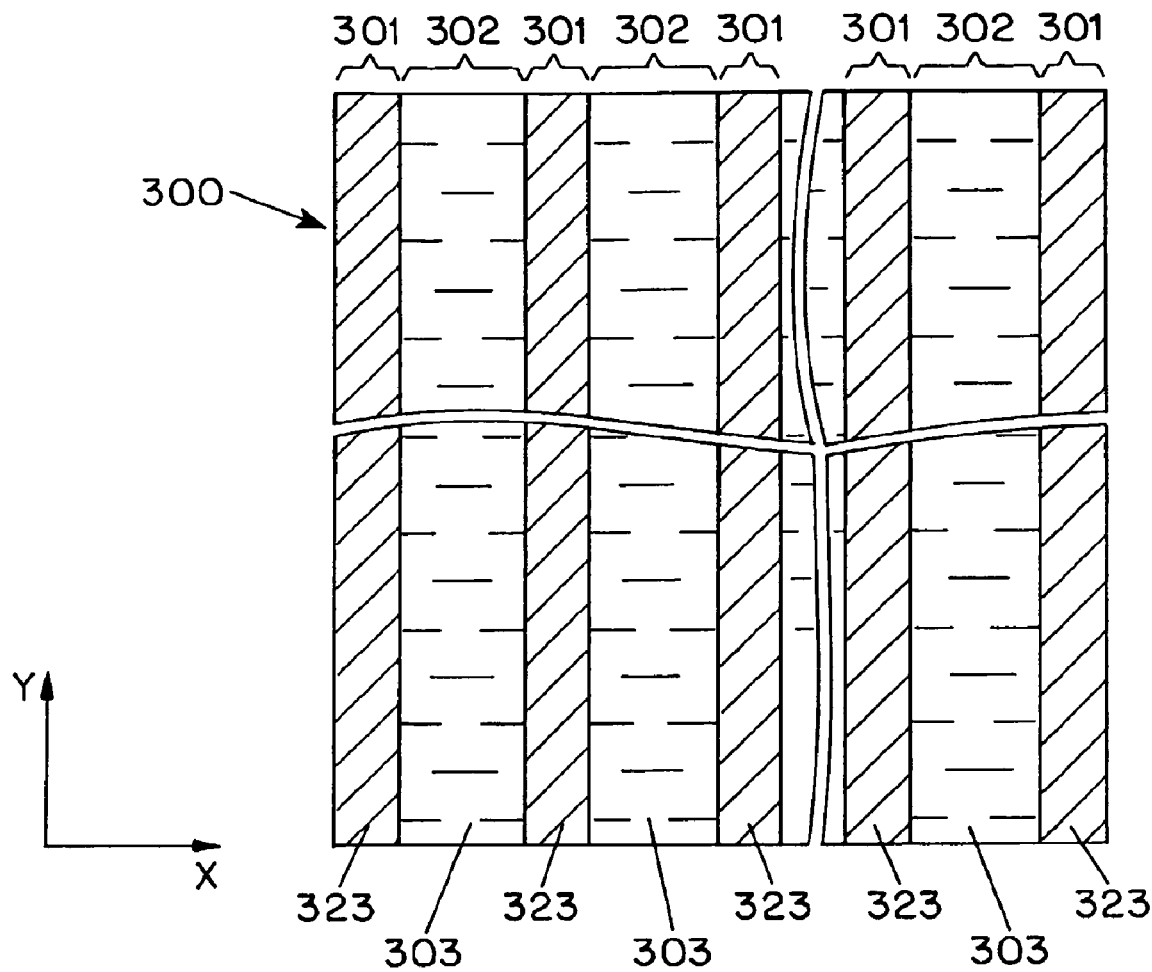
FIGS. 15A-15G illustrate an exemplary radiation beam pulse intensity pattern and the grain structure of a portion of a column of the metal layer depicted in FIG. 14 at different stages LS processing according to the tenth exemplary embodiment of the method of the present invention.

Exemplary grain structures of the metal layer 52 during continuous sequential irradiation thereof by radiation beam pulses having an exemplary intensity pattern while the pulsed radiation beam 164 is traversing the irradiation paths 230 are illustrated in FIGS. 15A-15D. Referring to FIG. 15A, in the present exemplary embodiment the intensity pattern 300 of the pulsed radiation beam 164 has a square shape with regularly spaced-apart, relatively-narrow, linear, stripe-like shadow regions 301 and regularly spaced-apart, relatively wide, linear, stripe-like beamlets 302, each beamlet being positioned in between and adjoining respective adjacent shadow regions. Both the shadow regions 301 and the beamlets 302 extend along the Y direction. The dimensions of the intensity pattern 300 are 0.1 cm by 1.5 cm. The dimensions of each shadow region 301 are 2 μm by 1 cm, and the dimensions of each beamlet 302 are 4 μm by 1 cm. When a portion of the metal layer 52 immediately after the upper edge 210 of the sample 40 is irradiated by a first radiation beam pulse, each region 303 of the irradiated portion of the metal layer 52 overlapped by a respective one of the beamlets 302 of the intensity pattern of the first radiation pulse is melted throughout its entire thickness, while each region 323 of the irradiated portion overlapped by a respective one of the shadow regions 301 of the intensity pattern of the first radiation beam pulse remains at least partially unmelted.

Figure 15B:
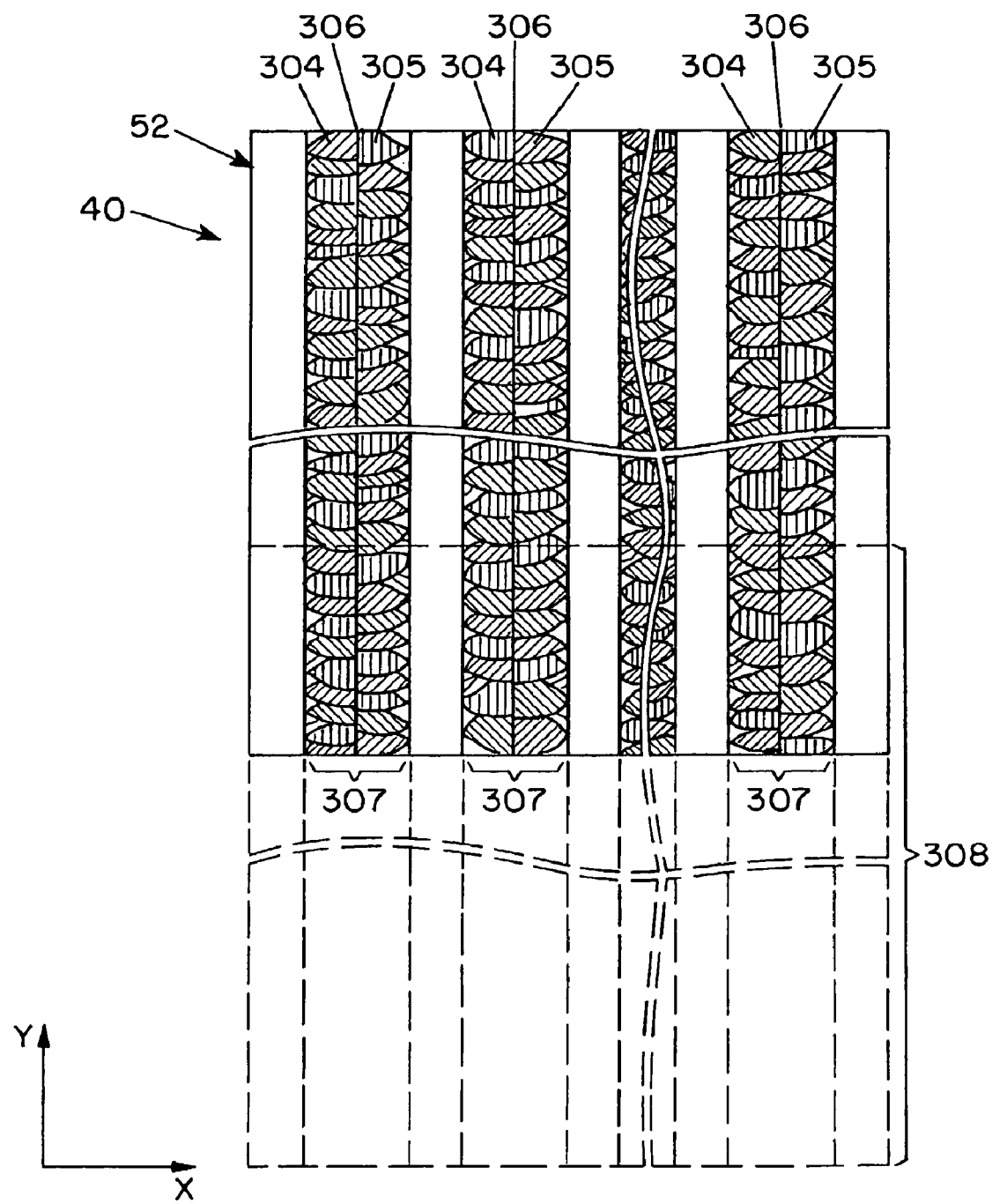

Turning now to FIG. 15B, before irradiation by a second radiation beam pulse, in accordance with the predetermined pulse repetition rate, each region 303 of the metal layer 52 melted by the first radiation beam pulse resolidifies to form two columns of grains 304 and 305 grown towards one another from adjoining at least partially unmelted regions 323 (shown in FIG. 15A) and abutting one another along a respective one of a plurality of grain abutment boundaries 306 after the abutting grains have grown by an abutting grain growth distance of approximately 2 μm. Both columns of grains 304 and 305 in each one of the resolidification regions 307 have a respective central portion in which grain boundaries form large angles (i.e., close to 90°) with respect to the irradiation path 230. As shown in FIG. 15B, while resolidification of the melted regions 303 is taking place, the sample is being translated with respect to the stationary pulsed radiation beam 164 along the irradiation path 230 so that when the metal layer 52 is irradiated by the second radiation beam pulse, its intensity pattern 308, indicated by dashed lines in FIG. 15B, has translated so as to only partially overlap the resolidification regions 307.

Figure 15C:
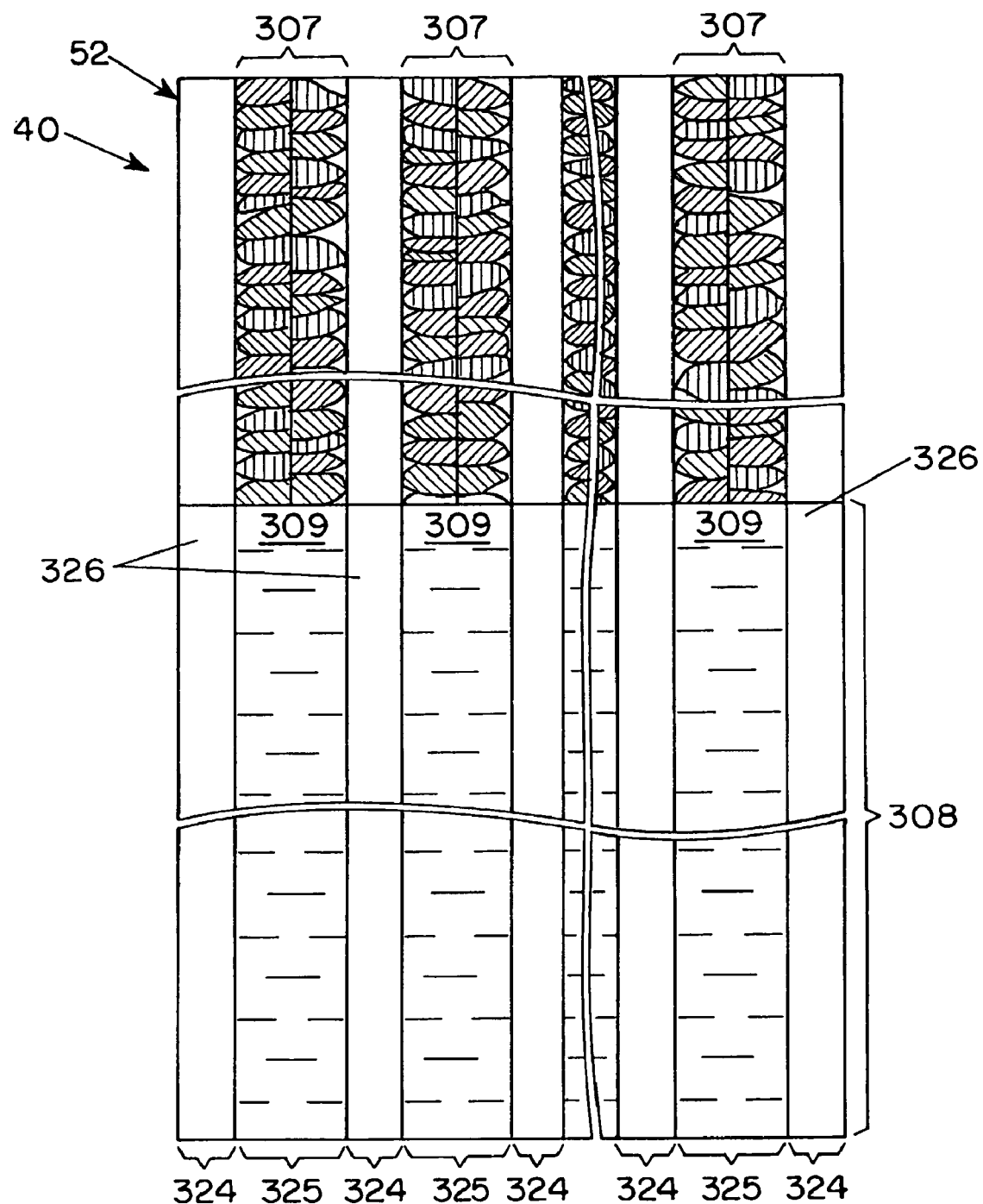
Figure 15D:
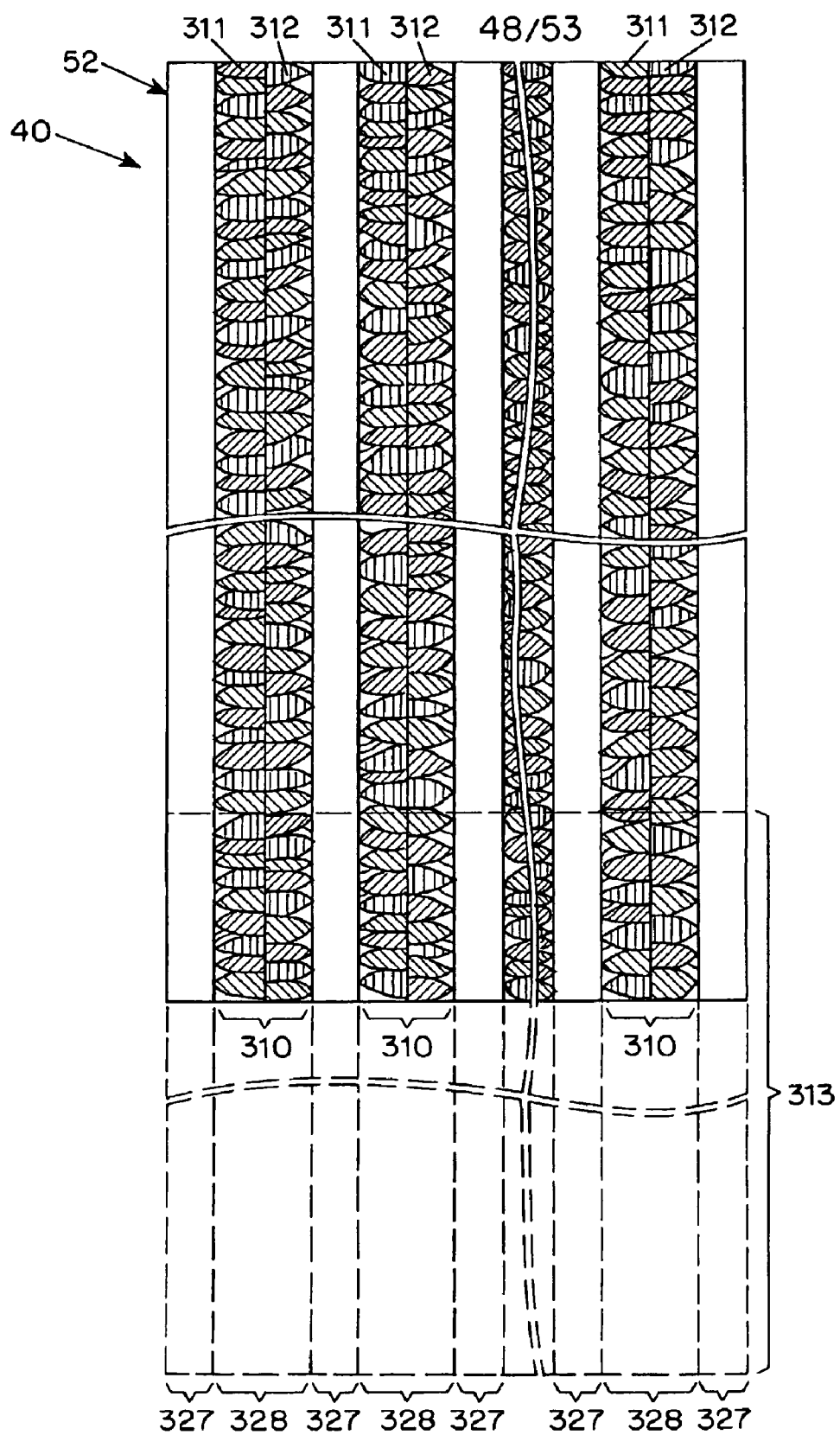

As shown in FIG. 15C, regions 309 of the metal layer 52 overlapped by respective ones of the beamlets 305 of the intensity pattern 308 of the second radiation beam pulse are each melted throughout its entire thickness, while each region 326 of the metal layer 52 overlapped by a respective one of the shadow regions 324 of the intensity pattern 308 of the second radiation beam pulse remains at least partially unmelted. In addition, portions of the resolidification regions 307 that are not overlapped by the beamlets 325 of the intensity pattern 308 of the second radiation beam pulse also remain at least partially unmelted. As illustrated in FIG. 15D, during resolidification of the melted regions 309 between successive radiation beam pulses, the columns of grains 311 and 312 in each resolidification region 310 increase in length and have respective central portions in which the grain boundaries form large angles (i.e., close to 90°) with respect to the irradiation path 230. Because continuous translation of the sample 40 with respect to the stationary pulsed radiation beam 164 takes place between successive radiation beam pulses, during which the melted regions 309 resolidify, when the metal layer 52 is irradiated by a third radiation beam pulse, the intensity pattern 313 thereof (as indicated by dashed lines in FIG. 15D) is translated with respect to the resolidification regions 310 so that the beamlets 328 of the intensity pattern 313 of the third radiation beam pulse only partially overlap the resolidification regions 310. In this manner, continuous translation of the sample along the irradiation path 230 in a first pass of column 205 at the predetermined velocity together with irradiation by successive radiation beam pulses at the predetermined pulse repetition rate results in the formation of resolidification regions extending along the entire length of the second irradiation path 230, each one of the resolidification regions having two abutting columns of grains with respective portions central to the resolidification region in which grain boundaries form large angles with respect to the irradiation path 230.

Turning back to FIG. 14, after the stationary pulsed radiation beam 164 in the frame of reference of the translating sample 40 has come to a stop at location 240, the sample 40 is microtranslated in the X direction under the control of the computer 106 so that the pulsed radiation beam traces a fourth path 245 until the beam impinges location 247. The sample 40 is then accelerated in the −Y direction so that the pulsed radiation beam traverses a fifth path 250 until the sample 40 reaches the predetermined velocity of translation by the time the lower edge 211 of the sample 40 reaches the position of impingement of the beam. Thereafter, the sample 40 is translated at the predetermined velocity in the −Y direction for the entire length of a sixth irradiation path 255, while the pulsed radiation beam sequentially irradiates the metal layer 52 on the sample 40 at the predetermined pulsed repetition rate.

Figure 15E:
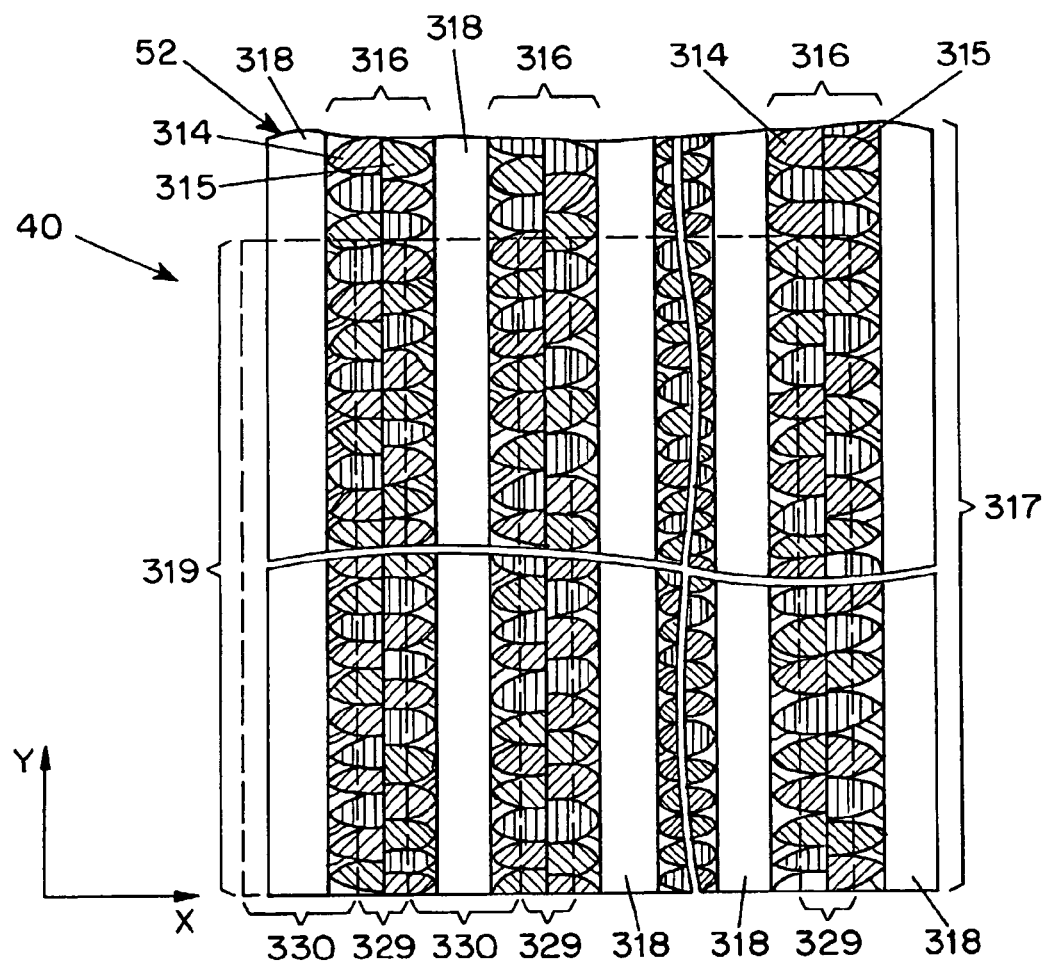
Figure 15F:
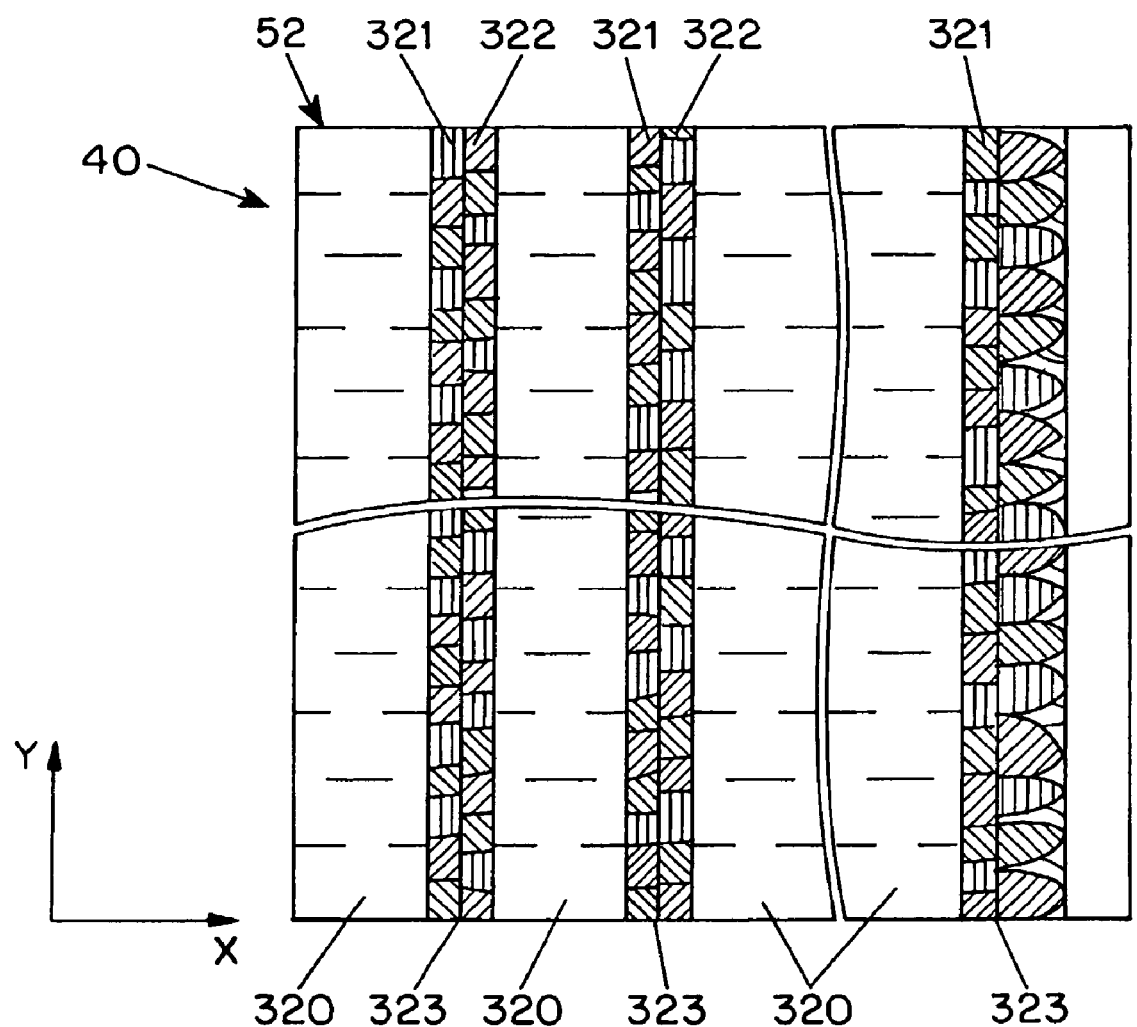

Referring to FIG. 15E, there is shown a portion 317 of the metal layer in column 205 immediately above the lower edge 211 of the sample 40 after microtranslation along path 245 and traversal of path 250. The portion 317 of the metal layer 52 in column 205, which is shown after completion of traversal of the irradiation path 230 in the first pass by the pulsed radiation beam, has a multiplicity of resolidification regions 316 each having two abutting columns of grains 314 and 315, which extend along the entire length of the column 205. Each resolidification region 316 is bounded on its two sides by two unirradiated regions 318, which also extend along the entire length of the column 205. The intensity pattern 319 of the first radiation beam pulse of the second pass to irradiate the metal layer 52 in column 205 after the microtranslation is indicated by dashed lines in FIG. 15E. The shifted intensity pattern 319 has a multiplicity of shadow regions 329 that partially overlap the two columns of grains 314 and 315 in the central portion of respective ones of the resolidification regions 316, and beamlets 330 that overlap respective ones of the unirradiated regions 318 and overlap a portion of the columns of grains 314 and 315 at the edges of respective adjacent resolidification regions 316. When the portion 317 of the metal layer 52 is irradiated by a first radiation beam pulse having the intensity pattern 319, regions 320 of the metal layer overlapped by respective ones of the beamlets 330 are each melted throughout their entire thickness, while regions 323 of the metal layer overlapped by respective ones of the shadow regions 329 remain at least partially unmelted, as shown in FIG. 15F. Each at least partially unmelted region 323 adjoins respective adjacent melted regions 320.

Figure 15G:
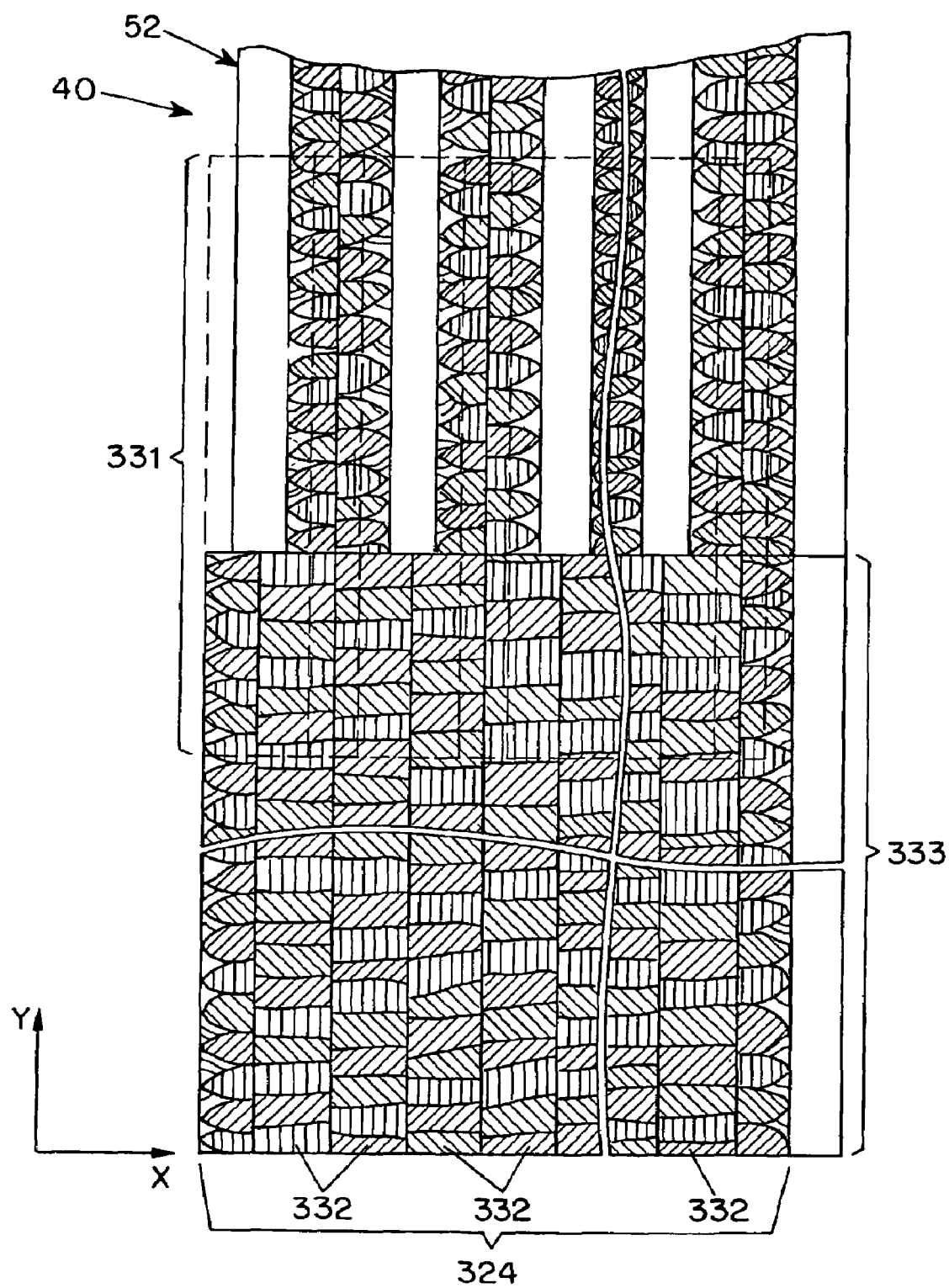

After irradiation by the first radiation beam pulse, the melted regions 320 are permitted to cool and resolidify. During resolidification of the melted regions 320, the at least partially unmelted portions 321 and 322 of the columns of grains 314 and 315 central to each one of the resolidification regions 316 seed lateral growth of grains in respective adjoining melted regions 320. As shown in FIG. 15G, when resolidification of the melted regions 320 is completed, there is formed a resolidification region 333 having contiguous columns 332 of relatively long grains having grain boundaries oriented generally along the X direction.

While resolidification of the melted regions 320 is taking place, continuous translation of the sample 40 with respect to the pulsed radiation beam 164 (shown in FIG. 1A) causes the intensity pattern 331 of the next radiation beam pulse (indicated in FIG. 15G by dashed lines) to be translated with respect to the resolidification region 333 so as to partially overlap the resolidification region 333. In this manner, continuous translation of the sample so that the pulsed radiation beam 164 traverses the irradiation path 255 at the predetermined velocity, together with irradiation of the first column 205 the metal layer 52 with radiation beam pulses at the predetermined pulsed repetition rate in the second pass will result in contiguous columns of relatively long grains 332 having grain boundaries oriented generally in the X direction to be formed along the entire length of the first column 205.

After the pulsed radiation beam 164 has traversed the sixth irradiation path 255 in the manner described above, continuous LS processing of the first column 205 is completed.

Referring again to FIG. 14, when the sample 40 is translated under the control of the computer 106 (shown in FIG. 1A) so that the pulsed radiation beam 164 impinges the upper edge 210 of the sample 40, the velocity of the sample 40 is again slowed with respect to the pulsed radiation beam 164 while the beam traverses a seventh irradiation path 260 so that the sample 40 comes to a complete stop by the time the pulsed radiation beam 164 impinges upon a location 265 in the frame of reference of the sample 40. The sample 40 is then translated to the next column 206 so that the pulsed radiation beam 164 impinges a fifth location 272 after traversing an eighth path 270 in the frame of reference of the sample 40. Thereafter, the sample 40, under the control of the computer 106, is held stationary for a predetermined period of time to allow any vibrations caused by the relatively long translation of the sample 40 from one column to another to settle. In particular, for the sample 40 to be positioned so that the pulsed radiation beam 164 can impinge along irradiation paths in the second column 206, the sample is translated by 2 cm in the X direction for columns having a width of 2 cm in the X direction. The continuous LS procedure described above for the first column 205 is then repeated for the second column 206 and thereafter for each of the remaining columns of the sample 40. In this manner, all the columns of the sample 40 may be continuous LS processed with only minimal total settling time being required.

Delays to allow vibrations of the sample 40 to settle are required only when continuous LS processing has been completed for an entire column (e.g., the first column 205) of the sample 40, and the sample 40 is translated so that the pulsed radiation beam is in position to scan an irradiation path in the next column (e.g., the second column 206) of the sample 40 in a first pass. Using the exemplary dimensions of the sample 40 (e.g., 30 cm×40 cm), there are only fifteen columns to be continuous LS processed in such an exemplary sample. Accordingly, the number of "translate and settle" delays that will be encountered during continuous LS processing of such an exemplary sample is either 14 or 15, depending upon whether a settling delay is required when the sample 40 is positioned for continuous LS processing of the first column.

Figure 16A:
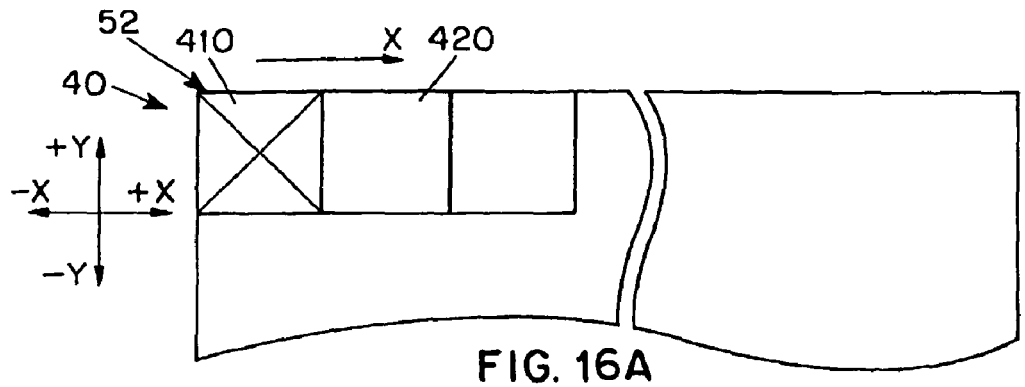
FIGS. 16A-16G are diagrams depicting subdividing a metal layer into sections for processing purposes and carrying out LS processing of the metal layer in accordance with the present invention on a section-by-section basis.

In accordance with the present invention, LS processing of a large metal layer 52 may be carried out by subdividing the metal layer 52, for processing purposes, into contiguous sections, and carrying out LS processing in each of the sections one at a time, as illustrated in FIGS. 16A-16E. As shown in FIG. 16A, the sample 40 is initially positioned for LS processing in a first section 410 of the metal layer 52. It is noted that the first section 410 borders the left edge of the metal layer 52. After LS processing in accordance with the present invention is completed in section 410, as indicated by the crossed lines in the block representing the first section 410, the sample 40 is translated in the −X direction so as to be positioned for LS processing of the next contiguous section 420.

Figure 16B:
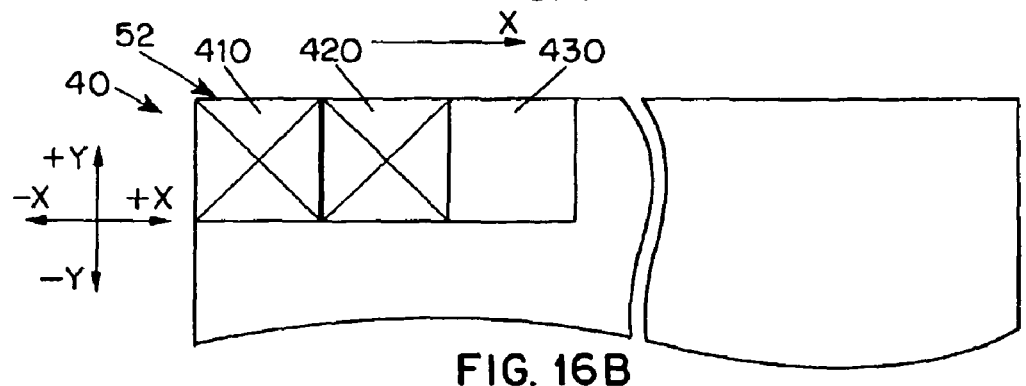
Figure 16C:
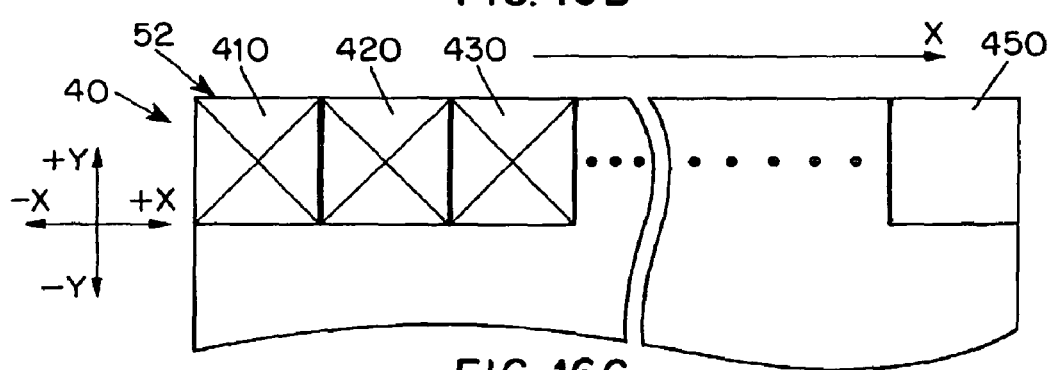

Referring to FIG. 16B, after completion of LS processing of section 420, as indicated by the crossed lines in the block representing that section, the sample is again translated in the −X direction so as to be positioned for LS processing of the next contiguous section 430. Advantageously, in carrying out LS processing in a given section, the radiation beam pulses that irradiate the section overlap the previously processed contiguous section by a small amount (e.g., 50 µm), as indicated by the thick line representing the common border between contiguous LS processed sections. As shown in FIG. 16C, the procedure of completing LS processing in accordance with the present invention in a section of the metal layer 52 and translation of the sample 40 in the −X direction so as to position the sample for LS processing of the next contiguous section is repeated until the sample 40 is positioned for LS processing in accordance with the present invention of a section 450 that borders the right edge of the metal layer 52.

Figure 16D:
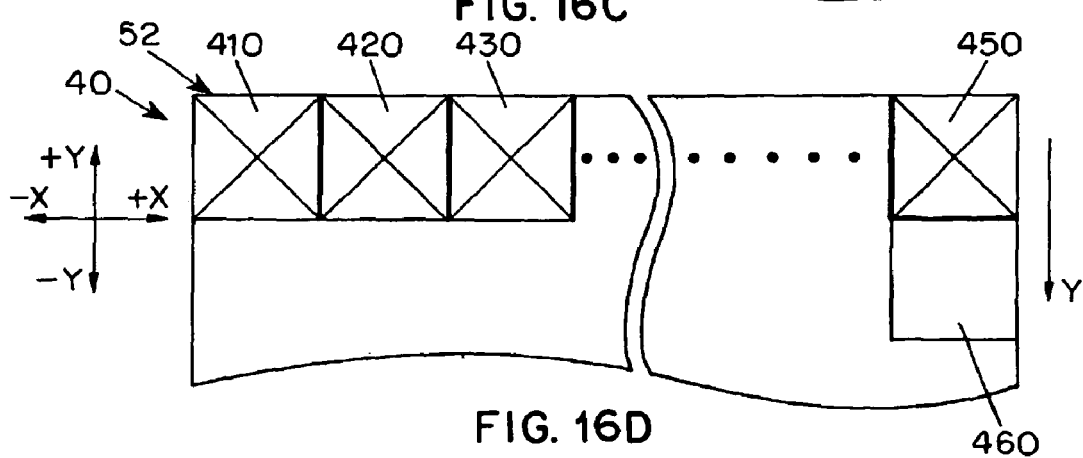
Figure 16E:
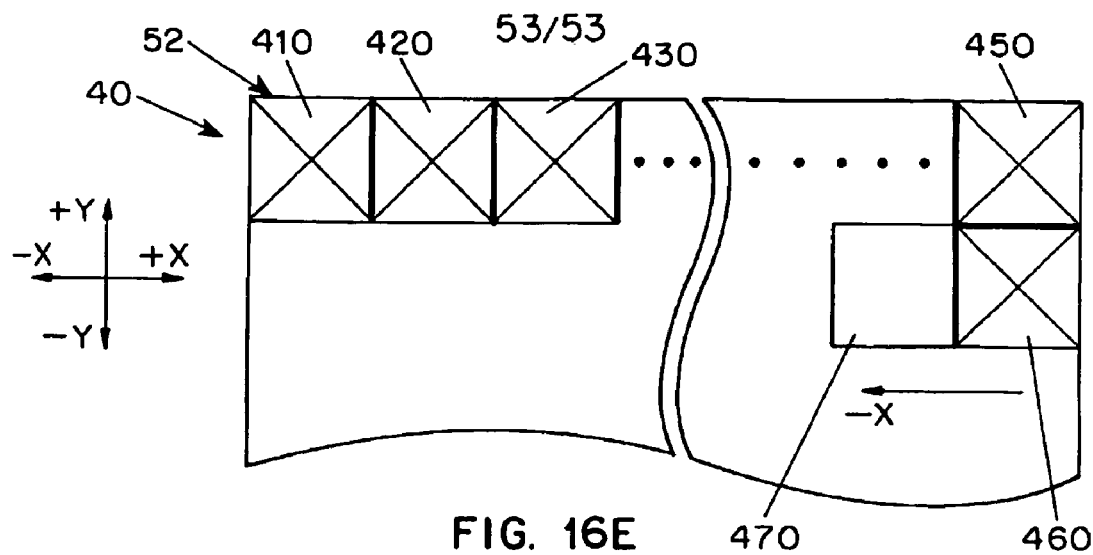
Figure 16F:
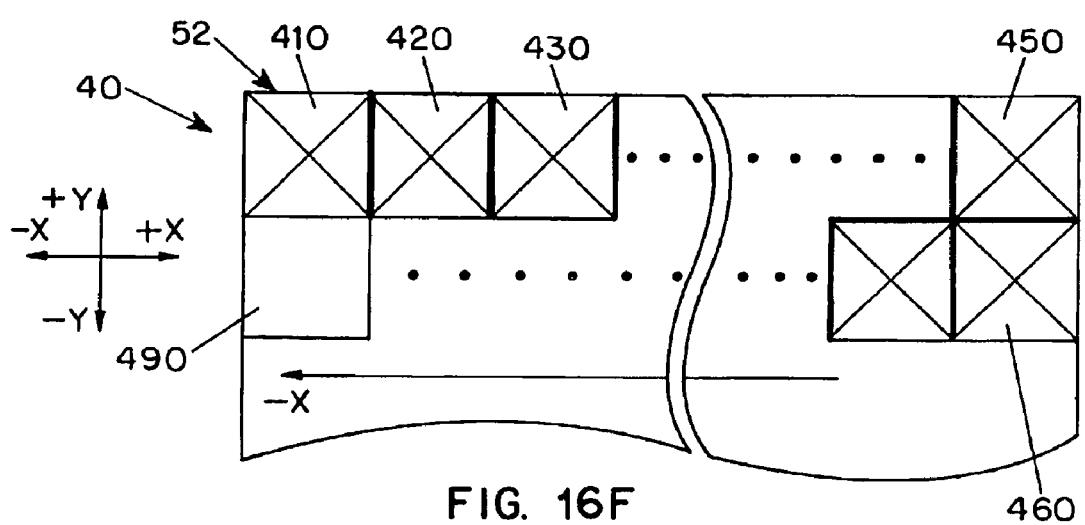
Figure 16G:
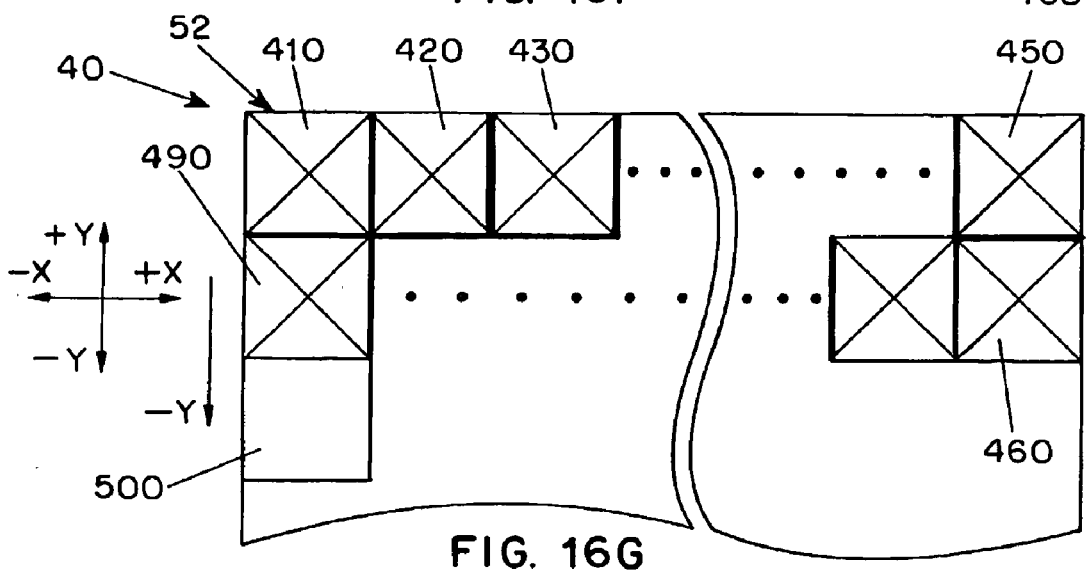

Turning to FIG. 16D, after completion of LS processing in accordance with the present invention in section 450, the sample 40 is translated in the −Y direction until it is positioned for LS processing of the next contiguous section 460. Referring to FIG. 16E, after completion of LS processing in accordance with the present invention in section 460 the sample 40 is translated in the +X direction until it is positioned for LS processing of the next contiguous section 470. Thereafter, the steps of completing LS processing in a section and translating the sample in the +X direction until the sample is in position for LS processing of the next contiguous section are repeated until the sample 40 is positioned for LS processing of section 490, which borders on the left edge of the metal layer 52. As shown in FIG. 16G, after completion of LS processing in accordance with the present invention in section 490, the sample 40 is translated in the +Y direction until it is positioned for LS processing of the next contiguous section 500. Thereafter, the steps of completing LS processing in accordance with the present invention in a section and translating the sample in the −X direction until it is positioned for LS processing of the next contiguous section are repeated until the sample 40 is positioned for LS processing of a section (not shown) that borders a right edge of the metal layer 52. The foregoing illustrative procedure is carried out until all sections of the metal layer 52 are LS-processed in accordance with the present invention, for example in accordance with the third, fourth or fifth exemplary embodiments described above. It is noted that various alternative schemes will be apparent to those skilled in the art for traversing the sections of the metal layer by successive translations from one section to another, such as by traversing the sections by columns instead of by rows.

Alternatively, instead of completing LS processing in accordance with the present invention in one section of the metal layer 52 before translating the sample 40 for LS processing of a next contiguous section, the processing steps may be carried out one step at a time in each section one section at a time. Since LS processing in accordance with the present invention, as exemplified by the third, fourth or fifth illustrative embodiments described above, each require irradiating the metal layer 52 with a first radiation beam pulse having a predetermined intensity pattern, permitting the regions melted by the first radiation beam pulse to resolidify, irradiating the metal layer with a second radiation beam pulse having a shifted intensity pattern, and so forth until the desired grain size, grain shape, and grain boundary location and orientation are obtained, LS processing of a metal layer on a section-by-section basis may be carried out by irradiating each section of the metal layer 52 by the first radiation beam pulse using the illustrative sample translation scheme depicted by FIGS. 16A-16G. When all sections of the metal layer 52 have been irradiated by the first radiation beam pulse, the sample 40 is translated so that it is in position for irradiation on a section-by-section basis by a second radiation beam pulse having an intensity pattern shifted with respect to that of the first radiation beam pulse by a desired distance and in a desired direction after the regions melted by the first radiation beam pulse in each section to be irradiated by the second radiation beam pulse has completely solidified. In this manner, the sections of the metal layer 52 may undergo further irradiations by radiation beam pulses having shifted intensity patterns and resolidification after irradiation by each radiation beam pulse on a section-by-section basis until a desired grain size, grain shape, and grain boundary location and orientation in the metal layer 52 is obtained.

The foregoing exemplary embodiments merely illustrate the principles of the present invention. Various modifications and alterations to the described embodiments will be apparent to those skilled in the art in view of the teachings herein without departing from the scope of the invention, as defined by the appended claims.

The invention claimed is:

1. An apparatus for processing a thin metal layer disposed on a substrate comprising:
   (a) a pulsed radiation beam source configured to provide radiation beam pulses of sufficient strength to melt the thin metal layer throughout its entire thickness;
   (b) a beam mask configured to define, upon incidence of the radiation beam pulses, a respective intensity pattern of each one of the radiation beam pulses for irradiating at least a portion of the metal layer, the intensity pattern having at least one strip comprising of one or more shadow regions, having a width, and at least one strip comprising of one or more beamlets, having a width,
   wherein the beam mask is further configured such that during irradiation by a radiation beam pulse, each region of the at least a portion of the metal layer is overlapped by a respective one of the at least one strip comprising of one or more beamlets, and each region of the at least a portion of the metal layer is overlapped by a respective one of the at least one strip comprising of one or more shadow regions,
   and wherein the width of the at least one strip comprising of one or more shadow regions is less than the width of the at least one strip comprising of one or more beamlets;
   (c) a sample translation stage configured to hold the metal layer on the substrate while the at least a portion of the metal layer is being irradiated by the radiation beam pulses, and configured to translate the metal layer on the substrate in a lateral direction with respect to the radiation beam pulses; and
   wherein the sample translation stage is further configured to microtranslate the substrate having the metal layer in a lateral direction with respect to the radiation beam pulses so as to shift the intensity pattern of the radiation beam pulses with respect to the metal layer from one radiation beam pulse to another.

2. The apparatus of claim 1, wherein the pulsed radiation beam source is a pulsed laser.

3. The apparatus of claim 2, wherein the pulsed radiation beam source is a pulsed excimer laser.

4. The apparatus of claim 2, wherein there is included a first optical path traversed by the radiation beam pulses from the pulsed laser to the beam mask.

5. The apparatus of claim 4, wherein the first optical path includes beam expanding and collimating lenses, a field lens and at least one beam steering mirror.

6. The apparatus of claim 5, wherein the first optical path further includes a beam homogenizer and a condenser lens.

7. The apparatus of claim 6, wherein the first optical path further includes a controllable beam attenuator.

8. The apparatus of claim 2, further comprising a second optical path traversed by the laser beam pulses from the beam mask to the metal layer on the substrate on the sample translation stage.

9. The apparatus of claim 8, wherein the second optical path includes an objective lens and at least one beam steering mirror.

10. The apparatus of claim 8, wherein the second optical path further includes a controllable shutter.

11. The apparatus of claim 10, further comprising a computer for controlling the pulsed laser, the controllable shutter and the sample translation stage.

12. The apparatus of claim 1, wherein the pulsed radiation beam source is a chopped continuous wave laser.

13. The apparatus of claim 1, wherein the pulsed radiation beam source is a pulsed electron beam source.

14. The apparatus of claim 1, wherein the pulsed radiation beam source is a pulsed ion beam source.

15. The apparatus of claim 1, wherein the beam mask is a projection mask.

16. The apparatus of claim 1, wherein the beam mask is a proximity mask.

17. The apparatus of claim 1, wherein the beam mask is a contact mask.

18. The apparatus of claim 1, further comprising a mask translation stage for holding the beam mask and for translating the beam mask in a lateral direction with respect to the radiation beam pulses so as to shift the intensity pattern of the radiation beam pulses with respect to the metal layer from one radiation beam pulse to another.

19. The apparatus of claim 18, further comprising a computer for controlling the pulse radiation beam source and the mask translation stage.

20. The apparatus of claim 1, wherein each of the at least one strip comprising of one or more shadow regions is a linear, stripe-like shadow region and each of the atleast one strip comprising of one or more beamlets is a linear, stripe-like beamlet.

21. The apparatus of claim 20, wherein the beam mask is further configured such that the intensity pattern has at least two linear, stripe-like shadow regions and at least two linear, stripe-like beamlets, and
   wherein at least one of the linear, stripe-like shadow regions is oriented at an angle with respect to another and at least one of the linear, stripe-like beamlets is oriented at an angle with respect to another.

22. The apparatus of claim 21, wherein the angle of orientation between the at least two linear, stripe-like shadow regions and between the at least two linear, stripe-like beamlets is a right angle.

23. The apparatus of claim 1, wherein each of the at least one strip comprising of one or more shadow regions is a strip comprising of dot-like shadow regions and each of the at least one strip comprising of one or more beamlets is a linear, stripe-like beamlet which surrounds and abuts the strip comprising of dot-like shadow regions.

24. The apparatus of claim 23, wherein the beam mask is further configured such that the intensity pattern has at least two strips of dot-like shadow regions and at least two linear, stripe-like beamlets, each surrounding and abutting a respective strip comprising of dot-like shadow regions, and
   wherein at least one of the strips of dot-like shadow regions is oriented at an angle with respect to another and at least one of the linear, stripe-like beamlets is oriented at an angle with respect to another.

25. The apparatus of claim 24, wherein the angle of orientation between the at least two strips of dot-like shadow regions and between the at least two linear, stripe-like beamlets is a right angle.

26. An apparatus for processing a thin metal layer disposed on a substrate comprising:
   (a) a pulsed radiation beam source configured to provide radiation beam pulses of sufficient strength to melt the thin metal layer throughout its entire thickness;
   (b) a beam mask configured to define, upon incidence of the radiation beam pulses, a respective intensity pattern of each one of the radiation beam pulses for irradiating at least a portion of the metal layer, the intensity pattern having at least two adjacent sawtooth shaped beamlets, each having at least one upward pointing apex and at least one downward pointing apex, and at least one shadow region between and adjoining the at least two adjacent sawtooth shaped beamlets,
   wherein the beam mask is further configured such that during irradiation by a radiation beam pulse, each region of the at least a portion of the metal layer is overlapped by a respective one of the at least two sawtooth shaped beamlets, and each region of the at least a portion of the metal layer is overlapped by a respective one of the at least one shadow region,
   and wherein the at least two adjacent sawtooth shaped beamlets are staggered with respect each other such that the at least one upward pointing apex of each of the at least two adjacent sawtooth shaped beamlets is out of alignment with respect to the at least one upward pointing apex of another of the at least two adjacent sawtooth shaped beamlets;
   (c) a sample translation stage configured to hold the metal layer on the substrate while the at least a portion of the metal layer is being irradiated by the radiation beam pulses, and configured to translate the metal layer on the substrate in a lateral direction with respect to the radiation beam pulses; and
   wherein the sample translation stage is further configured to microtranslate the substrate having the metal layer in a lateral direction with respect to the radiation beam pulses so as to shift the intensity pattern of the radiation beam pulses with respect to the metal layer from one radiation beam pulse to another.

27. The apparatus of claim 26, wherein the at least two adjacent sawtooth shaped beamlets are staggered with respect each other such that the at least one upward pointing apex of each of the at least two adjacent sawtooth shaped beamlets is aligned with the at least one downward pointing apex of another of the at least two adjacent sawtooth shaped beamlets.

* * * * *